(12) United States Patent
Koyama

(10) Patent No.: US 7,154,133 B1
(45) Date of Patent: Dec. 26, 2006

(54) SEMICONDUCTOR DEVICE AND METHOD OF MANUFACTURE

(75) Inventor: Akio Koyama, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/914,474

(22) PCT Filed: Apr. 22, 1999

(86) PCT No.: PCT/JP99/02140

§ 371 (c)(1),
(2), (4) Date: Aug. 29, 2001

(87) PCT Pub. No.: WO00/65650

PCT Pub. Date: Nov. 2, 2000

(51) Int. Cl.
*H01L 27/10* (2006.01)
*H01L 21/00* (2006.01)

(52) U.S. Cl. ............... 257/207; 438/129; 257/E29.263; 257/E21.598

(58) Field of Classification Search ............ 305/52–56; 257/207; 438/129
See application file for complete search history.

(56) References Cited

U.S. PATENT DOCUMENTS 5,576,637 A * 11/1996 Akaogi et al.

FOREIGN PATENT DOCUMENTS

| JP | 6-21443 | 1/1994 |
| JP | 6-334010 | 12/1994 |
| JP | 8-186180 | 7/1996 |

\* cited by examiner

*Primary Examiner*—Evan Pert
(74) *Attorney, Agent, or Firm*—Miles & Stockbridge, P.C

(57) ABSTRACT

The semiconductor regions for source and drain of unused p-channel type MISFETQp and the power supply wiring 2VDD are electrically connected and the semiconductor regions for source and drain of n-channel type MISFETQn and the power supply wiring 2VSS are electrically connected. Moreover, the switch elements 3SW1, 3SW2 are formed of the p-channel type MISFETQp and n-channel type MISFETQn in the basic cells and these switch elements 3SW1, 3SW2 are discretely arranged in the n-well NWL and p-well PWL. Thereby, noise generated in the wells can be reduced in the semiconductor device where the switch elements are provided between the power supply wiring and wells and the threshold voltage of transistor formed in the well can be controlled through the ON/OFF controls of such switch elements.

41 Claims, 38 Drawing Sheets

FIG. 2
(a)
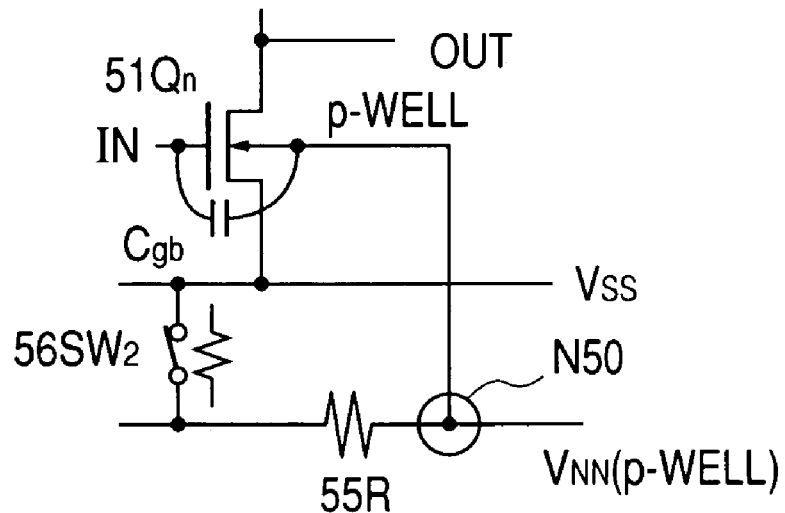
(b)
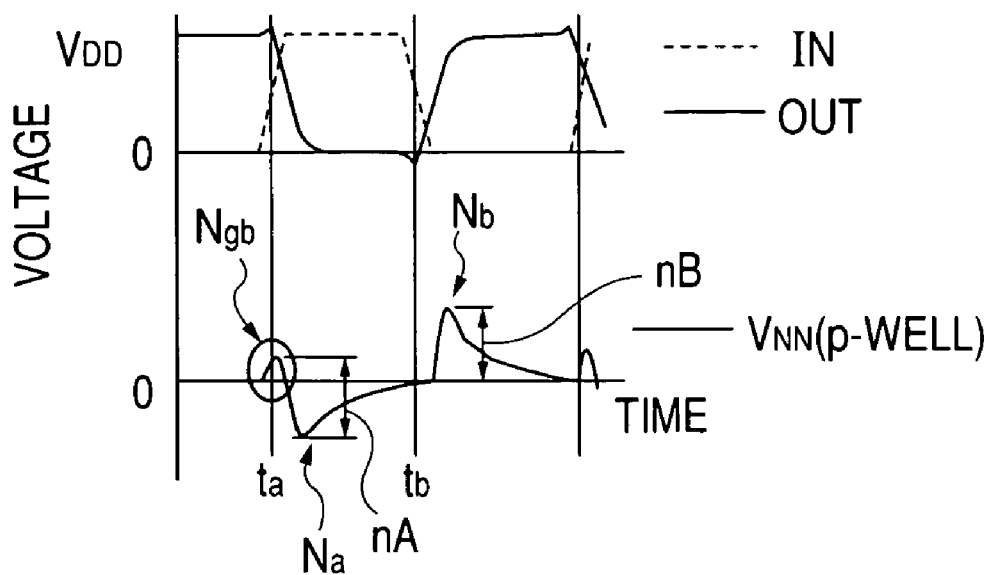

FIG. 3
(a)
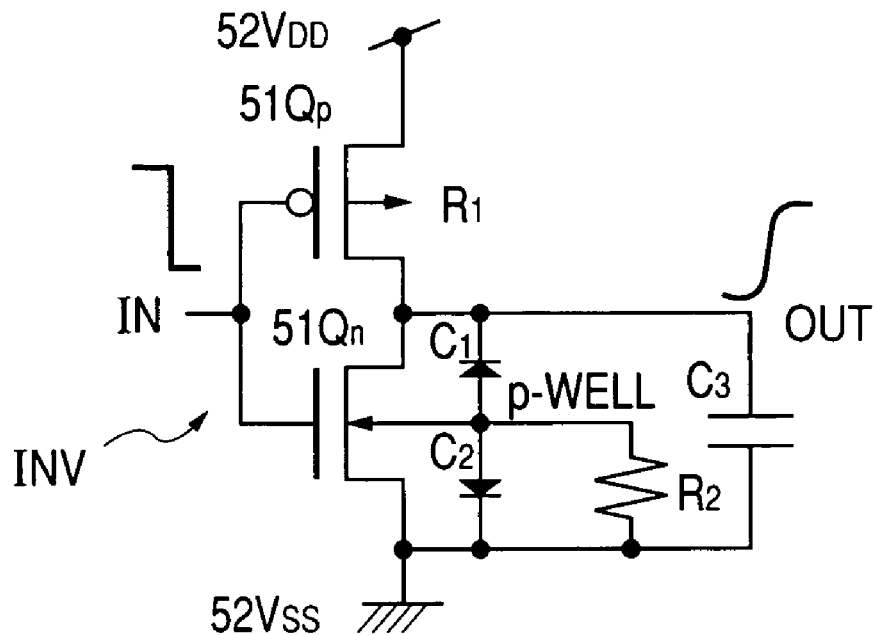
(b)
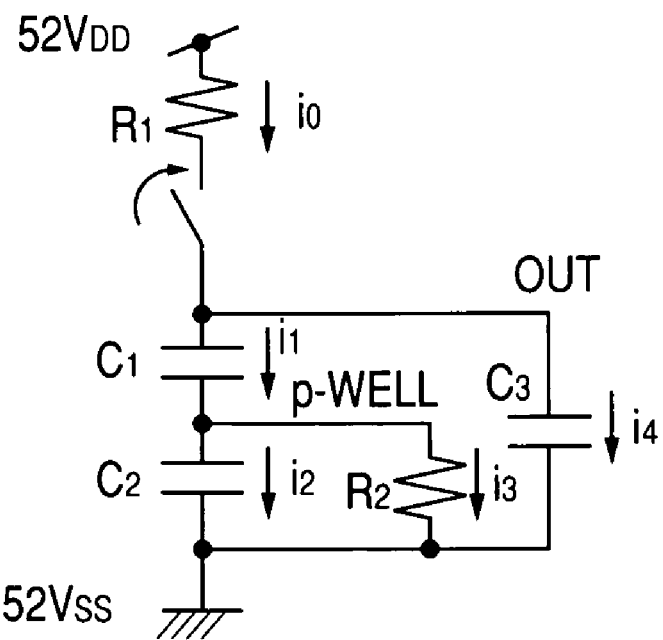

FIG. 13
(a)
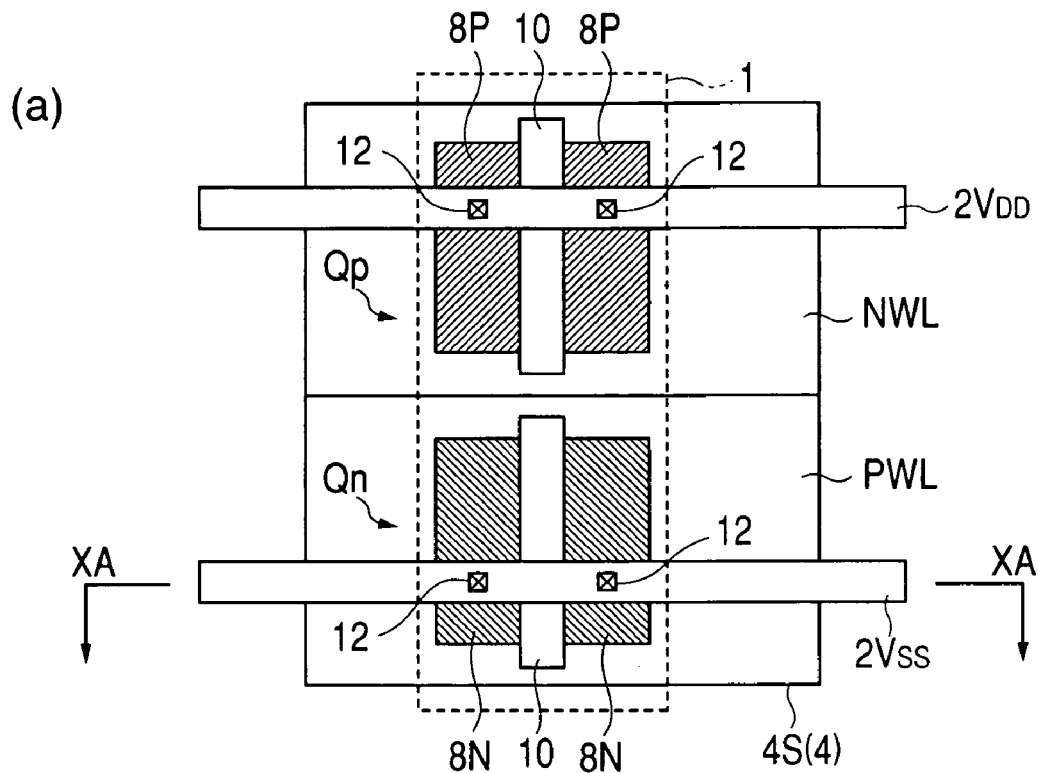
(b)
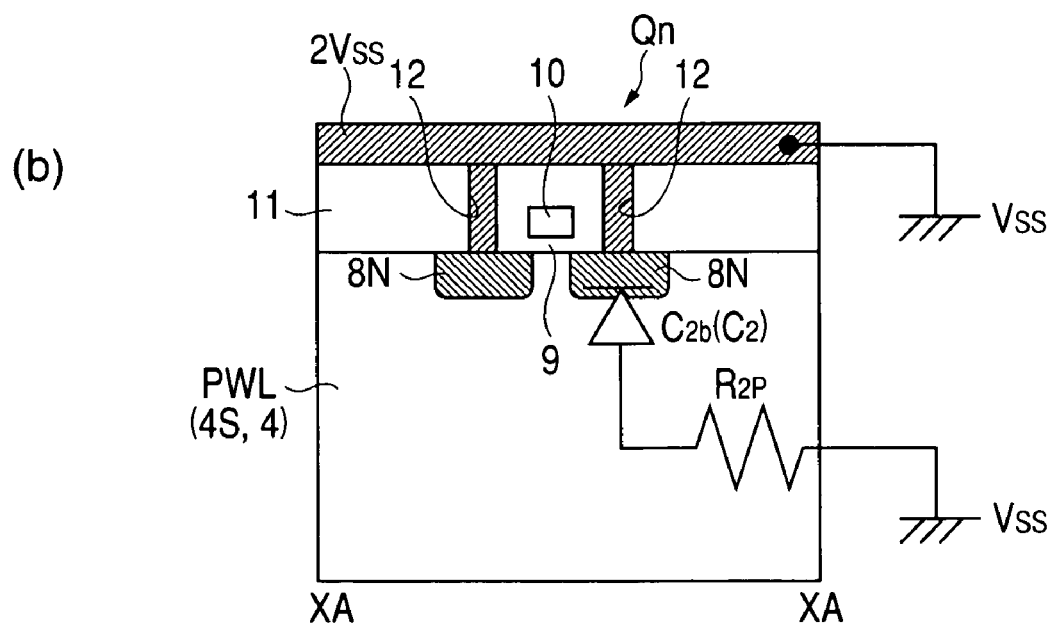

FIG. 14
(a)
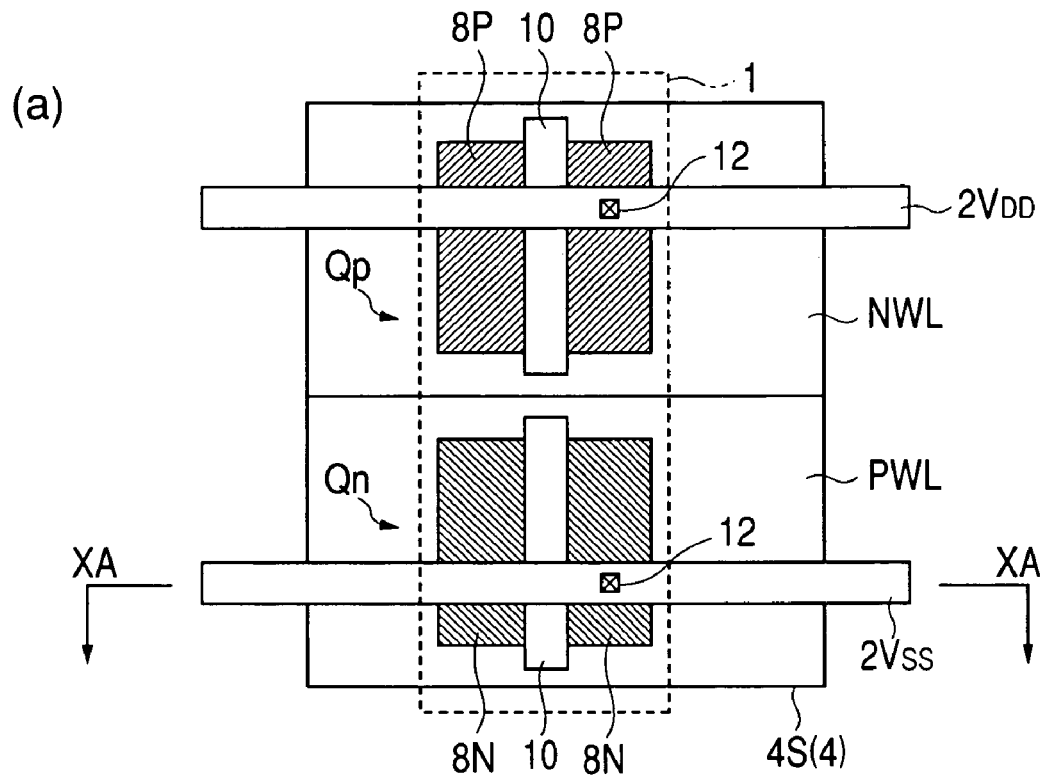
(b)
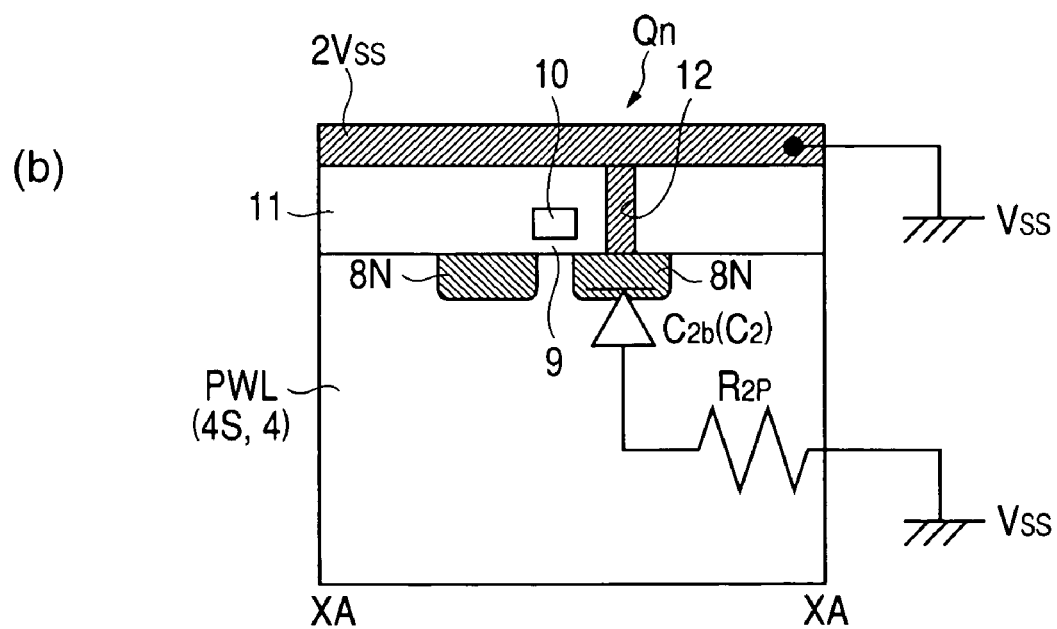

FIG. 23
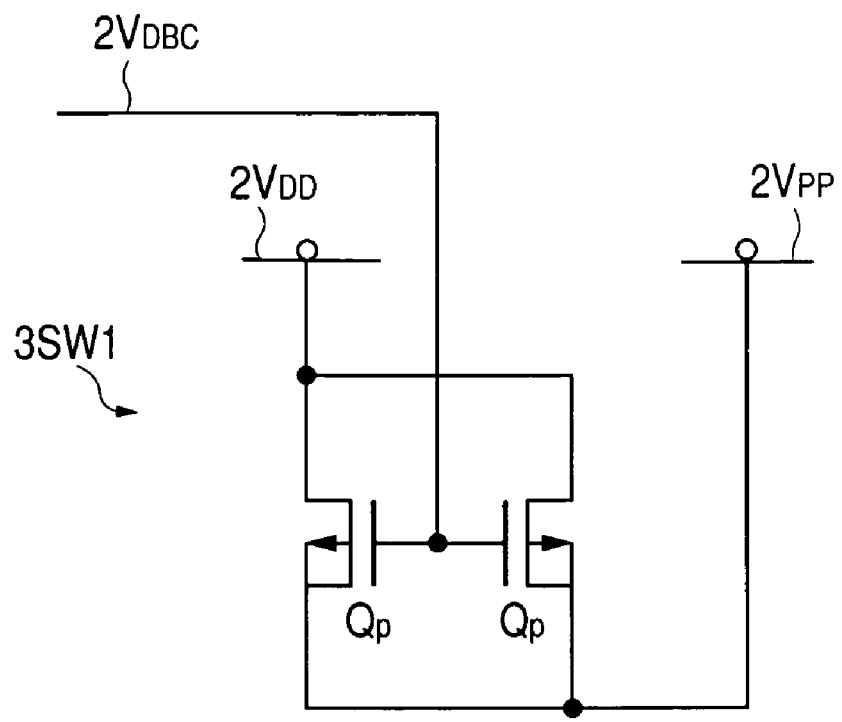
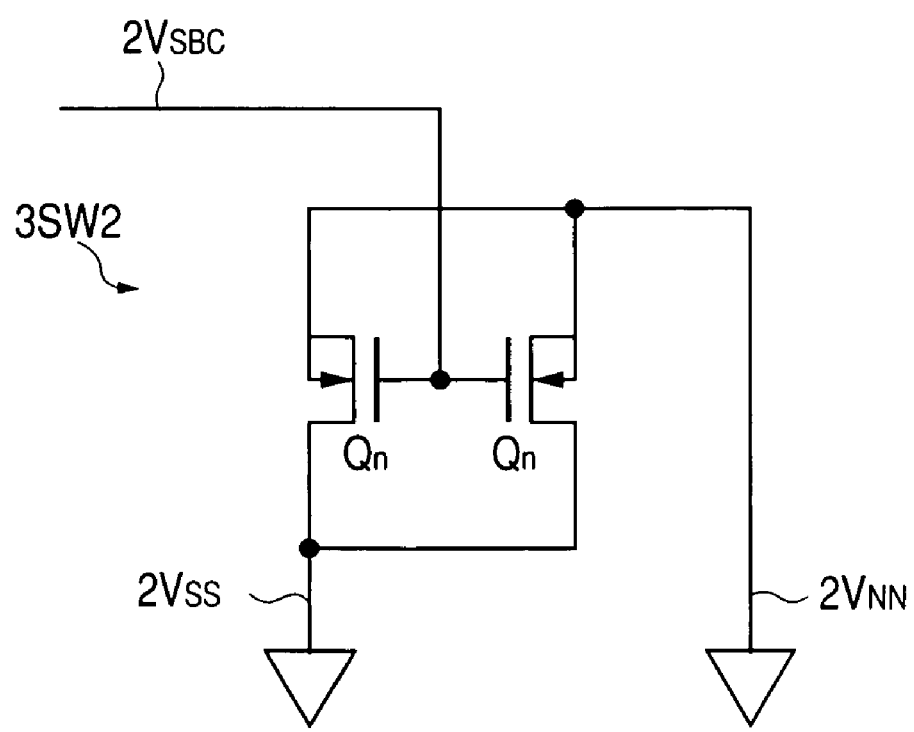

SEMICONDUCTOR DEVICE AND METHOD OF MANUFACTURE

TECHNICAL FIELD

The present invention relates to a semiconductor device and a method of manufacturing the same and particularly to a semiconductor device having the function to control the threshold voltage of a transistor formed in a well through the ON/OFF control of a switch element provided between the power supply wiring and the well and a technique which may be effectively adapted to the design of the same semiconductor device.

BACKGROUND ART

With the requirements for scale-down of a semiconductor element, low power consumption of a semiconductor device and improvement in the operation speed of a semiconductor device, the threshold voltage of a transistor in a semiconductor device has been lowered. However, because of a low threshold voltage, there arises a problem that it is difficult to determine if a true fault is generated on the occasion of inspecting whether a leak current is generated between the source and drain of a transistor of the semiconductor device. Moreover, a problem generated when a semiconductor device is in the condition for waiting operation is that the power consumption increases with a leak current of transistor. In order to overcome such problem, a technology has been proposed in which the threshold voltage of transistor is temporarily raised to reduce a leak current by applying a predetermined voltage to the semiconductor substrate where transistors are arranged (in more practical terms, semiconductor region called a well). Thereby, for example, during the testing period, when the transistor is turned ON even if the threshold value is raised, such transistor can be determined as a defective one. Moreover, when the semiconductor device is in the condition for waiting operation, a leak current can be reduced and power consumption of the semiconductor device can also be lowered through increase of the threshold voltage of transistor. The technique for varying this threshold voltage is described, for example, in the NIKKEI MICRODEVICE (August, 1996), pp. 50–66 (issued on Aug. 1, 1996), NIKKEI BP, Inc. Namely, a circuit structure and an element layout structure are disclosed for the technique to change the threshold voltage through the feedback control of substrate voltage and to realize low power consumption and high-speed operation.

Here, the inventors of the present invention have found, as a result of discussion, that there still exists following problem in the technique that the threshold voltage can be varied using a switch element for using the power supply voltage or the other voltage as the substrate (or well) voltage.

Namely, in this technique, a switch element for changing over the power supply voltage or the other voltage to be used as the substrate (well) is required, but sufficient consideration is necessary for allocation of such switch element and if an excessive amount of switch elements are used, the allocation area of the logic circuits becomes small. Therefore, a chip size increases. Meanwhile, if the number of such switch elements is too small, noise is generated in the well resulting from increase of resistance in the well. Therefore, the threshold voltage varies and operation of semiconductor device becomes unstable. Moreover, such noise results in the problem that latch-up is easily induced in the semiconductor device having the CMIS circuit.

It is therefore an object of the present invention to provide a technique to reduce the noise generated at the semiconductor region in a semiconductor device having the function to control the threshold voltage of a transistor through ON/OFF control of a switch element provided between the semiconductor region where transistors are formed and the power supply wiring.

Moreover, it is also an object of the present invention to provide a technique to reduce the noise generated at the semiconductor region without increase in size of the semiconductor device having the function to control the threshold voltage of a transistor through ON/OFF control of a switch element provided between the semiconductor region where transistors are formed and the power supply wiring.

In addition, it is also an object of the present invention to provide a technique to reduce noise generated at the semiconductor region without complication of a structure of the semiconductor device having the function to control the threshold voltage of a transistor through ON/OFF control of a switch element provided between the semiconductor region where transistors are formed and the power supply wiring.

The aforementioned and other objects and novel features of the present invention will become apparent from the description of this specification and the accompanying drawings.

DISCLOSURE OF THE INVENTION

Exemplary aspects of the present invention disclosed in this specification may be summarized as follows.

1. The present invention comprises a semiconductor region formed on a semiconductor substrate, a plurality of field effect transistors formed in the semiconductor region, a power supply wiring for supplying the power supply voltage to a plurality of the field effect transistors and a switch element provided between the semiconductor region and power supply wiring, whereby a plurality of switch elements are dispersed for allocation within the semiconductor region.

2. The present invention comprises a semiconductor region formed on a semiconductor substrate, a plurality of field effect transistors formed on the semiconductor region, a power supply wiring for supplying the power supply voltage to a plurality of field effect transistors and a switch element provided between the semiconductor region and the power supply wiring, whereby a semiconductor region of the opposite conductivity type is provided to the semiconductor region and such semiconductor region and the power supply wiring are electrically connected.

3. The present invention comprises a semiconductor region formed on a semiconductor substrate, a plurality of field effect transistor formed on the semiconductor region, a power supply wiring for supplying the power supply voltage to a plurality of field effect transistors and a switch element provided between the semiconductor region and the power supply wiring, whereby at least one of a pair of the semiconductor regions for source and drain of unused field effect transistor among a plurality of field effect transistors.

4. The present invention comprises a semiconductor region formed on a semiconductor substrate, a power supply wiring for supplying the power supply voltage to a plurality of field effect transistors and a switch element provided between the semiconductor region and the power supply wiring, whereby a plurality of switch elements are dispersed for allocation within the semiconductor region, a semiconductor region of the opposing conductivity type is provided to the semiconductor region and such semiconductor region is electrically connected to the power supply wiring.

5. The present invention comprises a semiconductor region formed on a semiconductor substrate, a plurality of field effect transistors formed in the semiconductor region, a power supply wiring for supplying the power supply voltage to a plurality of field effect transistors and a switch element provided between the semiconductor region and the power supply wiring, whereby a plurality of switch elements are dispersed for allocation within the semiconductor region and at least one of a pair of semiconductor regions for source and drain of unused field effect transistor among a plurality of field effect transistors is connected electrically with the power supply wiring.

6. The present invention comprises a semiconductor region formed on a semiconductor substrate, a plurality of basic cells regularly arranged on the semiconductor substrate, field effect transistors respectively arranged in each cell of a plurality of basic cells and formed in the semiconductor region, a power supply wiring for supplying the power supply voltage to the field effect transistors and a switch element provided between the semiconductor region and power supply wiring, whereby a plurality of switch element are formed respectively of the field effect transistors in the basic cell and are dispersed for allocation within the semiconductor region.

7. The present invention comprises a semiconductor region formed on a semiconductor substrate, a plurality of basic cells regularly arranged on the semiconductor substrate, field effect transistors respectively arranged in each cell of a plurality of basic cells and formed in the semiconductor region, a power supply wiring for supplying the power supply voltage to a plurality of field effect transistors and a switch element provided between the semiconductor region and power supply wiring, whereby the switch element is formed of the field effect transistor in the basic cell and semiconductor regions, formed in the semiconductor regions in a plurality of basic cells to have the conductivity type opposing to that of the semiconductor regions, are electrically connected with the power supply wiring.

8. The present invention comprises a semiconductor region formed on a semiconductor substrate, a plurality of basic cells regularly arranged on the semiconductor substrate, field effect transistors arranged respectively in each cell of a plurality of basic cells and are formed in the semiconductor region, a power supply wiring for supplying the power supply voltage to the field effect transistors and a switch element provided between the semiconductor region and power supply wiring, whereby the switch element is formed of the field effect transistor of the basic cell and at least one of a pair of semiconductor regions for source and drain of unused field effect transistor among the field effect transistors is connected electrically with the power supply wiring.

9. The present invention comprises a semiconductor region formed on a semiconductor substrate, a plurality of basic cells regularly arranged on the semiconductor substrate, field effect transistors arranged in each cell of a plurality of basic cells and formed in the semiconductor region, a power supply wiring for supplying the power supply voltage to the field effect transistors and a switch element provided between the semiconductor region and power supply wiring, whereby a plurality of switch elements are formed of the field effect transistors of the basic cell and are dispersed in the semiconductor region for the allocation and the semiconductor region of the conductivity type opposed to that of the semiconductor region formed in the semiconductor region in a plurality of basic cells is connected to the power supply wiring.

10. The present invention comprises a semiconductor region formed on a semiconductor substrate, a plurality of basic cells regularly arranged in the semiconductor substrate, field effect transistors arranged in each cell of a plurality of basic cells and are formed in the semiconductor region, a power supply wiring for supplying the power supply voltage to the field effect transistors and a switch element provided between the semiconductor region and power supply wiring; whereby a plurality of switch elements are formed of field effect transistors of the basic cells and are dispersed in the semiconductor region for the allocation, and at least one of a pair of semiconductor regions for source and drain of unused field effect transistors among the field effect transistors is electrically connected with the power supply wiring.

11. The present invention comprises a semiconductor region formed on a semiconductor substrate, a plurality of basic cells regularly arranged on the semiconductor substrate, field effect transistors arranged in each cell of a plurality of basic cells and formed in the semiconductor region, a circuit formed of a plurality of basic cells, a power supply wiring for supplying the power supply voltage to the field effect transistors and a switch element provided between the semiconductor region and power supply wiring, whereby the switch element is built in the predetermined circuit among the circuits.

12. The present invention comprises a semiconductor region formed in the peripheral circuit region on a semiconductor substrate, a plurality of cells for input/output circuits regularly arranged in the peripheral region of the semiconductor substrate, a plurality of field effect transistors for input/output circuits arranged in each cell of a plurality of cells for input/output circuits and formed in the semiconductor region, a power supply wiring for supplying the power supply voltage to a plurality of field effect transistors for input/output circuits and a switch element provided between the semiconductor region in the peripheral circuit region and the power supply wiring, whereby the peripheral circuit region includes an external region and an internal region, the field effect transistors for input/output circuits having a relatively higher threshold voltage are arranged in the external region and the field effect transistors for input/output circuits having relatively lower threshold voltage are arranged in the internal region, and the switch element is formed of the field effect transistors not used as the input/output circuits among the field effect transistors for the input/output circuits in the internal region.

13. The present invention comprises a semiconductor region formed in the peripheral circuit region of a semiconductor substrate, a plurality of cells for input/output circuits regularly arranged in the peripheral circuit of the semiconductor substrate, a plurality of field effect transistors for input/output circuits arranged in each cell of a plurality of cells for input/output circuits and formed in the semiconductor region, a power supply wiring for supplying the power supply voltage to a plurality of field effect transistors for input/output circuits and a switch element provided between the semiconductor region in the peripheral circuit region and the power supply wiring, whereby the peripheral circuit region includes an external region and an internal region, the field effect transistors for input/output circuits having relatively higher threshold voltage are arranged in the external region and the field effect transistors for input/output circuits having relatively lower threshold voltage are arranged in the internal region, the switch element is formed of unused field effect transistors among the field effect transistors for input/output circuits in the internal region and at least one of a pair of semiconductor regions for source and drain of the field effect transistor not used as the input/output circuits is electrically connected to the power supply wiring to form a capacitance element.

14. The present invention comprises (a) a process to regularly arrange a plurality of basic cells on a semiconductor substrate, (b) a process to form a switch element for electrically connecting and disconnecting between the semiconductor region formed on the semiconductor substrate and the power supply wiring of the semiconductor device with the field effect transistors of the predetermined basic cells among a plurality of basic cells and (c) a process to form a plurality of circuits with the predetermined basic cells among a plurality of basic cells.

15. The present invention comprises (a) a process to regularly arrange a plurality of basic cells on a semiconductor substrate, (b) a process to form a switch element for electrically connecting and disconnecting between the semiconductor region formed on the semiconductor substrate and the power supply wiring of the semiconductor device with the field effect transistors of the predetermined basic cells among a plurality of basic cells, (c) a process to form a plurality of circuits with the predetermined basic cells among a plurality of basic cells and (d) a process to arrange contact hole for electrically connecting at least one of a pair of semiconductor regions for source and drain of the unused field effect transistors among a plurality of basic cells to the power supply wiring.

16. The present invention comprises (a) a process to regularly arrange a plurality of basic cells on a semiconductor substrate, (b) a process to form a switch element to electrically connect or disconnect the semiconductor region formed on the semiconductor substrate to or from the power supply wiring of the semiconductor device with the field effect transistors of the predetermined basic cells among a plurality of basic cells and (c) a process to form a plurality of circuits with the predetermined basic cells among a plurality of cells, whereby the switch element is built, in the process (c), in the predetermined circuit among a plurality of circuits.

17. The present invention comprises (a) a process to regularly arrange a plurality of basic cells on a semiconductor substrate and (b) a process to form a plurality of circuits with the predetermined basic cells among a plurality of basic cells, whereby the switch element is built in the predetermined circuit among a plurality of circuits.

BRIEF DESCRIPTION OF THE DRAWINGS

FIG. 2(a) is a circuit diagram of a part of the technique illustrated in FIG. 1 and FIG. 2(b) is a waveform diagram illustrating the voltage waveforms at the connecting portions of FIG. 2(a).

FIG. 3(a) is a circuit diagram of a part of the technique illustrated in FIG. 1 and FIG. 3(b) is an equivalent circuit of FIG. 3(a).

FIG. 13(a) and FIG. 13(b) are explanatory diagrams schematically illustrating a means for stabilizing well potential which is one of the technical concepts of the present invention.

FIG. 14(a) and FIG. 14(b) are explanatory diagrams schematically illustrating a modification example of FIG. 13.

FIG. 23 is a circuit diagram of the switch element of FIG. 19.

BEST MODE FOR CARRYING OUT THE INVENTION

Figure 1:
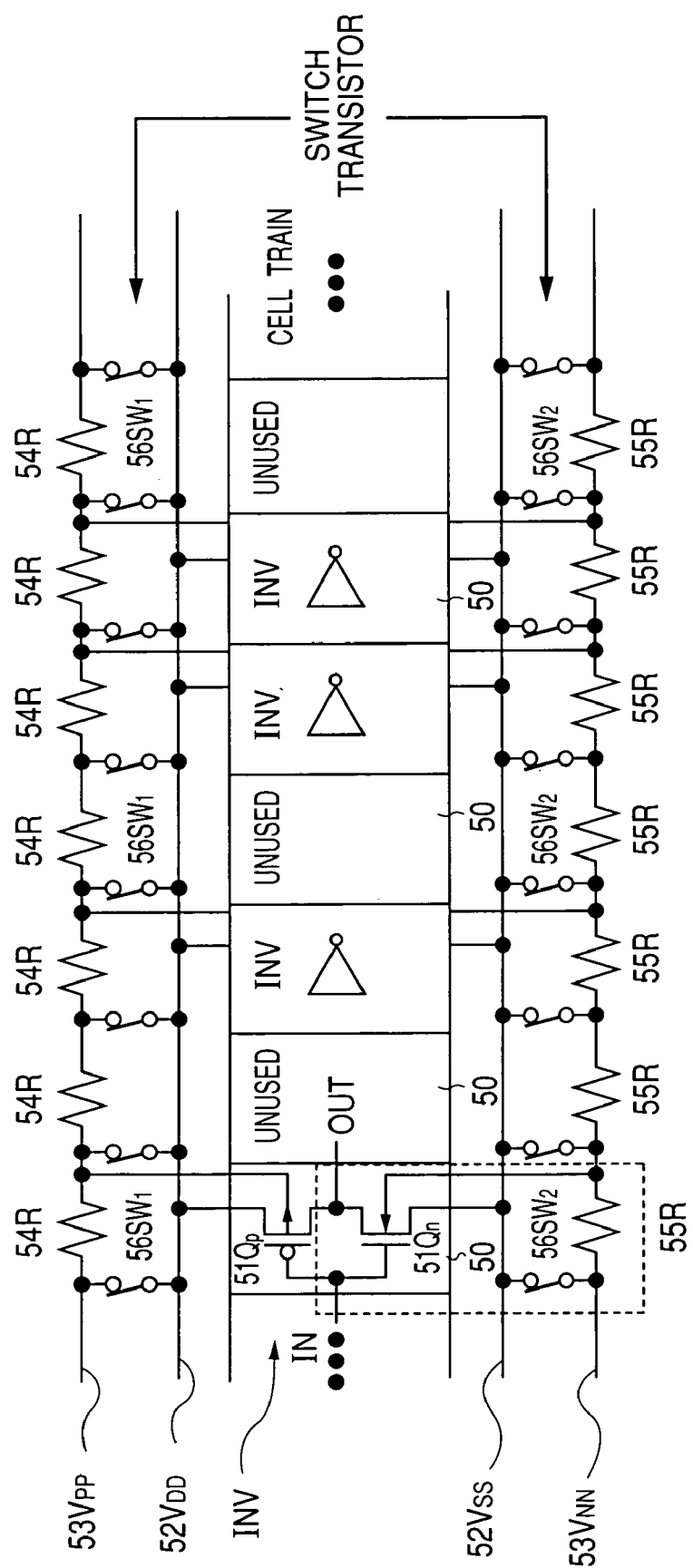
FIG. 1 is an explanatory diagram illustrating the technique discussed by the inventors of the present invention.

The preferred embodiments of the present invention will be explained in detail with reference to the accompanying drawings. The like elements having the same functions are designated with the like reference numerals throughout the drawings prepared for explanation and the same explanation is not repeated in this specification. Moreover, in the preferred embodiments, a p-channel type MISFET (Metal Insulator Semiconductor Field Effect Transistor) is abbreviated as pMIS, while an n-channel type MISFET as nMIS.

First, prior to explanation about the preferred embodiments, the technical concept of the present invention will be explained. FIG. 1 schematically illustrates a structure of an example of the CMIS (Complementary MIS) gate array which has been discussed with the inventors of the present invention. In the cell train, a plurality of basic cells 50 are arranged regularly along the horizontal direction of FIG. 1. The basic cells 50 unused among a plurality of basic cells 50 are given the description of "UNUSED". The basic cells 50 used indicate, for example, formation of an inverter circuit INV as a logic circuit in order to simplify the explanation. This inverter circuit INV is a CMIS inverter circuit consisting of pMIS51Qp and nMIS51Qn. The inverter circuit represents a basic logic circuit and such basic cells are not limited thereto allowing various modifications and changes. For example, such basic cells may be used to form a basic logic circuit or the like such as AND circuit, NAND circuit, OR circuit, NOR circuit or Exclusive-OR circuit, etc. Moreover, the basic logic circuit is indicated to simplify the explanation and a comparatively large size (highly sophisticated and enlarged in size) logic circuit such as a flip-flop circuit and clock circuit or the like may also be formed. Moreover, the sign IN indicates an input of logic circuit, while OUT indicates an output of logic circuit.

The power supply wiring 52VDD is provided to supply the relatively high potential power supply voltage. Moreover, the power supply wiring 52VSS is provided to supply the relatively low potential power supply voltage. The logic circuit represented by the inverter circuit IV is electrically connected between the power supply wirings 52VDD and 52VSS. For example, the drain of pMIS51Qp of the inverter circuit INV is electrically connected to the power supply wiring 52VDD and the source of nMIS51Qn of the inverter circuit INV is electrically connected to the power supply wiring 52VSS.

The wiring 53VPP for controlling well potential corresponds to the n-well where pMIS51Qp of basic cell 50 is arranged. Thereby, the threshold voltage of pMIS51Qp can be set to the predetermined value. The code 54R indicates the diffusing resistance of the n-well. Moreover, the wiring 53VNN for well potential control corresponds to the p-well where the nMIS51Qn of the basic cell 50 is arranged. Thereby, the threshold voltage of nMIS51Qn can be set to the predetermined value. The code 55R indicates the diffusing resistance of such p-well.

A switch element 56SW1 is provided between the power supply wiring 52VDD and wiring 53VPP and a switch element 56W2 is provided between the power supply wiring 52VSS and wiring 53VNN. In FIG. 1, the switch elements 56SW1, 56SW2 are schematically indicated with the electrical codes of the switch. In actual, however, these switches are also formed of transistors. Namely, the switch element 56SW1 is composed of a pMIS, while the switch element 56SW2 is composed of an nMIS. These switch elements 56SW1, 56SW2 electrically connect or disconnect the power supply wirings 52VDD, 52VSS and wirings 53VPP, 53VNN. Namely, under the condition that the switch elements 56SW1, 56SW2 are turned ON, the wiring 53VPP is set to the potential of the power supply wiring 52VDD and a bias voltage is never applied to the p-well and n-well explained above. On the other hand, under the condition that the switch elements 56SW1 and 56SW2 are turned OFF, the power supply wirings 52VDD, 52VSS are separated from the wirings 53VPP, 53VNN and a bias is generated in the p-well and n-well by applying the voltage of the potential different from that of the power supply wirings 52VDD, 52VSS to the wirings 53VPP, 53VNN (n-well and p-well) from the external side.

Here, it can be assumed that potential becomes unstable if the number of power feeding points is rather small because the p-well or n-well (hereinafter referred to only well) is formed of a high-resistance diffusing layer.

When it is considered here how to reserve the stability of well potential, the number of switch elements 56SW1, 56SW2 (or density) required for stabilizing the well potential becomes identical to the number of contact holes for feeding of power to the well under the assumption that the switch elements 56SW1, 56SW2 are in the ON condition when a semiconductor device operates normally. However, since the switch elements 56SW1, 56SW2 have the area as the transistor, if the switch elements 56SW1, 56SW2 are arranged in the same rate as the contact holes, a larger area is required and higher power is also consumed and therefore it is not practical. Moreover, it can also be thought to prepare the wirings for feeding the power to well as a method to reduce the number of switch elements 56SW1, 56SW2 and also reduce the well resistance but this method results in increase of power consumption of wiring channels and deterioration of area efficiency.

Therefore, the mechanism of switching noise generated in the well will be analyzed first as the preparation for thinking about the method to avoid the problems explained above. FIG. 2(*a*) illustrates nMIS51Qn forming an inverter circuit INV in the periphery of the p-well. Moreover, in the node N50 of the p-well, a noise waveform obtained by monitoring the point just under the inverter circuit INV is illustrated in FIG. 2(b) with the graph synchronized with the switching operation. First, a noise Ngb is generated in synchronization with the timing in which the waveform of the signal at the input IN rises. Such noise Ngb has been generated via a gate capacitance element Cgb existing between the gate electrode and semiconductor substrate and this noise is in the positive direction. Subsequently, a large noise Na in the negative direction is generated in synchronization with the waveform of signal at the output OUT. In this case, potential change is defined as nA. On the contrary, in the direction where the signal at the input NA falls, noise Nb is also generated in synchronization with the signal at the output OUT. In this case, potential change is defined as nB. Moreover, in this case, the noise element corresponding to the noise Ngb does not appear because the gate capacitance element Cgb disappears when nMIS51Qn turns ON to form a channel. Since Na is identical to Nb (Na=Nb) based on the charge storing rule, the noise Nb is larger as the absolute value of noise. Therefore, analysis is conducted only to the noise in the type of noise Nb. In this case, a parasitic diode capacitance existing in nMIS51Qn participates in such analysis. Therefore, the inverter circuit INV as the noise source can be illustrated as FIGS. 3(a) and 3(b). Here, the ON resistance of pMIS51Qp is defined as R1 and diode capacitance as C1, C2. Moreover, the effective resistance of well is defined as R2. C3 defines an external load capacitance. For this analysis, the resistance R2 is considered to be sufficiently small in the technique discussed by the inventors of the present invention and thereby diode capacitance C2 is considered as 0 (zero). But, if the resistance R2 becomes distinctive, the diode capacitance C2 can no longer be neglected. FIG. 3(b) is an analysis model where these elements are all replaced with the resistance and capacitance. The linear ordinary differential equation of second order can be obtained by defining u as the potential corresponding to the well noise and by setting a circuit equation using such u as the unknown function and the solution of this differential equation is given as indicated below.

$$U(t)=(e^{-\alpha t}-e^{-\beta t})/D^{1/2}, D=(1+p+1)^2-4pq,$$

$$\alpha=(1+p+q-D^{1/2})/2q\tau_1, \beta=(1+p+q+D^{1/2})/2q\tau_1,$$

$$\tau_1=C_1R_1, p=R_1/R_2, q=C_2/C_1$$

However, normalization is conducted with the power supply voltage VDD=1 in the high potential side. From this, it is understood that noise u(t) can be lowered by enlarging D. D is the quadratic equation of p and q and therefore when p and q are large, D also becomes large. When p is large, the resistance R2 becomes small. This method corresponds to increase in the number of switch elements. In this case, however, if the number of switch elements is simply increased as explained above, area efficiency of the semiconductor device must be sacrificed. Therefore, the allocation considering reduction of area efficiency is required. Moreover, increase of q is related in direct to enlargement of the diode capacitance C2. In the example of the inverter circuit INV of FIG. 3, the diode capacitance C2 seems to be determined with the area of nMIS51Qn. However, in actual, as illustrated in FIG. 1, the diodes for diode capacitance C2 exists like the distributed constants and the diode of the element of diode capacitance C2 also exists in the unused transistor region. Therefore, in the technical concept of the present invention, the power supply and well are electrically connected even in the unused transistor regions. Thereby, it is possible that the diode capacitance C2 is effectively increased, although it looks like the distributed constants. This connection does not include a problem such as increase of layout area. Namely noise of well can be reduced without resulting in drop of area efficiency in the semiconductor device.

Figure 4:
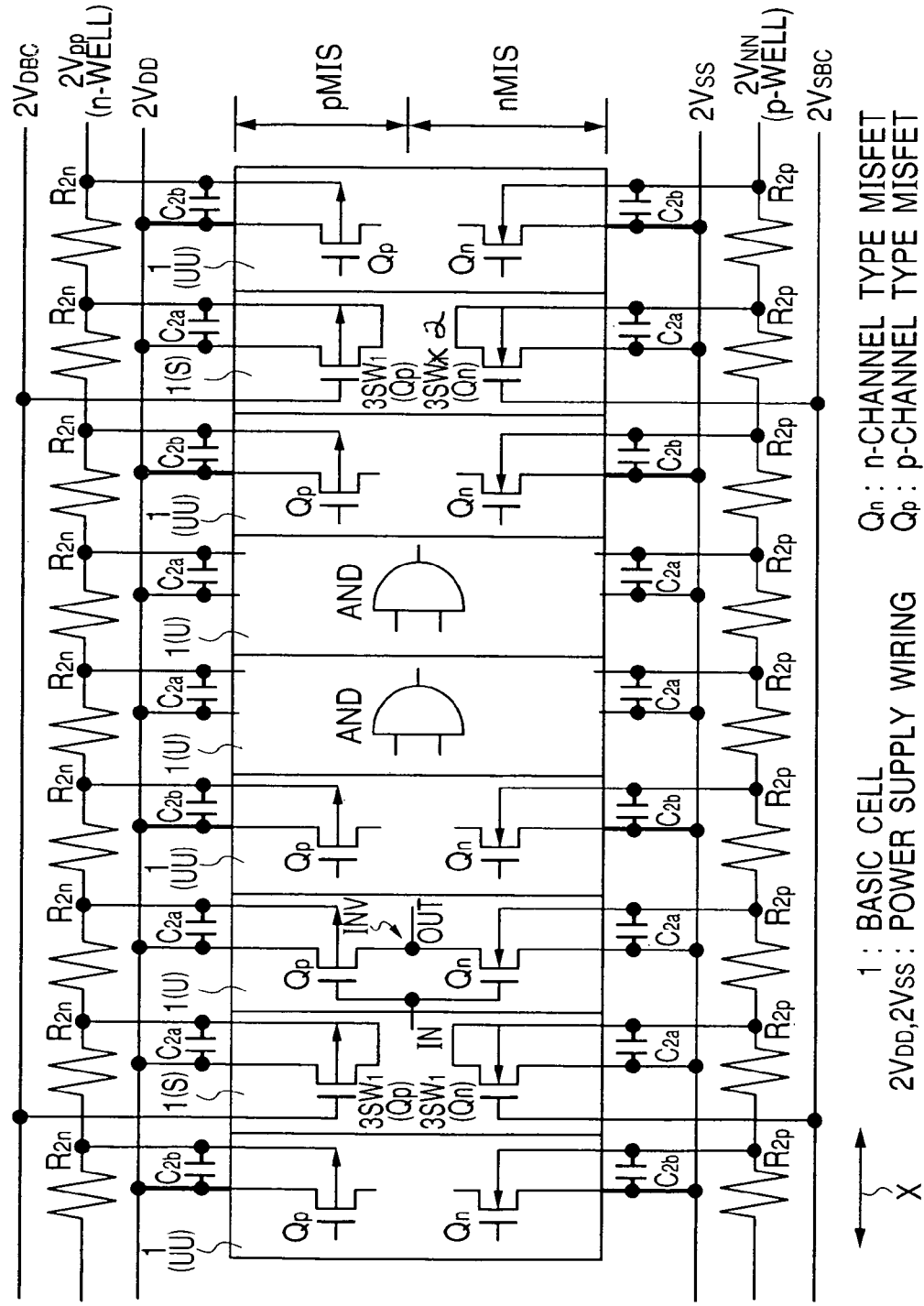
FIG. 4 is an explanatory diagram schematically illustrating a part of the circuit showing the technical concept of the present invention.
Figure 5:
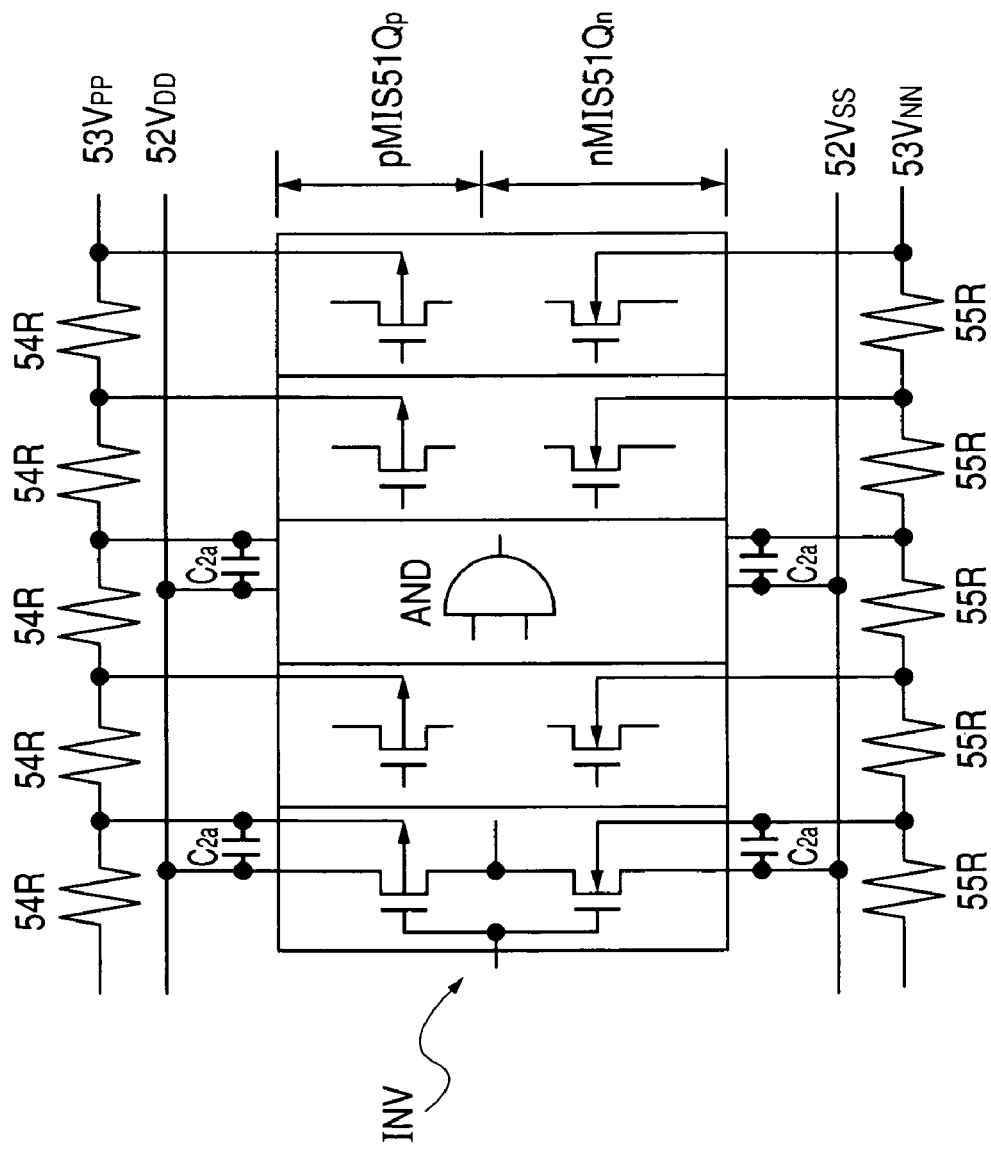
FIG. 5 is an explanatory diagram schematically illustrating a circuit of the technique discussed by the inventors of the present invention.

Next, the technical concept of the present invention will be explained. FIG. 4 schematically illustrates the technical concept of the present invention represented by only one basic cell train. Moreover, FIG. 5 schematically illustrates the technique not introducing the technical concept of the present invention for the comparison purpose.

As illustrated in FIG. 4, a plurality of basic cells 1 are regularly arranged along the X direction (first direction) in the basic cell train. In each basic cell 1, nMISQn and pMISQp, for example, are arranged. The code 1(U) indicates the basic cell used, the code 1(UU) indicates the basic cell unused, 1(S) indicates the basic cell used as the switch elements 3SW1, 3SW2. Moreover, unused basic cell 1(UU) means that it is not used as a logic circuit.

FIG. 4 illustrates, for simplifying the explanation, that a basic logic circuit such as inverter circuit INV and AND circuit AND, for example, is formed in the basic cell 1 as the logic circuit. However, the inverter circuit INV and AND circuit AND represent the logic circuit and the logic circuit is not limited thereto, allowing various modifications and changes. For instance, the present invention can be adapted when the basic logic circuit such as NAND circuit, OR circuit, NOR circuit or Exclusive-OR circuit or the like is formed. Here, the basic logic circuit is indicated to simplify the explanation and the present invention can also be adapted when a comparatively large logic circuit such as the flip-flop circuit and clock circuit or the like is formed. The inverter circuit INV and AND circuit AND are formed of pMISQp and nMISQn in the basic cell 1.

The power supply wiring 2VDD is provided to supply the relatively high potential power supply voltage and the power supply wiring 2VSS is provided to supply the relatively low potential power supply voltage. The basic logic circuit is electrically connected between the power supply wirings 2VDD, 2VSS. For example, the drain of pMISQp of the inverter circuit INV is electrically connected to the power supply wiring 2VDD, while the source of nMISQn of the inverter INV is electrically connected to the power supply wiring 2VSS. The gate electrodes of nMISQn and pMISQp are electrically connected with each other and are electrically connected with the input IN. Moreover, the source of pMISQp and the drain of nMISQn are electrically connected with each other and also connected electrically with the output OUT.

The wiring 2VPP for well potential control corresponds to the n-well where pMISQp of the basic cell 1 is arranged and it is indicated as a wiring. The threshold voltage of pMISQp can be set to the predetermined value by applying the predetermined voltage to this wiring 2vpp (namely, n-well). The code R2n indicates the diffusing resistance of n-well. Moreover, the wiring 2VNN for well potential control corresponds to the p-well where nMIS of the basic cell 1 is arranged and it is indicated here as the wiring. The threshold voltage of nMISQn can be set to the predetermined value by applying the predetermined voltage to this wiring 2vNN (namely, p-well). The code R2p indicates the diffusing resistance of p-well.

A switch element 3SW1 is provided between the power supply wiring 2VDD and the wiring 2VPP (n-well) and a switch element 3SW2 is provided between the power supply wiring 2VSS and the wiring 2VNN (p-well). These switch elements 3SW1, 3SW2 electrically connect or disconnect the power supply wirings 2VDD, 2VSS and wirings 2VPP, 2VNN (well). Namely, when the switch elements 3SW1, 3SW2 are in the ON condition, the voltages of the n-well and p-well are set to the power supply voltages (n-well is power supply voltage VDD, p-well is power supply voltage VSS) and the bias voltage is not applied to each well. Meanwhile, under the condition that the switch elements 3SW1, 3SW2 are in the OFF condition, the bias is generated in each well by externally applying the voltage different from the power supply voltage to the wirings 2VPP, 2VNN (n-well and p-well).

Here, the first distinctive characteristic of the technical concept of the present invention is that the switch elements 3SW1, 3SW2 are structured with pMISQp and nMISQn in the basic cell 1. Namely, the switch elements 3SW1, 3SW2 are formed with only one basic cell 1. As explained above, the switch element may be arranged anywhere desired on the semiconductor substrate by forming the switch elements 3SW1, 3SW2 with MISFET in the basic cell 1. Namely, a degree of freedom of the allocation of the switch elements 3SW1, 3SW2 can be improved.

Therefore, the switch elements 3SW1, 3SW2 can be arranged on the semiconductor substrate under the optimum condition for the design and logical structure of the semiconductor device, namely without generation of any problem in allocation of the main circuit. The gate electrode of pMISQp forming the switch element 3SW1 is electrically connected to the wiring 2VDBC. The gate electrode of nMISQn forming the switch element 3SW2 is electrically connected to the wiring 2VSBC. The ON/OFF conditions of the switch elements 3SW1, 3SW2 are controlled with the signal transmitted to the gate electrodes of the switch elements 3SW1, 3SW2 from these wirings 2VDBC, 2VSBC.

Moreover, the second distinctive characteristic of the technical concept of the present invention is that the switch elements 3SW1, 3SW2 are discretely arranged in individual wells. Namely, a plurality of switch elements 3SW1, 3SW2 are discretely arranged between both ends of the well. Therefore, a plurality of switch elements 3SW1, 3SW2 can be arranged discretely in the X direction to the well formed extending in the X direction by structuring the switch elements 3SW1, 3SW2 using a plurality of basic cell 1 in the X direction. As explained above, the allocation of switch elements at both ends of well can be thought as the structure wherein a problem in increase of well noise is considered. In this case, it is not enough to arrange only the switch elements 3SW1, 3SW2 and the allocation considering the drop of area efficiency is also required.

In the basic cell 1 used, namely in the basic cell 1(U) where the logic circuit is formed and in the basic cell 1 (S) where the switch elements 3SW1, 3SW2 are formed, a diode capacitance C2a corresponding to the diode capacitance C2 is formed between the power supply wiring 2VDD and wiring 2VPP (n-well) and between the power supply wiring 2VSS and wiring 2VNN (p-well). This is a capacitance generally formed as illustrated in FIG. 5.

Moreover, the third distinctive characteristic of the technical concept of the present invention is that the semiconductor region of the unused transistor region and the power supply are electrically connected to form a diode capacitance C2b as the capacitance element. Namely, as illustrated in FIG. 4, the semiconductor region (drain) of pMISQp of unused basic cell 1 (UU) and the power supply wiring 2VDD are electrically connected and moreover the semiconductor region (source) of nMISQn of unused basic cell 1 and the power supply wiring 2VSS are electrically connected. Thereby, even in the region of unused basic cell 1 (UU), a diode capacitance C2b corresponding to the diode capacitance C2 is formed between the power supply wiring 2VDD and wiring 2VPP (n-well) and between the power supply wiring 2VSS and the wiring 2VNN (p-well). Namely, the capacitance element (diode capacitance element) C2 is formed using the unused basic cell 1 (UU) not forming a logic circuit. Thereby, since the diode capacitance C2 can be increased without deterioration of the area efficiency in the semiconductor device, noise of well can be reduced. As illustrated in FIG. 5, since the basic cell not forming the logic circuit is not electrically connected to the power supply wirings 52VDD, 52VSS, the diode capacitance C2b is not formed.

Figure 6A:
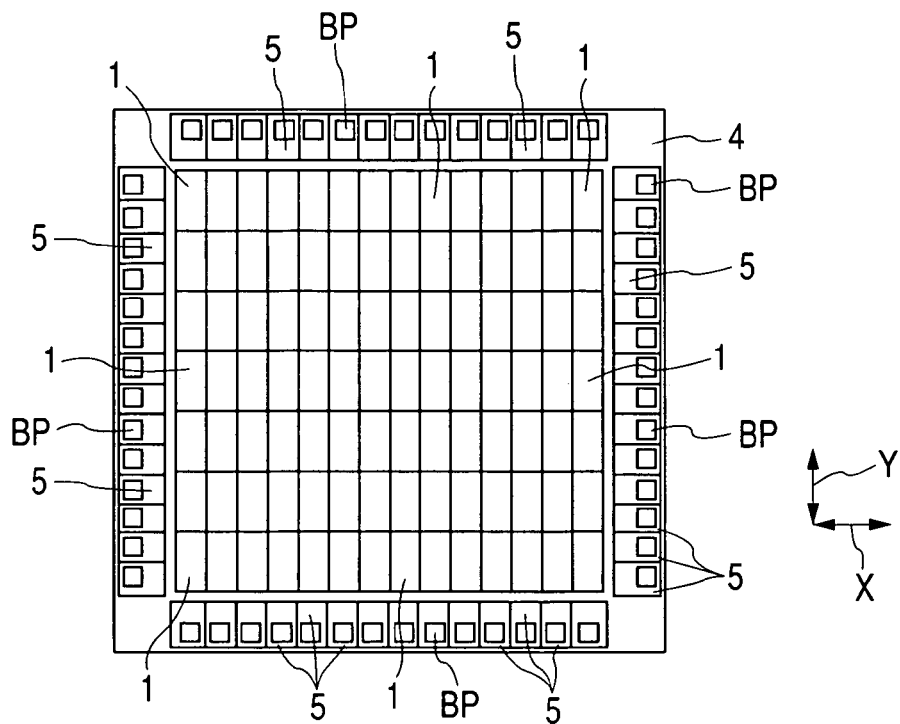
FIGS. 6(a) and 6(b) are plan views of a semiconductor device as an embodiment of the present invention.
Figure 6B:
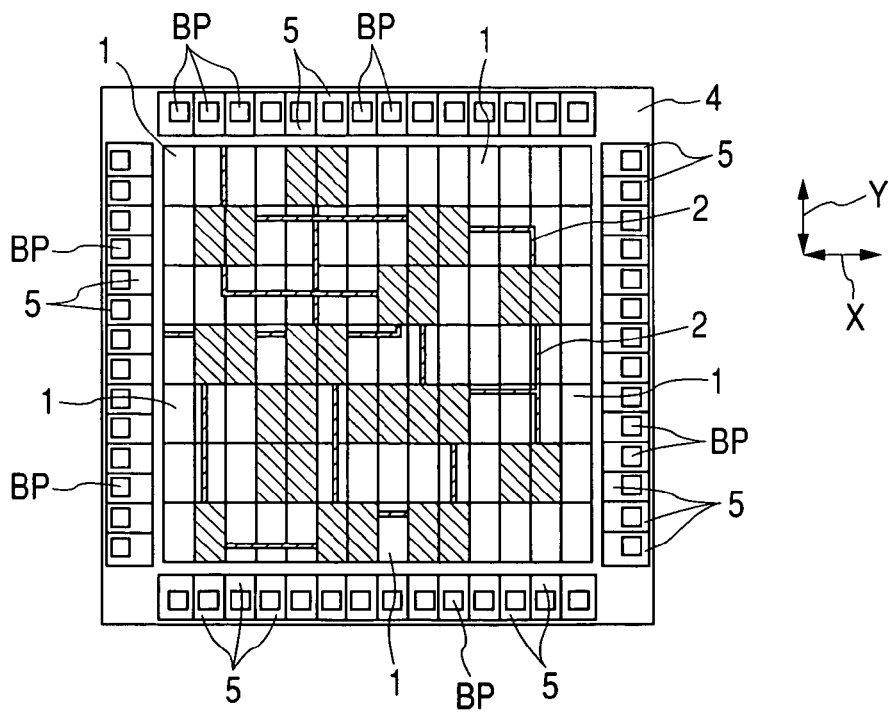

Next, an example where such technical concept of the present invention is adapted, for example, to the CMIS gate array will be explained. FIGS. 6(a) and 6(b) are the plan view of the semiconductor chip forming a semiconductor device of the present embodiment. FIG. 6(a) schematically illustrates the allocation of the basic cell 1, I/O (Input/Output) cell 5 and a bonding pad BP as an external terminal in the semiconductor chip 4. FIG. 6(b) schematically illustrates a plan view of the semiconductor chip 4 after the allocation and wiring processes. FIGS. 6(a) and 6(b) respectively illustrate the same semiconductor chip 4 and divided to these two kinds of figures for making easier the observation of figures.

The semiconductor chip 4 is formed in the manner, for example, that a small piece of a square flat silicon single crystal is used as the element forming member and a plurality of basic cells 1 are regularly arranged along the X direction and Y direction at the center of the main surface (internal circuit region). Namely, the gate array in this embodiment is a so-called SOG (Sea Of Gate) type or channel-less type gate array. However, the present invention is not limited only to application into the SOG type gate array and allows various changes and modifications. For example, the present invention can also be adapted to the ordinary gate array wherein the basic cell train allocating a plurality of basic cells 1 along the X direction is provided in the plural trains via the wiring channel and to the composite type gate array wherein ROM (Read Only Memory) and RAM (Random Access Memory) or the like are also arranged in addition to the basic cells 1 in the internal circuit region.

The basic cell 1 is a unit region having one or a plurality of elements which can form the basic logic circuit (for example, OR circuit, NOR circuit, AND circuit, NAND circuit, Exclusive-OR circuit or inverter circuit). In the semiconductor chip 4, a basic logic circuit or a comparatively large size logic circuit (hatched region in FIG. 6) is formed of one or a plurality of basic cells 1 and moreover these logic circuits are electrically connected with a wiring 2 (indicated as the area hatched with oblique lines in FIG. 6(b) including the power supply lines 2VDD, 2VSS, wirings 2VDBC, 2VSBC) and thereby a semiconductor device, for example, having the predetermined logic function such as the microprocessor can be structured. In the basic cell 1, pMIS and nMIS, for example, are formed as will be explained later. A CMIS circuit can be formed of these pMIS and nMIS. The practical structure example of the basic cell 1 will be explained later in detail.

At the external circumference of the main surface of a semiconductor chip 1 (external circumference of the internal circuit region, namely peripheral circuit region), a plurality of I/O cells 5 and bonding pad BP are arranged along each side of the semiconductor chip 4. This I/O cell 5 is a unit region including the elements to form, for example, the input/output circuit such as the input circuit, output circuit or input/output both-way circuit or the like and form an electrostatic breakdown preventing circuit such as a protection diode or protection resistor or the like. Here, the input circuit has a function to set the power supply voltage and electrical signal applied from the external circuits of the semiconductor chip 4 to the condition matching to the internal circuit of the semiconductor chip 4, while the output circuit has a function to transmit the electrical signal formed within the semiconductor chip 4 to the target electronic device via the external transmission line without any attenuation of signal. Moreover, the bonding pad BP is a part where the bonding wire is joined and the power supply voltage and electrical signal are inputted or outputted at the internal and external sides of the semiconductor chip 4 through such bonding pad BP. The bonding pad BP is formed, for example, of the flat and square shape aluminum, aluminum alloy or copper and is arranged for every I/O cell 5. The practical structure example of I/O cell 5 will also be explained later in detail.

Figure 7:
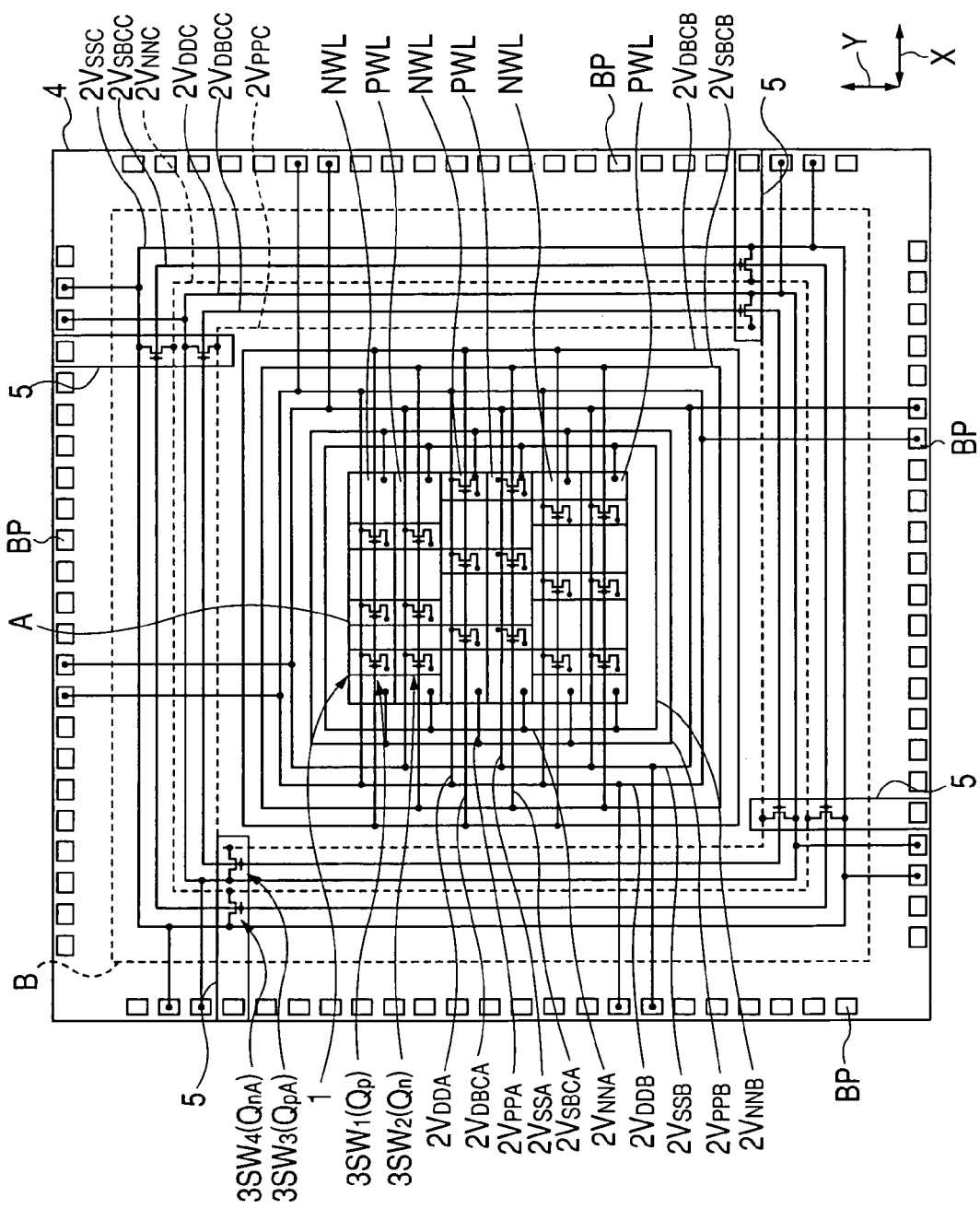
FIG. 7 is an explanatory diagram schematically illustrating a layout of the wiring system and switch elements in the semiconductor device of FIG. 6.

First, the switch element explained in the first and second distinctive characteristics will be explained. FIG. 7 schematically illustrates the allocation of switch elements and related wirings. As illustrated in FIG. 7, the n-well NWL and p-well PWL are alternately arranged along the Y direction in the internal circuit region A. As explained above, in this embodiment, the switch elements 3SW1, 3SW2 are formed of pMISQp and nMISQn in the basic cell 1 and arranged discretely in each n-well NWL and p-well PWL.

The semiconductor regions (drains) of pMISQp for a plurality of switch elements 3SW1 dispersed within the same n-well NWL are electrically connected with each other via the power supply wiring 2VDDA which is electrically connected to the power supply wiring 2VDDB arranged surrounding the external circumference of the internal circuit region A. Moreover, the semiconductor regions (sources) of the pMISQp of a plurality of switch elements 3SW1 are electrically connected to the n-well NWL via the wiring 2VPPA. As explained above, a switch element 3SW1 is provided between the power supply wiring 2VDDB and n-well NWL. The wiring 2VPPB arranged to surround the external circumference of the internal circuit region A is electrically connected to the n-well NWL so that the predetermined voltage can be applied to the n-well NWL from the external circuit.

Moreover, the gate electrodes of pMISQp of a plurality switch elements 3SW1 are electrically connected with each other via the wiring 2VDBCA and is also electrically connected to the wiring 2VDBCB arranged to surround the internal circuit region A. Meanwhile, the semiconductor regions (sources) of nMISQn for a plurality of switch elements 3SW2 dispersed in the same p-well PWL are electrically connected with each other via the power supply wiring 2VSSA and is also electrically connected to the power supply wiring 2VSSB arranged to surround the external circumference of the internal circuit region A. Moreover, the semiconductor regions (sources) of nMISQn of a plurality of switch elements 3SW2 are electrically connected to the p-well PWL via the wiring 2VNNA. As explained above, a switch element 3SW2 is provided between the power supply wiring 2VSSA and the p-well PWL. Moreover, the wiring 2VNNB arranged to surround the external circumference of the internal circuit region A is electrically connected to the p-well PWL so that the predetermined voltage can be applied to the p-well PWL from the external circuit. Moreover, the gate electrodes of nMISQn of a plurality of switch elements 3SW2 are electrically connected with each other via the wiring 2VSBCA and is also electrically connected to the wiring 2VSBCB arranged to surround the internal circuit region A. Since the power supply wirings 2VDDB, 2VSSB, wirings 2VPPB, 2VNNB, 2VDBCB, 2VSBCB are arranged to surround the internal circuit region A, the power supply voltages VDD, VSS and the predetermined voltages for control signal VPP, VNN, VDBC and VSBC can be supplied to the internal circuit region A.

Moreover, in this embodiment, the I/O cells are divided for the internal region side and external region side with a broken line B of FIG. 7 defined as the border line and the switch elements 3SW3, 3SW4 are formed of the elements in the internal region side. These switch elements 3SW3, 3SW4 have the same function as that of the switch elements 3SW1, 3SW2 in the internal circuit region A. It is because the element (MISFET) in the internal region side of the I/O cell 5 mainly forms the input circuit as will be explained later and therefore the threshold voltage must be lowered relatively in the same size as the element (MISFET) of the internal circuit region A in order to improve the operation rate and therefore it is required to change the threshold voltage at the time, for example, of electrical testing and waiting period of the semiconductor device. Since these switch elements 3SW3, 3SW4 are provided, it is now possible, during the normal operation, to turn ON the switch elements 3SW3, 3SW4 to lower the threshold value of the MISFET in the internal region of I/O cell 5 as specified and also possible, during the inspection period, to turn OFF the switch elements 3SW3, 3SW4 to relatively raise the threshold value of the MISFET in the internal region of the I/O cell 5.

In this embodiment, these switch elements 3SW3, 3SW4 are unused pMISQpA and nMISQnA in the internal region of the I/O cell 5. However, the switch elements 3SW3, 3SW4 may also be formed of the unused elements in the I/O cell 5. In FIG. 7, the switch elements 3SW3, 3SW4 are arranged at the area near the angled corners of the semiconductor chip 4 and it is also possible to provide a plurality of switch elements 3SW3, 3SW4 to each side of the semiconductor chip 4. However, in this case, it is not enough to arrange only the switch elements 3SW3, 3SW4 but it is required to give any adverse effect on the allocation of the input/output circuits and to consider a certain means to reduce the well noise. The layout in the I/O cell 5 and effect of the switch element will be explained later in detail.

On the internal region of this I/O cell 5, the power supply wirings 2VDDC, 2VSSC and wirings 2VDBCC, 2VSBCC, 2VPPC, 2VNNC are arranged in the annular shape along the external circumference of the semiconductor chip 4. Thereby, the power supply voltages VDD, VSS and predetermined voltages for control signal VDBC, VSBC can be applied to each element (including switch elements 3SW3, 3SW4) of the I/O cell 5 and moreover the predetermined voltages VPP, VNN for control signal can also be applied from any position to the n-well NWL and p-well PWL in the peripheral circuit region. Here, for the input/output circuits and an internal circuit forming the logic, the wiring systems for supplying voltages are provided individually considering generation of noise even when the potentials of the power supply voltages VDD, VSS and predetermined voltages VPP, VNN, VDBC and VSBC are identical. Moreover, in some cases, the power supply voltages VDD, VSS and the predetermined voltages VPP, VNN, VDBC, VSBC are different in the input/output circuit and the internal circuit.

Figure 8:
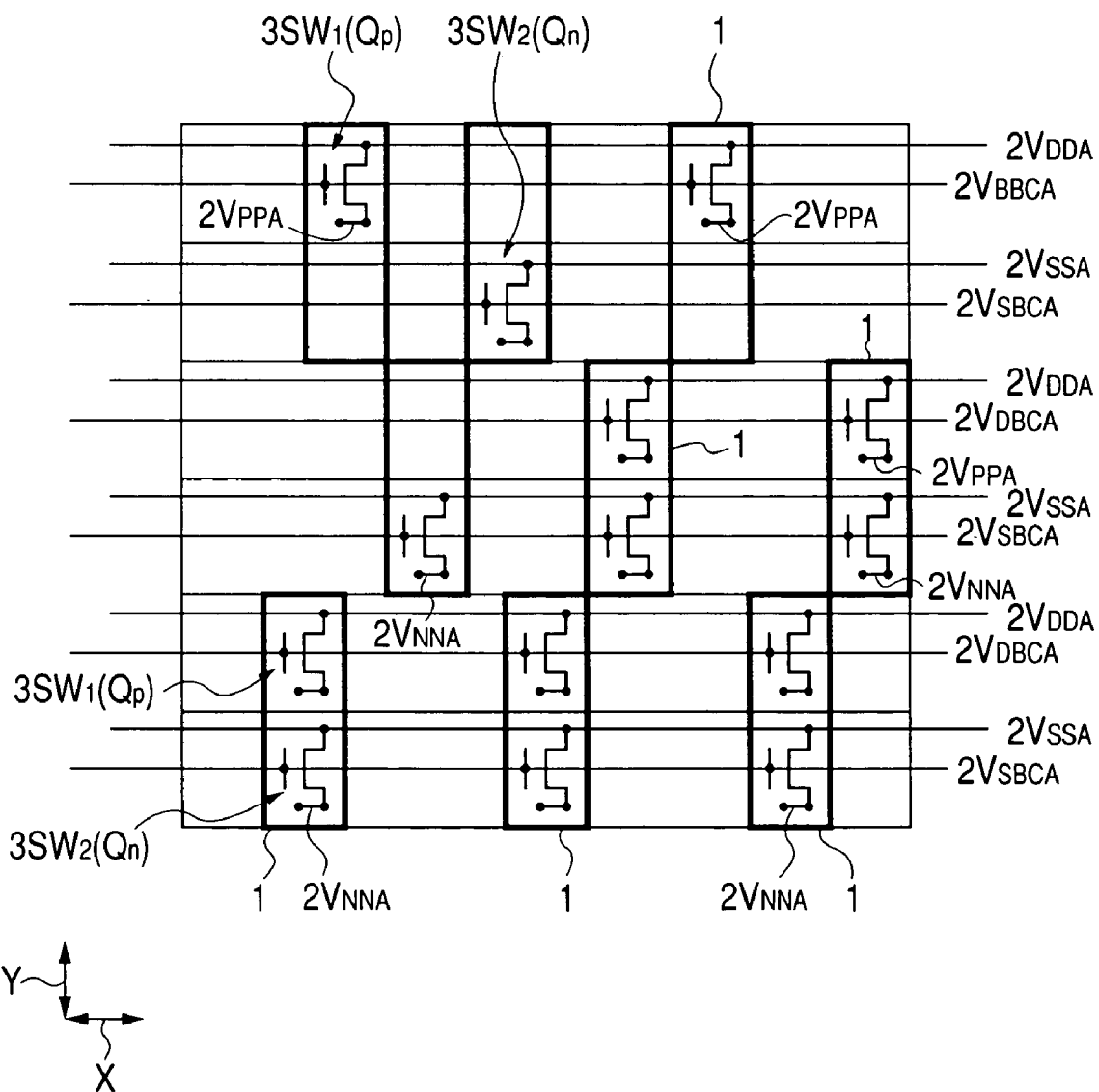
FIG. 8 is an explanatory diagram schematically illustrating a modification example of FIG. 7.

FIG. 8 is illustrates a modification example of FIG. 7. The thick frame indicates the basic cell 1. This modification example indicates that both pMISQp and nMISQn in one basic cell 1 are not formed as the switch elements and any one of pMISQp or nMISQn in one basic cell 1 is formed as the switch element 3SW1, 3SW2. In the case of this structure, since unused MISFET is used as the switch element, a degree of freedom in allocation of the switch elements can further be improved in comparison with the case where the unused basic cell 1 is used as the switch element. This structure can also be adapted in the peripheral circuit region (internal side of the I/O cell 5).

Figure 9:
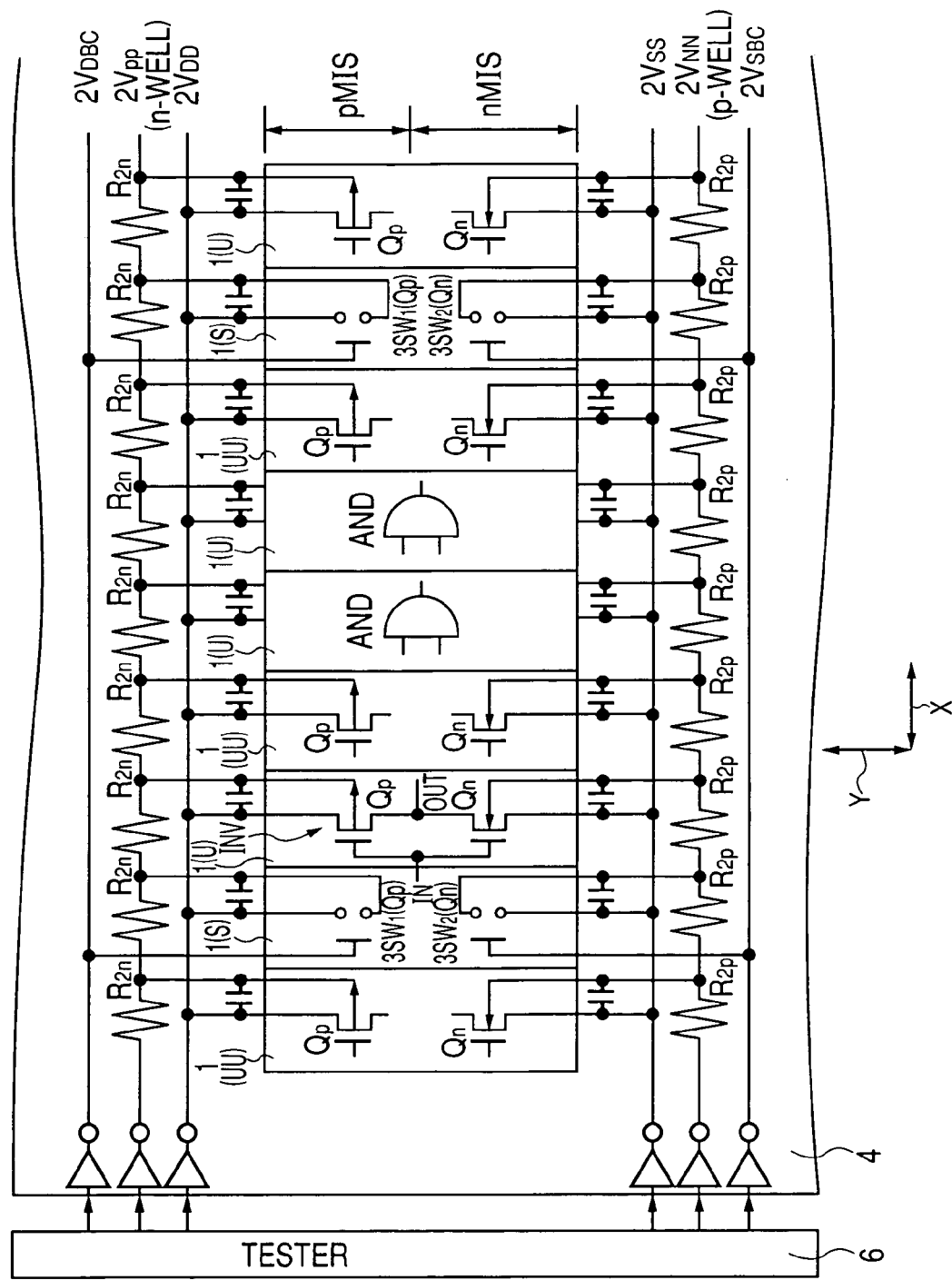
FIG. 9 is an explanatory diagram of a semiconductor device of FIG. 6 in the testing period.
Figure 10:
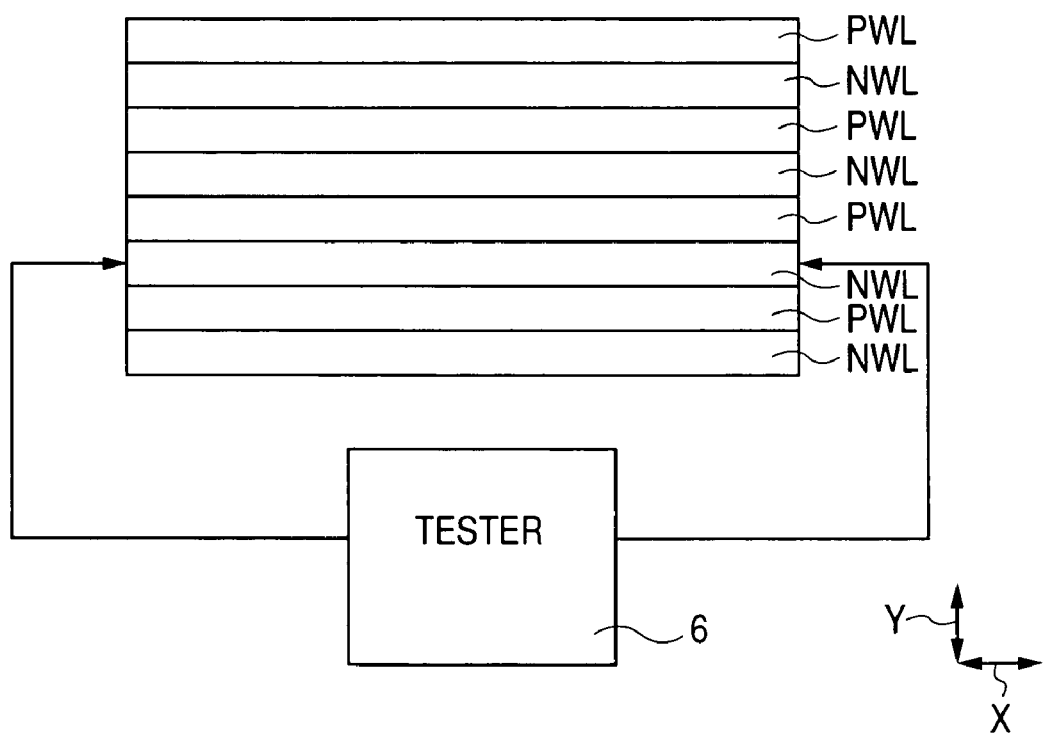
FIG. 10 is an explanatory diagram of a switch element of the semiconductor device of FIG. 6 in the testing period.
Figure 11:
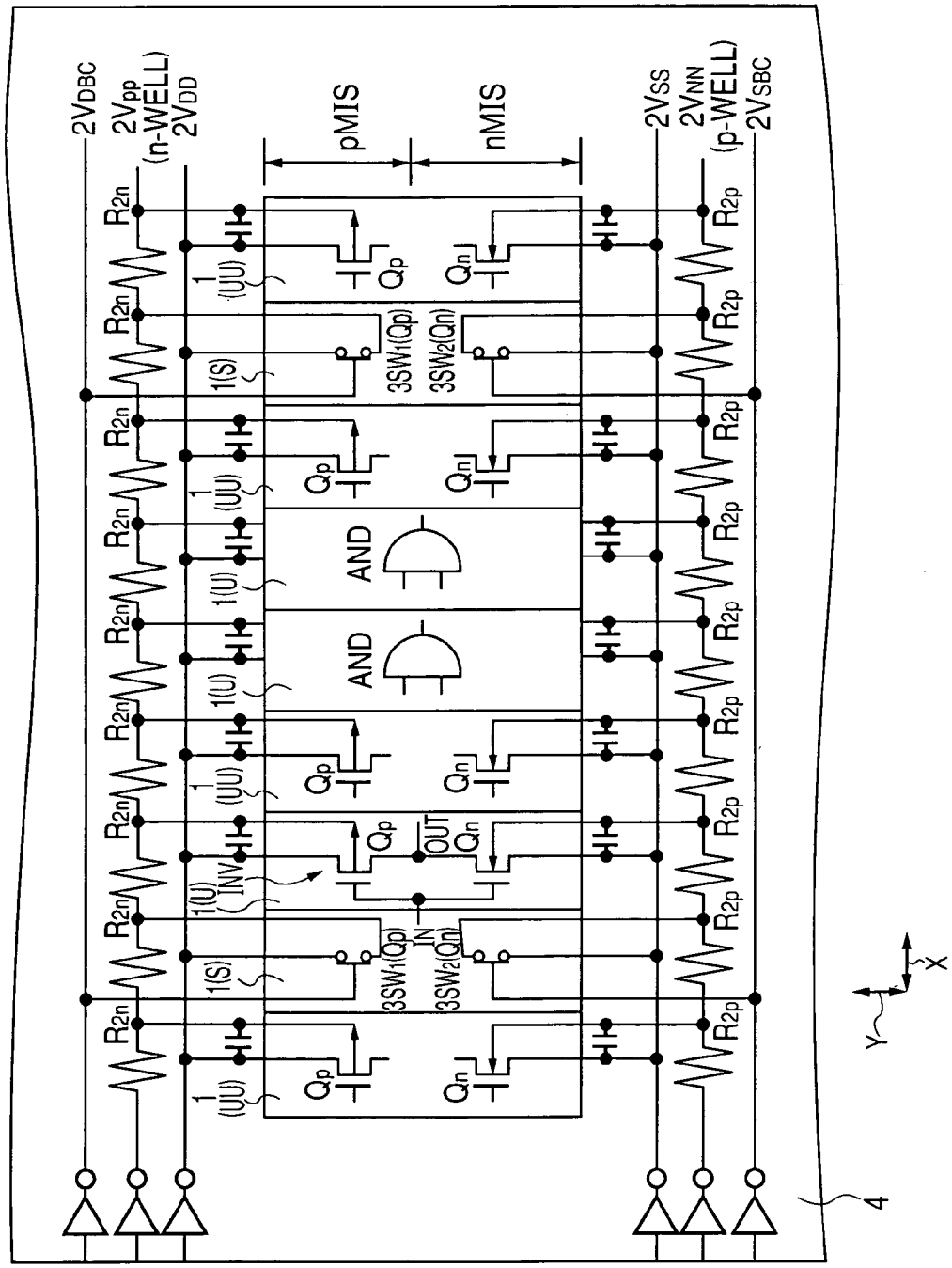
FIG. 11 is an explanatory diagram of a switch element of the semiconductor device of FIG. 6 in the operating period.

Application examples of such switch element will be explained with reference to FIG. 9 to FIG. 11. In FIG. 9 and FIG. 11, the switch elements 3SW1, 3SW2 are indicated with the electrical code of the switch in order to make obvious the ON/OFF conditions of the switch elements 3SW1, 3SW2.

FIG. 9 schematically illustrates the condition of the electric testing such as the measuring inspection of standby current in the semiconductor device of this embodiment. During the testing, the switch elements 3SW1, 3SW2 are turned OFF with the signal from the wirings 2VDBC, 2VSBC and the predetermined voltages VPP, VNN different from the power supply voltages VDD, VSS are applied to the wirings 2VPP, 2VNN (well) from a tester 6 (namely, from the external side of the semiconductor chip 4) under the condition that the power supply wiring 2VDD and wiring 2VPP (n-well) are electrically separated and the power supply wiring 2VSS and the wiring 2VNN (p-well) are electrically separated. Thereby, it is now possible to set the threshold voltage of pMISQp and nMISQn in the basic cell 1 to the predetermined value (relatively higher value for that in the operating condition) different from that in the operating condition. In this testing, the predetermined voltages VPP, VNN are applied across the n-well NWL or p-well PWL as illustrated in FIG. 10. However, in this testing, a logic circuit is not operated and noise level is not a problem and therefore the diffusing resistors R2n, R2p may have higher resistance values. Moreover, the power supply voltage VDD during the testing is, for example, about 3.5 V and the power supply voltage VSS is, for example, about −1.8V. Therefore, a leak current can be lowered by increasing the threshold value of the transistor during the testing and thereby it can be determined easily whether a transistor is defective or not.

On the other hand, FIG. 11 schematically illustrates the condition of the semiconductor device in the operating condition. During the operating condition, the switch elements 3SW1, 3SW2 are turned ON with the signal from the wirings 2VDBC, 2VSBC to electrically connect the power supply wiring 2VDD and the wiring 2VPP (n-well) and also electrically connect the power supply wiring 2VSS and the wiring 2VNN (p-well) in order to set the potentials of the wirings 2VPP, 2VNN (well) and the power supply wirings 2VDD, 2VSS to the same potential (including an error). Thereby, it is possible to set the threshold voltages of pMISQp and nMISQn in the basic cell 1 to the design value (relatively lower value than that at the time of testing). The power supply voltage VDD during the operating condition is for example about 1.8 V and the power supply voltage VSS is for example about 0V. Thereby, high speed operation of logic circuit can be realized.

Figure 12:
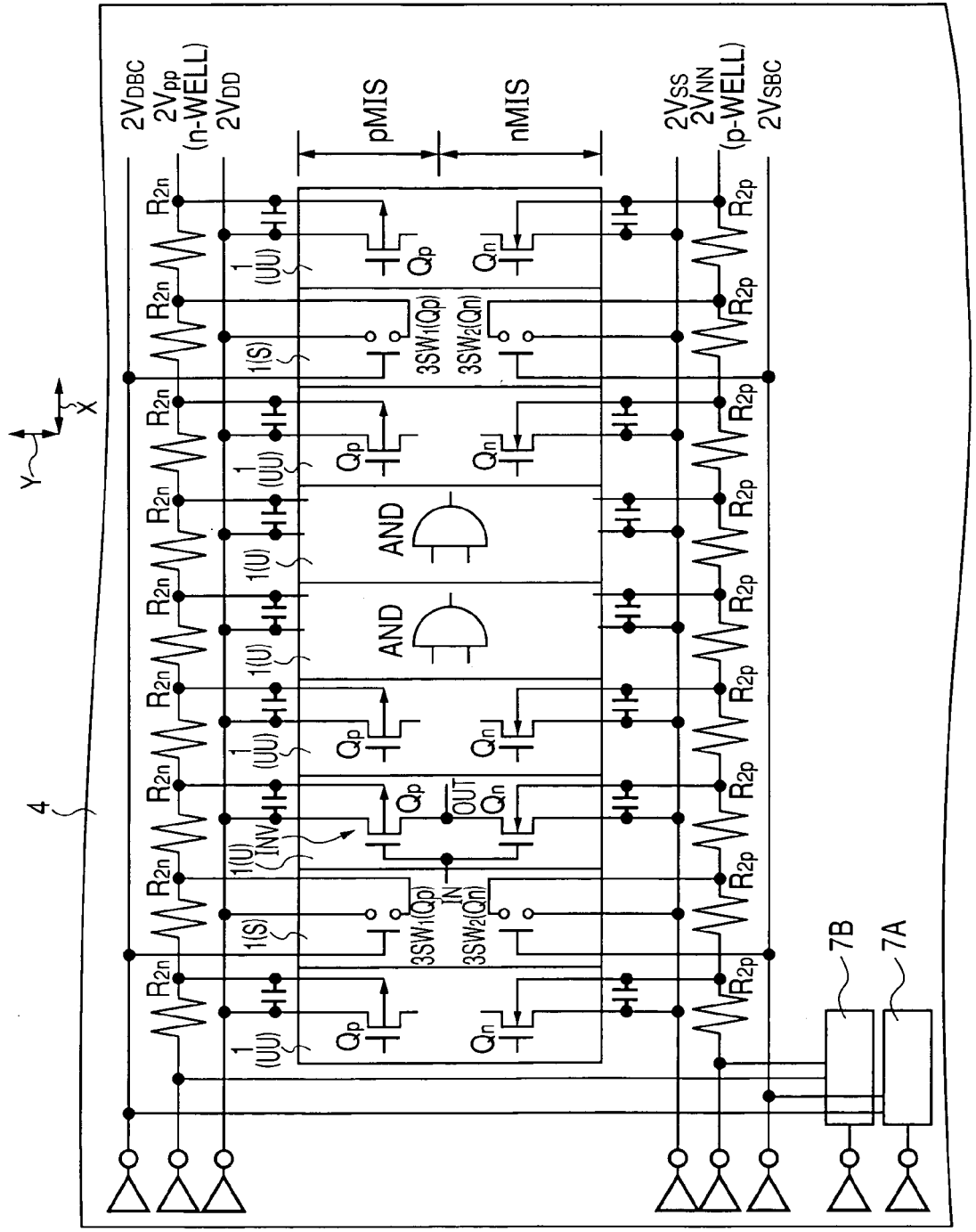
FIG. 12 is an explanatory diagram schematically illustrating a modification example of the semiconductor device of FIG. 6.

FIG. 12 illustrates a modification example of the structure to supply the voltages (VDBC, VSBC) to the gate electrodes of the switch elements 3SW1, 3SW2 in the semiconductor chip 4 and the voltages (VPP, VNN) to the wirings 2VPP, 2VNN (n-well and p-well). Even in FIG. 12, the switch elements 3SW1, 3SW2 are indicated with the electrical code of switch but in actual the switch elements are formed of pMIS and nMIS as explained above. A voltage generating circuit 7A is a circuit electrically connected to the wirings 2VDBC, 2VSBC to transmit the predetermined voltages VDBC, VSBC to the gate electrodes of the switch elements 3SW1, 3SW2 in order to control the ON and OFF conditions of the switch elements 3SW1, 3SW2. A voltage generating circuit 7B is a circuit electrically connected to the wirings 2VPP, 2VNN (n-well and p-well) to supply the voltages VPP, VNN to the n-well and p-well at the time of testing and waiting conditions.

Next, the structure (structure to increase the diode capacitance C2) for stabilizing the potential of well explained in the third distinctive characteristic of the present invention will be explained. FIG. 13(a) is a plan view schematically illustrating a flat layout of unused transistor. FIG. 13(a) is a plan view with hatching for making easier the observation of drawings. Moreover, FIG. 13(b) is a schematic cross-sectional view along the line XA—XA in FIG. 13(a). FIG. 13(b) is a cross-sectional view with hatching for making easier the observation of drawings.

As illustrated in FIGS. 13(a) and 13(b), the pMISQp is formed in the n-well NWL forming region and nMISQn is formed in the p-well PWL forming region in the semiconductor substrate 4S forming the semiconductor chip 4. The pMISQp has a pair of p-type semiconductor regions 8P, 8P, a gate insulation film 9 and a gate electrode 10. Meanwhile, the nMISQn has a pair of n-type semiconductor regions 8N, 8N, a gate insulation film 9 and a gate electrode 10. On the main surface of the semiconductor substrate 4S, an interlayer insulation film 11 is formed and the pMISQp and nMISQn are covered with this interlayer insulation film 11. On this interlayer insulation film 11, the wirings 2VDD, 2VSS are formed. In this embodiment, the wiring 2VDD is electrically connected to both of a pair of semiconductor regions 8P of the pMISQp through the contact hole 12 bored to the interlayer insulation film 11. Moreover, the wiring 2VSS is electrically connected to both of a pair of semiconductor regions 8N of the nMISQn via the contact hole 12 bored to the interlayer insulation film 11.

In such a structure, a pn-junction diode is formed between the n-well NWL and both of a pair of semiconductor regions 8P, 8P and between the p-well PWL and both of a pair of semiconductor regions 8N, 8N. Since an inverse bias is applied to this diode, it does not turn ON and is observed as the diode capacitance C2. Accordingly, the diode capacitance C2 can be increased by electrically connecting the semiconductor regions 8P, 8N of the unused pMISQp and nMISQn and the wirings 2VDD, 2VSS. Thereby, stability of potential of the n-well NWL and p-well PWL can be improved. Therefore, since stability of the threshold voltage of the pMISQp and nMISQn forming the logic circuit formed on the semiconductor substrate 4 can be improved, operation stability of the semiconductor device can also be improved. Moreover, a semiconductor device including the CMIS circuit has a problem of latch-up. Particularly, the structure including the switch elements has a problem that latch-up is easily generated because increase of noise in the well can be estimated with increase of the resistor R2 as explained above. As an example of the countermeasure, it is thought to control the transmission of noise by introducing the well of threefold structure, but it is recommended to avoid the employment of structure which interferes micro-miniaturization because such micro-miniaturization is required in the internal circuit region. In this embodiment, since the diode capacitance C2 can be increased and noise generated in the n-well NWL and p-well PWL is controlled by electrically connecting the semiconductor regions (8P, 8N) for source/drain of unused transistor and the power supply wirings 2VDD, 2VSS via a small contact hole 12, generation of latch-up can be controlled without impeding the request for micro-miniaturization. Therefore, operation reliability of the semiconductor device having the CMIS circuit can be improved without increase in size of the semiconductor device.

FIGS. 14(a) and 14(b) illustrate modification examples of FIGS. 13(a) and 13(b). In FIGS. 14(a), 14(b), the power supply wiring 2VDD and one semiconductor region 8P of a pair of semiconductor regions 8P, 8P of the pMISQp are electrically connected via the contact hole 12, and the power supply wiring 2VSS and one semiconductor region 8N of a pair of semiconductor regions 8N, 8N of the nMISQn are electrically connected via the contact hole 12. In this case, on this semiconductor substrate 4, the diode capacitance C2 is formed between one semiconductor region 8P and n-well NWL and between one semiconductor region 8N and p-well PWL. Therefore, the electrode area of capacitance becomes smaller than that in FIG. 13 and thereby the diode capacitance C2 is reduced, but the diode capacitance C2 can be increased in comparison with the case where the connection explained above is not yet performed.

Next, a practical structure example of the semiconductor device in this embodiment will then be explained.

Figure 15:
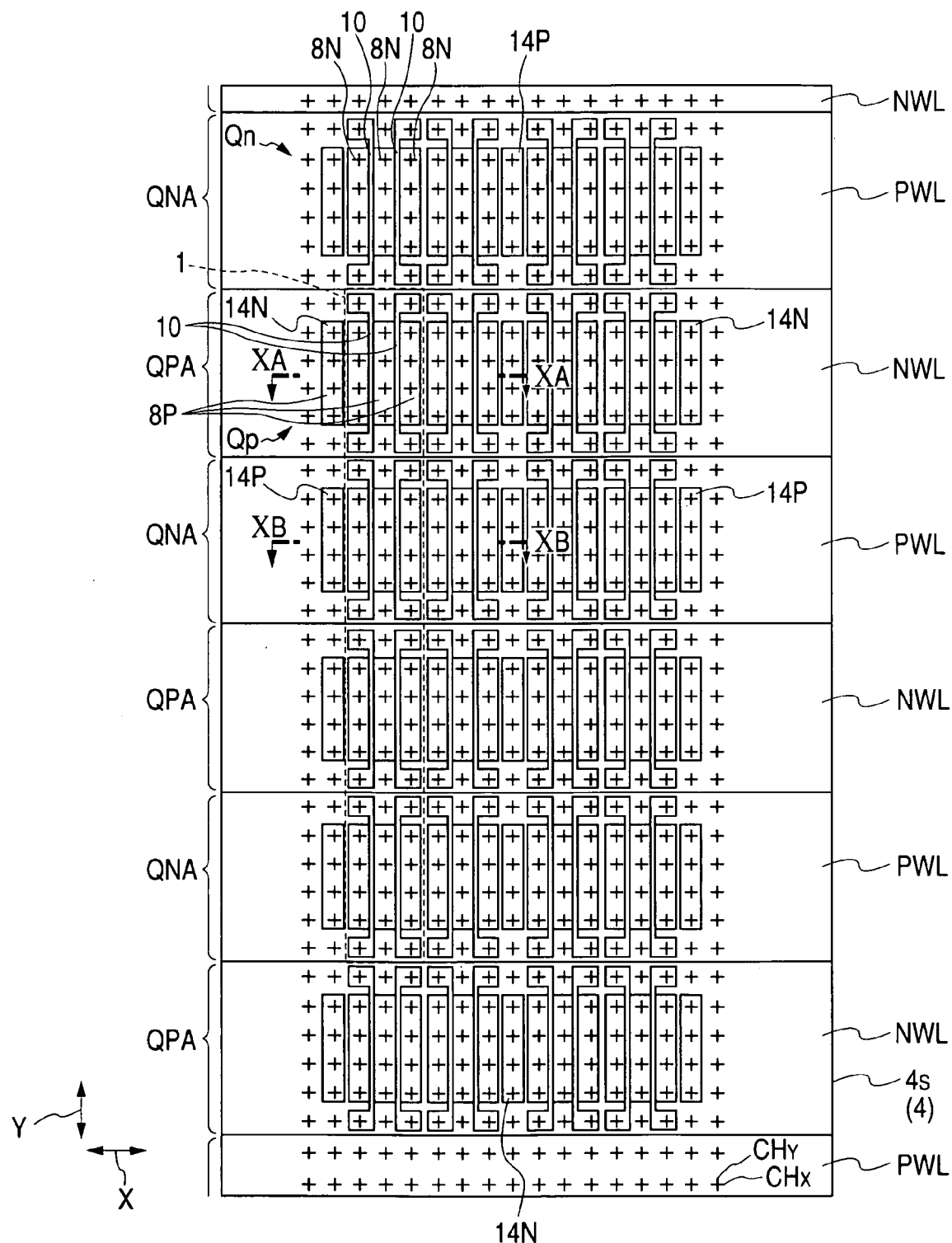
FIG. 15 is a plan view of the essential portion of a semiconductor substrate illustrating an element layout of the semiconductor device of FIG. 6.
Figure 16:
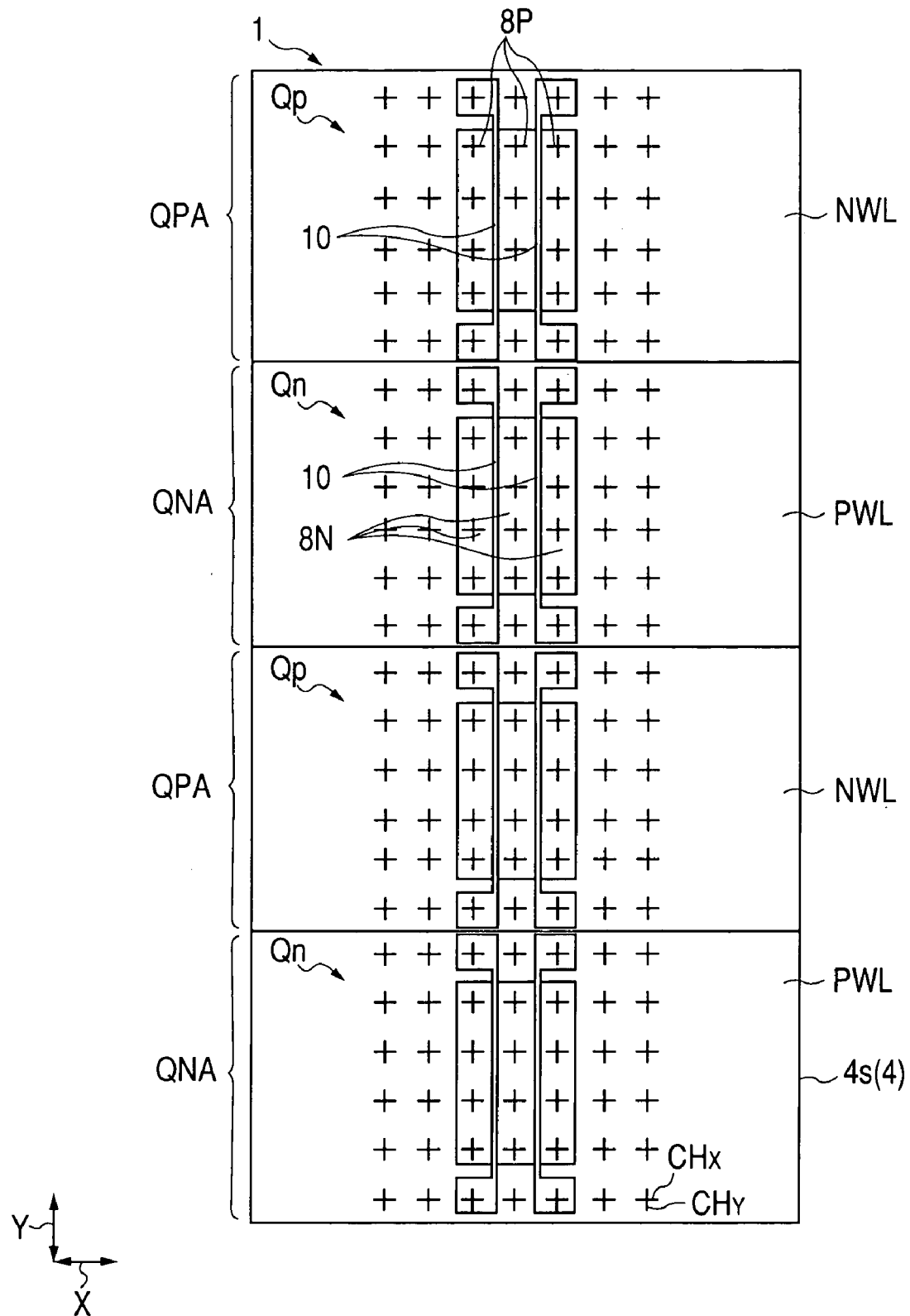
FIG. 16 is a plan view of a principal portion of a semiconductor substrate where the basic cells among the element layout of FIG. 15 are extracted.
Figure 17:
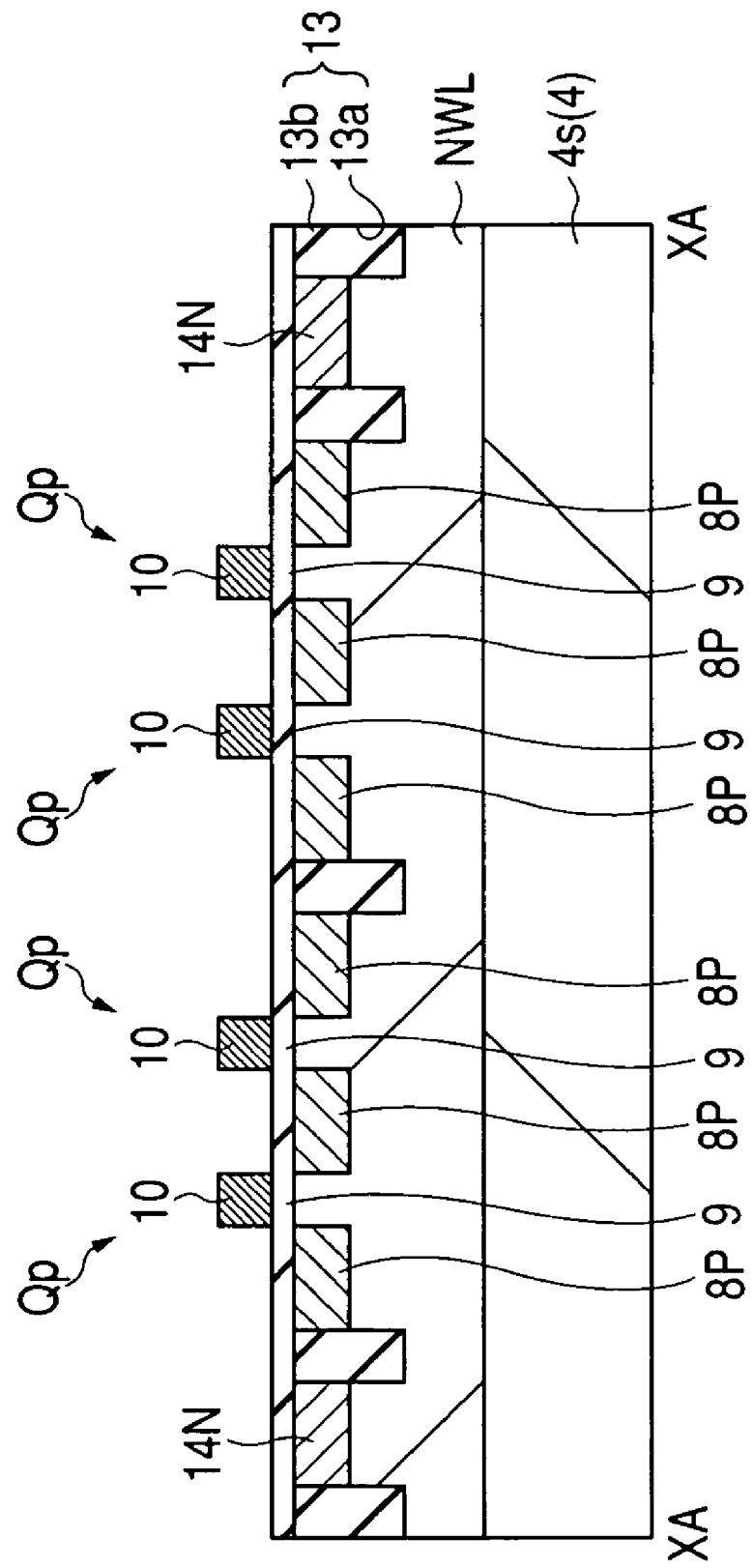
FIG. 17 is a cross-sectional view along the line XA—XA of FIG. 15.
Figure 18:
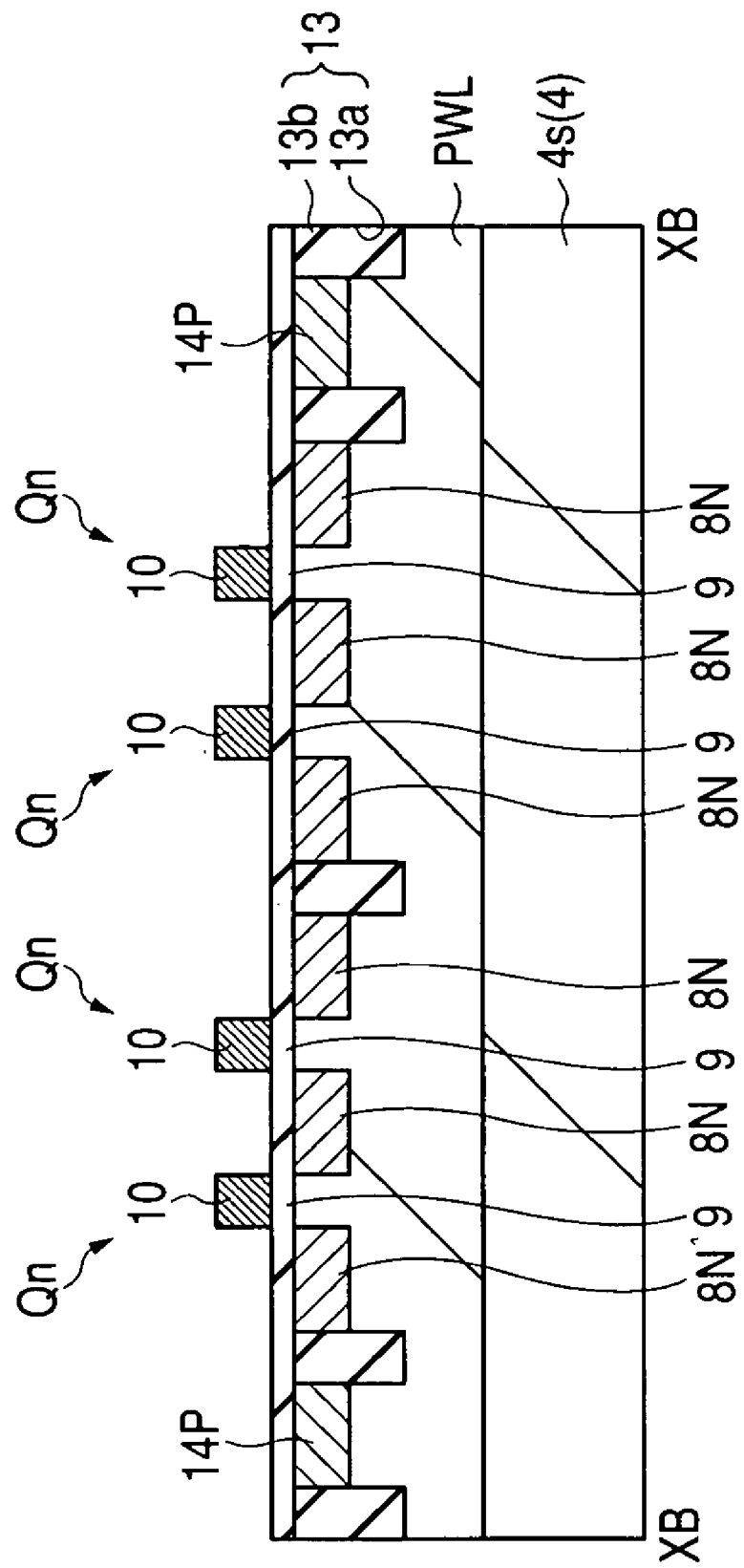
FIG. 18 is a cross-sectional view along the line XB—XB of FIG. 15.

FIG. 15 is a flat layout diagram of a principal portion of the CMIS gate array of this embodiment. FIG. 16 is a flat layout diagram where only the basic cell 1 is extracted from FIG. 15. Moreover, FIG. 17 is a cross-sectional view along the line XA—XA of FIG. 15 and FIG. 18 is a cross-sectional view along the line XB—XB of FIG. 15. The codes CHX and CHY in FIG. 15 and FIG. 16 are the wiring pitch line (namely, wiring channel (wiring route)) and these are not formed in the actual product. A cross mark is given to the intersecting points of the wiring pitch lines CHX, CHY and the contact hole is arranged at the position of this cross to connect between the wiring and semiconductor substrate and between different wiring layers. One pitch of the wiring pitch line is, for example, about 0.5 µm. As is illustrated in FIG. 16, the basic cell 1 is formed, in the Y direction (direction perpendicular to the X direction), of two nMIS forming regions QNA and two pMIS forming regions QPA, but the present invention is not limited thereto and it is also possible that the basic cell 1 is formed, in the Y direction, of one nMIS forming region QNA and one pMIS forming region QPA.

The semiconductor substrate 4S is formed, for example, of a p-type silicon single crystal and the n-well NWL (corresponding to 2VPP) and p-well PWL (corresponding to 2VNN extending in the X direction of FIG. 15 and FIG. 16 are alternately formed along the Y direction of FIG. 15 and FIG. 16 in the internal circuit region of the main surface of such semiconductor substrate 4S. The n-well NWL also includes, for example, phosphorus or arsenic and moreover the p-well PWL includes boron.

Moreover, on the semiconductor substrate 4S, a groove type isolation (trench isolation) 13 is formed. This groove type isolation 13 is formed, for example, by embedding an isolation insulation film 13b, for example, consisting of a silicon oxide film in the trench isolation 13a formed in the thickness direction of the semiconductor substrate 4S and specifies the active region L in the plan view. This isolation is not limited to only a groove type and it may also be formed with a field insulation film formed, for example, with the selective oxidation method (LOCOS: Local Oxidation of Silicon method).

Moreover, the $n^+$ type semiconductor region 14N is formed in the rate of one to every adjacent two basic cells 1 in the direction X of FIG. 15 to the n-well NWL of the semiconductor substrate 4S. This semiconductor region 14N is formed with inclusion, for example, of phosphorus or arsenic and is electrically connected with the n-well NWL. Moreover, the $p^+$ type semiconductor region 14P is formed in the rate of one to every two adjacent basic cells 1 in the direction X of FIG. 15 to the p-well PWL of the semiconductor substrate 4S. This semiconductor region 14P is formed with inclusion, for example, of boron and is electrically connected to the p-well PWL. The n+ semiconductor region 14N and p+ type semiconductor region 14P are electrically connected with one semiconductor region among a pair of semiconductor regions for source and drain of the MISFET forming the switch element.

On one basic cell 1, the pMIS forming region QPA, nMIS forming region QNA, pMIS forming region QPA and nMIS forming region QNA, for example, are sequentially arranged along the Y direction of FIG. 15 and FIG. 16.

The pMIS forming region QPA is arranged on the n-well NWL and each region thereof is formed, for example, of two pMISQp, Qp. Each pMISQp includes, as explained above, a pair of semiconductor regions 8P to form the source and drain, a gate insulation film 9 and a gate electrode 10. Here, two gate electrodes 10 are arranged in flat with the overlapping manner in the two active regions for pMISQp, Qp and the semiconductor region 8P between the adjacent gate electrodes 10, 10 is formed as the common region for the two pMISQp, Qp. In the semiconductor region 8P, boron, for example, is included. Here, it is also possible to provide a so-called LDD (Lightly Doped Drain) structure which suppresses the hot carrier by forming the semiconductor region 8P with the low impurity concentration region arranged in the channel side of MISFET and the high impurity concentration region formed at the position isolated as much as the low impurity concentration region from the channel electrically connected to such low impurity concentration region. Moreover, it is also possible to form the structure to suppress the punch-through between the source and drain by providing the semiconductor region in the conductivity type different from that of the semiconductor region 8P at the position in the predetermined depth from the main surface of the semiconductor substrate at the region near the end part of channel side of the semiconductor region 8P.

Moreover, the nMIS forming region QNA is arranged in the p-well PWL and two nMISQn, Qn, for example, are formed in the individual region thereof. As explained above, each nMISQn includes a pair of n-type semiconductor regions 8N to form the source and drain, a gate insulation film 9 and a gate electrode 10. In this case, as in the case of the pMIS forming region, two gate electrodes 10 are arranged in flat in the overlapping manner in the active region L for two nMISQn, Qn and the semiconductor region 8N between the adjacent gate electrodes 10, 10 is formed as the common region for the two nMISQn, Qn. The semiconductor region 8N includes, for example, phosphorus or arsenic. Even in the nMISQn, it is also possible to introduce the LDD structure and the structure to suppress punch-through.

The gate insulation film 9 is formed, for example, of a silicon oxide film. Moreover, this gate insulation film 9 may be formed of an acid-nitride film (SiON film). Therefore, generation of interfacial level in the gate insulation film 9 and moreover electron trap in the gate insulation film 9 can also be reduced simultaneously. Thereby, hot carrier resistance in the gate insulation film 9 can be improved. Accordingly, operation reliability of nMISQn and pMISQp can be improved.

The gate electrode 10 is formed, for example, on the n-type low resistance polysilicon film via a barrier metal film such as titanium nitride (TiN) and tungsten nitride (WN) or the like by sequentially forming a metal film such as tungsten (W) or the like from the lower layer (so-called polymetal structure). This barrier metal film is provided to prevent that a silicide is formed with the heat treatment in the manufacturing process at the contact part in the case of laminating in direct a tungsten film on the low resistance polysilicon film. Since a metal film is provided at a part of the gate electrode 10, resistance of the gate electrode can be reduced and operation rate of the semiconductor device can be improved. However, the gate electrode 10 is not limited to the polymetal structure and it may be formed, for example, of a discrete film of low resistance polysilicon and it can also be formed in the so-called polycide structure where a silicide film such as tungsten silicide or the like is deposited on the low resistance polysilicon film. At both end portions of the gate electrode 10, a wide portion is formed and the holes for connection with the upper layer wiring are arranged. Moreover, the gate electrodes 10 of pMISQp and nMISQn are formed in the same patterning process based on the photolithography and dry-etching techniques. Moreover, although not particularly restricted, the gate length of gate electrode 10 is, for example, about 0.14 μm and gate width is, for example, about 0.30 μm.

In this embodiment, as explained above, one basic cell 1 includes eight (8) MISFETs in total consisting of four pMISQps in the identical gate electrode size (gate width and gate length) and four nMISQns in the gate electrode size (gate width and gate length) identical to that of pMISQps. However, the structure of the basic cell 1 is not limited thereto and allows various changes and modifications and the number of MISFETs included in one basic cell 1 may be smaller or larger than eight. Moreover, it is also possible to arrange MISFETs in different gate electrode size within one basic cell 1. For example, it is possible to arrange within one basic cell 1 the MISFET having relatively small gate width and the MISFET having relatively large gate width. Thereby, when it is requested to connect the MISFET of small drive current (MISFET having relatively small gate width), for example, to a logic circuit formed of the MISFET of large drive current (MISFET having relatively large gate width), this connection may be realized with a short wiring route.

Figure 19:
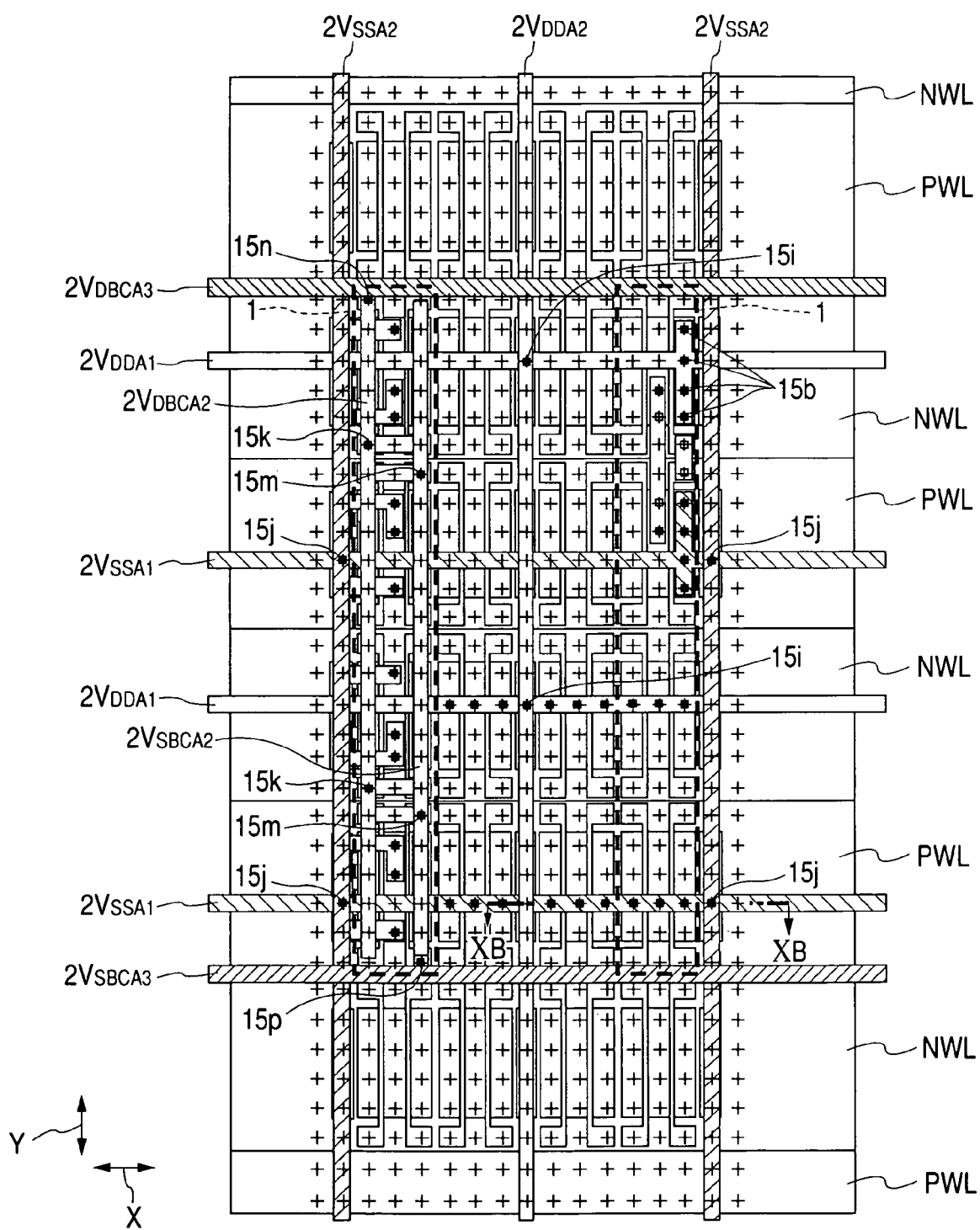
FIG. 19 is a plan view of a principal portion of a semiconductor substrate illustrating an example of the case where the wirings are laid on the semiconductor substrate of FIG. 15.
Figure 20:
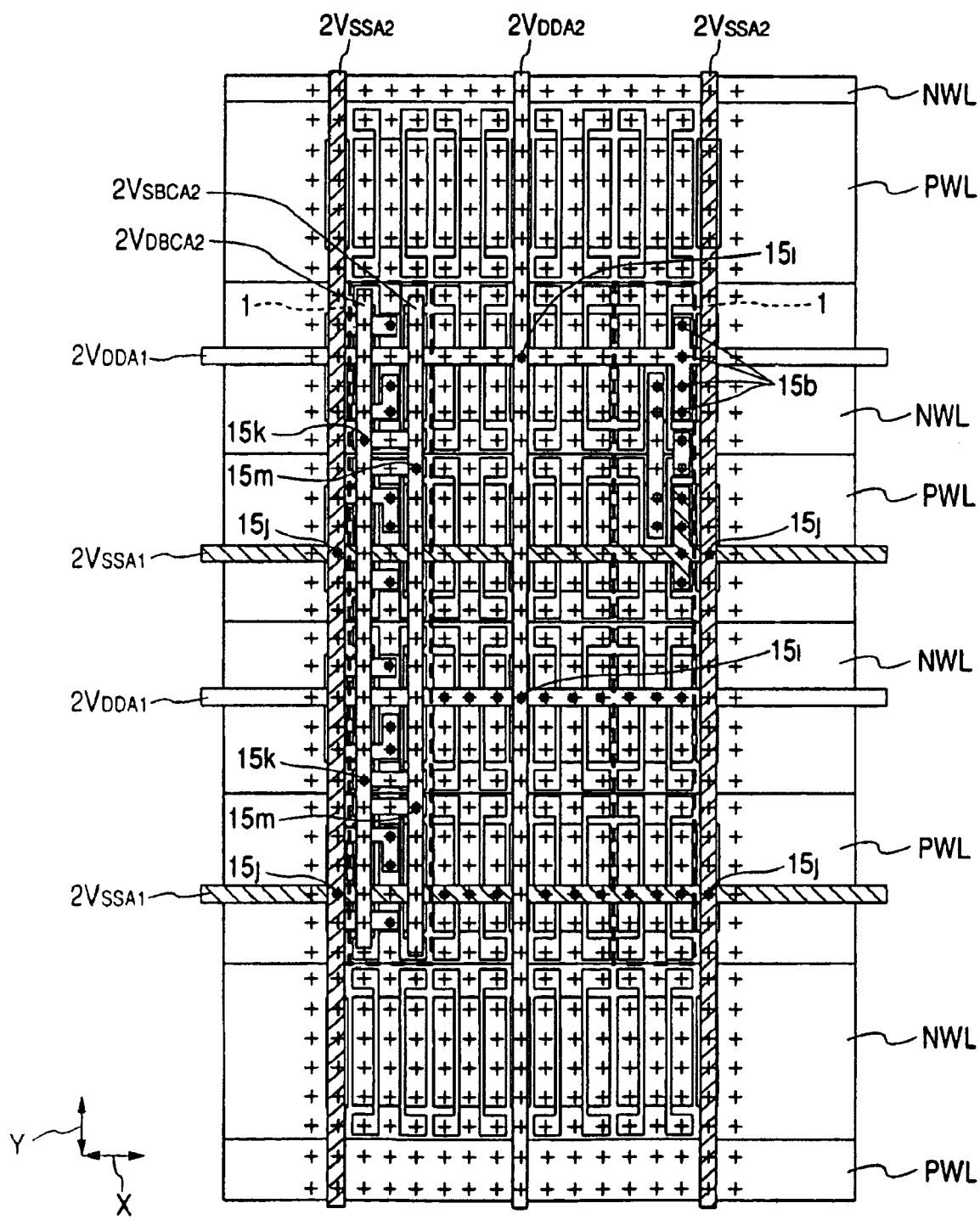
FIG. 20 is a plan view of a principal portion of a semiconductor substrate in the case where only the first layer and second layer wirings are arranged on the semiconductor substrate in the semiconductor device of FIG. 19.
Figure 21:
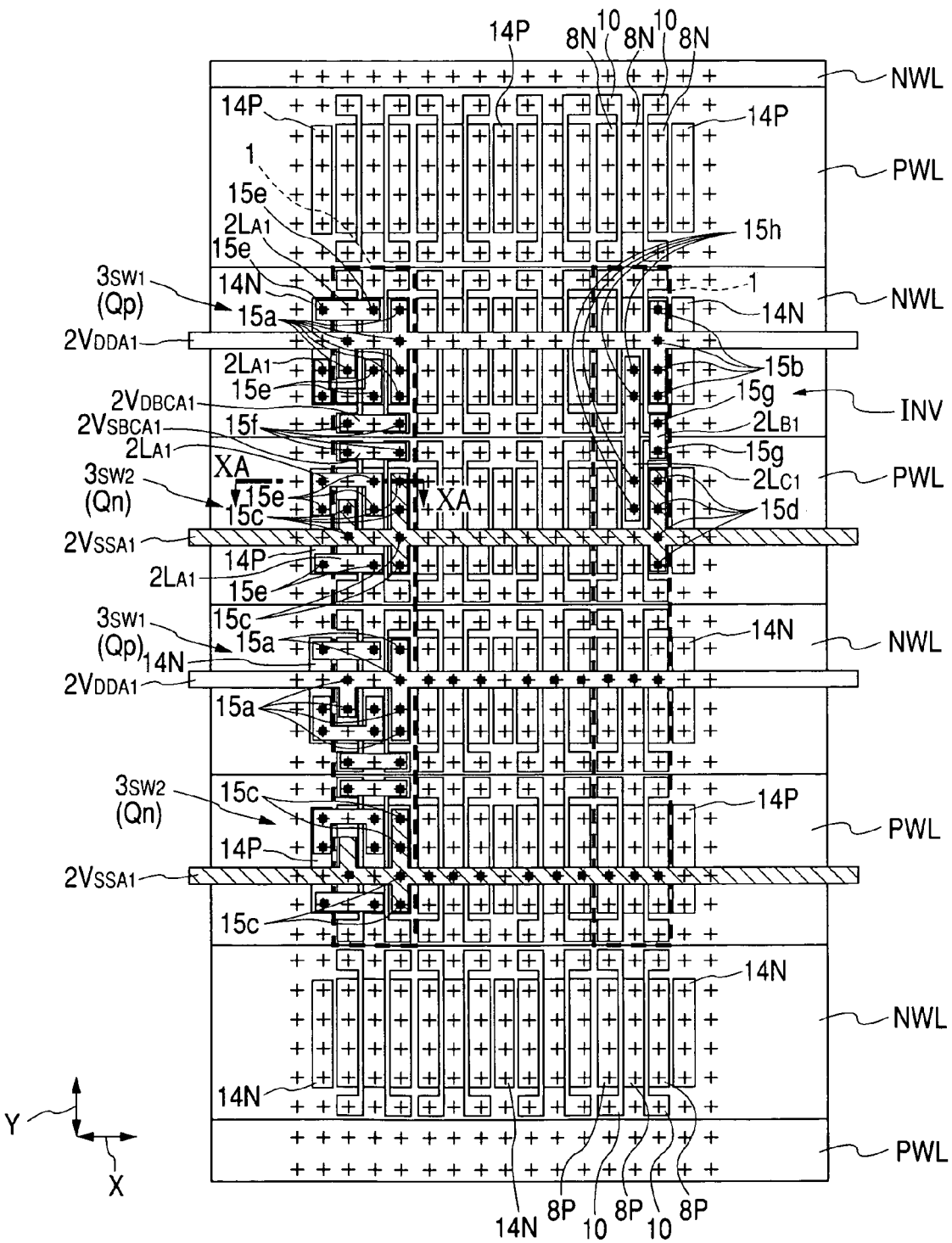
FIG. 21 is a plan view of a principal portion of a semiconductor substrate in the case where only the first layer and second layer wirings are arranged on the semiconductor substrate in the semiconductor device of FIG. 19.
Figure 22:
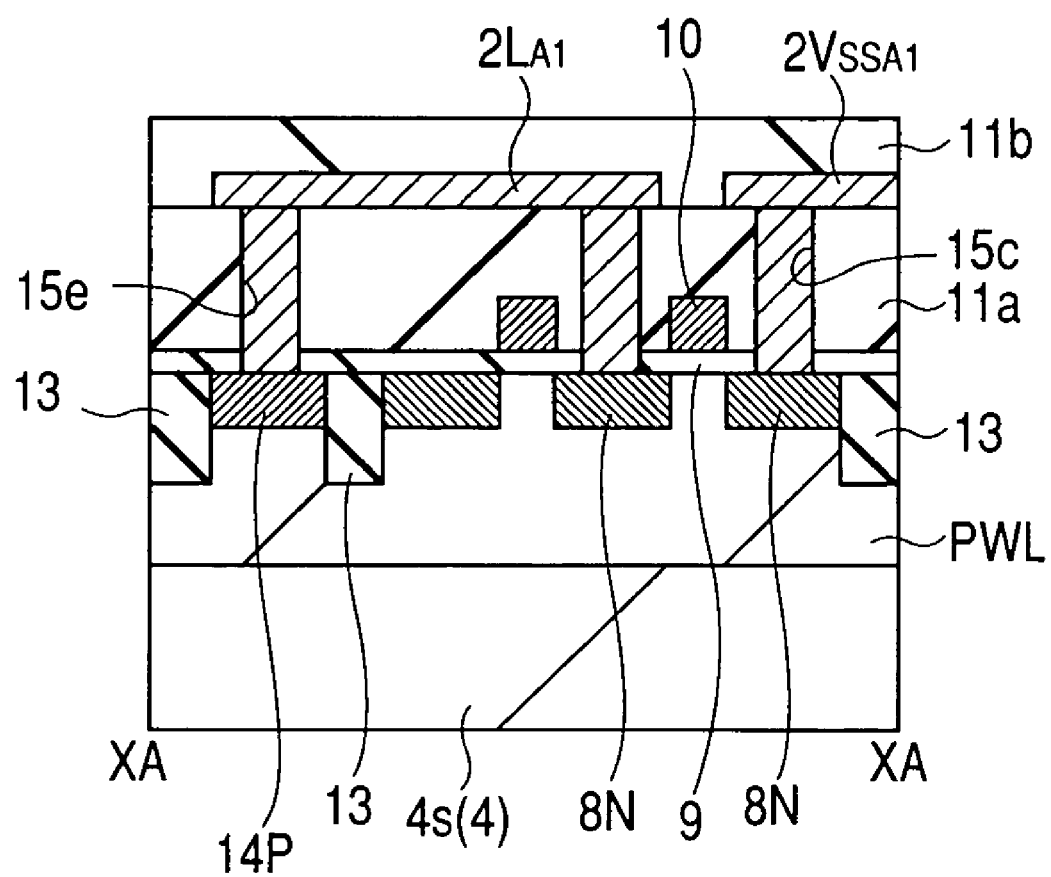
FIG. 22 is a cross-sectional view along the line XA—XA of FIG. 21.
Figure 24:
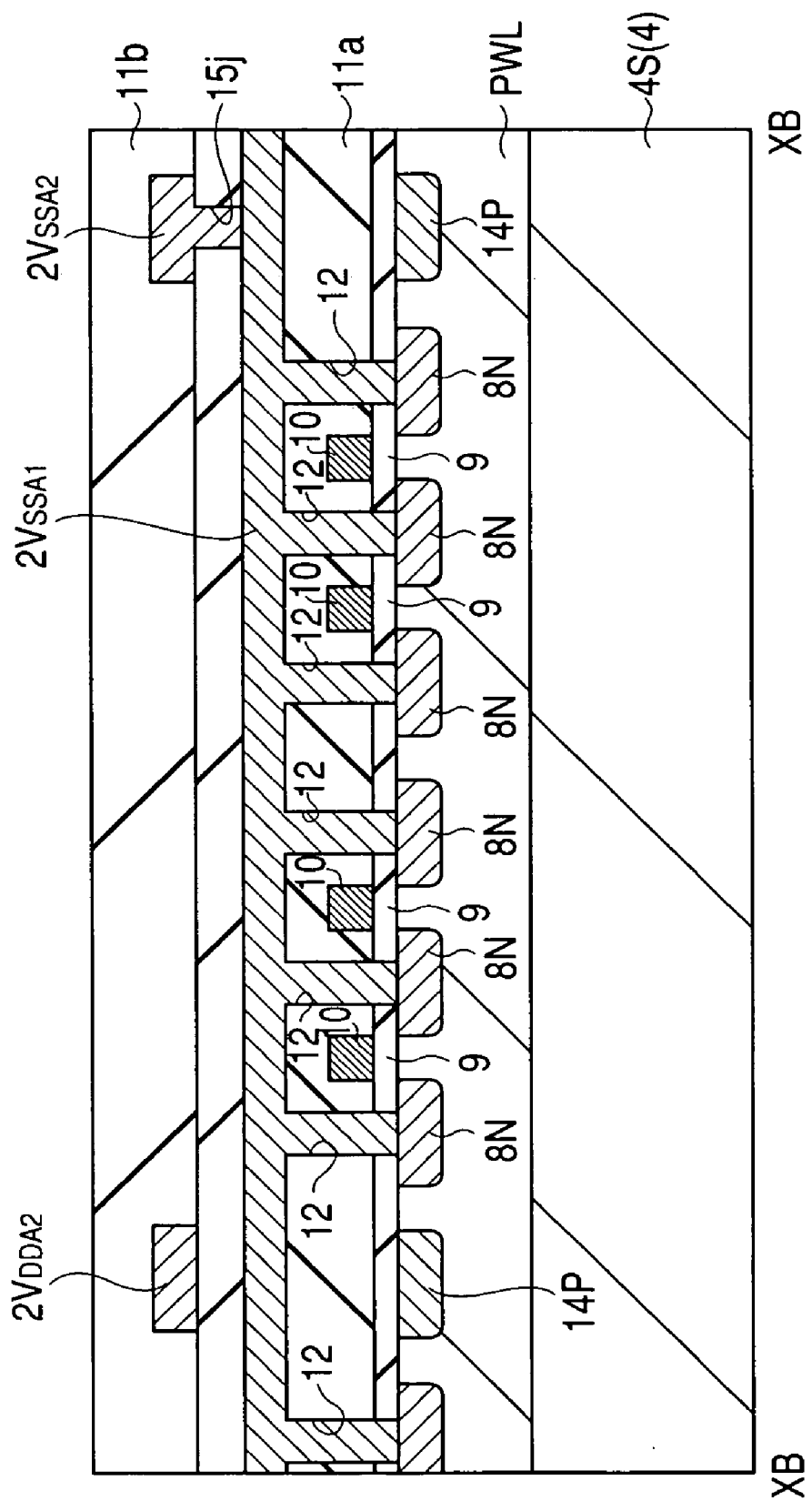
FIG. 24 is a cross-sectional view along the line XB—XB of FIG. 19.

Next, a structure including the wirings of the semiconductor device will be explained with reference to FIG. 19 to FIG. 24. FIG. 19 illustrates an example where the first to third wiring layers are arranged on the layout of FIG. 15. Moreover, FIG. 20 illustrates an example where the first wiring layer and second wiring layer are arranged. Moreover, FIG. 21 illustrates allocation of only the first wiring layer. Moreover, FIG. 22 is a cross-sectional view along the line XA—XA of FIG. 21. Moreover, FIG. 23 is a circuit diagram of the switch element illustrated in FIGS. 19 to 23. Moreover, FIG. 24 is a cross-sectional view along the line XB—XB of FIG. 19.

The wiring route of the first wiring layer and third wiring layer is basically extending in the X direction (in some cases, it is partly extending in the Y direction). Moreover, the wiring route of the second wiring layer is basically extending in the Y direction (in some cases, it is partly extending in the X direction). FIGS. 19 to 21 are plan views with partial hatching for making easier the observation of figures.

In the first wiring layer, the power supply wirings 2VDDA1, 2VSSA1 of the first layer and the wirings 2VppA1, 2VNNA1, 2LB1, 2LC1 of the first layer are formed. The power supply wiring 2VDDA1 of the first layer supplies the power supply voltage VDD and is extended like a belt along the X direction and is then arranged on a plurality of pMISQps arranged in the X direction. In the switch element 3SW1 forming region, the power supply wiring 2VDDA1 of the first layer is electrically connected to one semiconductor region 8P (both ends side in the width direction of the active region L) of pMISQp forming the switch element 3SW1 via the contact hole 15a. Moreover, in the region to form the inverter circuit INV representing the basic logic circuit, the power supply wiring 2VDDA1 of the first layer is electrically connected to one semiconductor region 8P of pMISQp forming the inverter circuit INV (single end side in the width direction of the active region L) via the contact hole 15b.

Moreover, the power supply wiring 2VSSA1 of the first layer supplies the power supply voltage VSS and is extended like a belt in the X direction and is arranged on a plurality of nMISQns arranged in the X direction. In the switch element 3SW2 forming region, the power supply wiring 2VSSA1 of the first layer is electrically connected to one semiconductor region 8N (both ends side in the width direction of the active region L) of nMISQn forming the switch element 3SW2 via the contact hole 15c. Moreover, in the region to form the inverter circuit INV representing a basic logic circuit, the power supply wiring 2VSSA1 of the first layer is electrically connected to one semiconductor region 8N of nMISQn forming the inverter circuit INV (single end side in the width direction of the active region L) via the contact hole 15d.

Moreover, the other semiconductor region 8P of pMISQp forming the switch element 3SW1 (at the center in the width direction of the active region L) and the n+ type semiconductor region 14N (nam ly, n-well NWL) adjacent to such pMISQp are electrically connected via the wiring 2VPPA1 of the first layer (corresponding to the wiring 2VPPA) and the contact hole 15e arranged at the area near both ends thereof. Thereby, the power supply wiring 2VDDA1 of the first layer and the n-well NWL are connected via two pMISQps for switch element 3SW1. Moreover, the gate electrodes 10, 10 of two pMISQp forming the switch element 3SW1 are electrically connected via the wiring 2VDBCA1 of the first layer and the contact hole 15f arranged at the area near both ends thereof.

In addition, the other semiconductor region 8N of nMISQn forming the switch element 3SW2 (at the center in the width direction of the active region L) and the p+ type semiconductor region 14P adjacent to such nMISQn (namely, the p-well PWL) are electrically connected via the wiring 2VNNA1 of the first layer (corresponding to the wiring 2VNNA) and the contact hole 15e arranged at the area near both ends thereof. Therefore, the power supply wiring 2VSSA1 of the first layer and p-well PWL are connected via two nMISQns for switch element 3SW2. Moreover, the gate electrodes 10, 10 of two nMISQns forming the switch element 3SW2 are electrically connected via the wiring 2VSBCA1 of the first layer and the contact hole 15f arranged at the area near both ends thereof. As illustrated in FIG. 23, the switch element 3SW1 includes two pMISQps, while the switch element 3SW2 includes two nMISQns.

Moreover, the gate electrodes 10, 10 of pMISQp and nMISQn forming the inverter circuit INV are electrically connected via the wiring 2LB1 of the first layer and the contact hole 15g arranged at the area near both ends thereof. This wiring 2LB1 forms the input of the inverter circuit INV. Moreover, the semiconductor regions 8P, 8N of pMISQp and nMISQn forming the inverter circuit INV (at the center of the active region L) are electrically connected via the wiring 2LC1 of the first layer and the contact hole 15h arranged at the area near both ends thereof. This wiring 2LC1 of the first layer forms the output of the inverter circuit INV. As explained above, the wirings 2VPPA1, 2VNNA1, 2LB1, 2LC1 wired in the basic cell 1 are formed mainly of the first wiring layer.

In the second wiring layer, the power supply wirings 2VDDA2, 2VSSA2 of the second layer and the wirings 2VDBCA2, 2VSBCA2 of the second layer are formed. The wirings of the second wiring layer are arranged to extend in the Y direction. The power supply wirings 2VDDA2 of the second layer is extended like a belt along the Y direction crossing the first wiring layer and is arranged on a plurality of the $p^+$ type semiconductor region 14P and $n^+$ type semiconductor region 14N which are alternately arranged along the Y direction. At the intersecting point of the power supply wiring 2VDDA2 of the second layer and the power supply wiring 2VDDA1 of the first layer, a contact hole 15i is arranged and the power supply wiring 2VDDA1 of the first layer and the power supply wiring 2VDDA2 of the second layer are electrically connected via this contact hole.

Moreover, the power supply wiring 2VSSA2 of the second layer is extended like a belt along the Y direction crossing the first wiring layer and is arranged on a plurality of $p^+$ type semiconductor region 14P and $n^+$ type semiconductor region 14N arranged alternately along the Y direction. At the intersecting point of the power supply wiring 2VSSA2 of the second layer and the power supply wiring 2VSSA1 of the first layer, a contact hole 15j is arranged and the power supply wiring 2VSSA1 of the first layer and the power supply wiring 2VSSA2 of the second layer are electrically connected via this contact hole 15j.

Moreover, the wirings 2VDBCA2, 2VSBCA2 of the second layer are used to transmit the control signal to turn ON and OFF the switch elements 3SW1, 3SW2 and are extended like a belt along the Y direction. The wiring 2VDBCA2 is electrically connected to the wiring 2VDBCA1 of the first layer via the contact hole 15k and thereby electrically connected to the gate electrodes 10, 10 of two pMISQps for switch element 3SW1. On the other hand, the wiring 2VSBCA2 is electrically connected to the wiring 2VSBCA1 of the first layer via the contact hole 15m and thereby electrically connected to the gate electrodes 10, 10 of two nMISQns for switch element 3SW2.

Moreover, the wirings 2VDBCA3 and 2VSBCA3 are formed on the third wiring layer. Here, the wirings of the third wiring layer are arranged to extend along the X direction. These wirings 2VDBCA3, 2VSBCA3 are used to transmit the control signal to turn ON and OFF the switch elements 3SW1, 3SW2 and are extended like belts in parallel to the power supply wirings 2VDDA1, 2VSSA1 of the second layer along the X direction. The wiring 2VDBCA3 is electrically connected to the wiring 2VDBCA2 of the second layer via the contact hole 15n and thereby electrically connected to the gate electrodes 10, 10 of two pMISQps for switch element 3SW1. On the other hand, the wiring 2VSBCA3 is electrically connected to the wiring 2VSBCA2 of the second layer via the contact hole 15p and thereby connected to the gate electrodes 10, 10 of two nMISQns for switch element 3SW2. Here, the wirings 2VDBCA3, 2VSBCA3 are arranged on the third wiring layer but on the second wiring layer because of the reason that the switch elements 3SW1, 3SW2 are realized with an ordinary basic cell 1 and arranged without relation to the logic to be mounted. Namely, it is not practical to form the wirings 2VDBCA and 2VSBCA with the second wiring layer, because if the wirings 2VDBCA, 2VSBCA are formed with the second wiring layer, the wirings 2VDBCA, 2VSBCA forming a pair with two lines must be arranged in the X direction of the narrow basic cell 1 and thereby the wiring channels of the second wiring layer are almost destroyed. Although not illustrated in the figure, the basic cells a are coupled using the wiring of the first wiring layer extending in the X direction, wiring of the second wiring layer extending in the Y direction and wiring of the third wiring layer extending in the X direction.

Moreover, also explained in this embodiment is an example where the power supply wiring 2VSS1 of the first layer is connected via the contact hole 12 to the semiconductor region 8N of unused basic cell 1 or unused nMISQn. Thereby, noise of well can be controlled only with allocation of a fine contact hole 12. Namely, even in the case of semiconductor device having the switch elements 3SW1, 3SW2, generation of noise can be controlled in the well formed in the semiconductor substrate 4S without resulting in complicated structure and increase of chip size. Therefore, the threshold voltage of MISFET can be stabilized, latch-up can be controlled and operation reliability of semiconductor device can also be improved. The codes 11a, 11b in FIG. 22 and FIG. 24 indicate the interlayer insulation films which are formed, for example, of silicon oxide film. Moreover, the power supply wirings 2VDDA1, 2VDDA2, 2VSSA1, 2VSSA2 and wirings 2VDBCA1, 2VDBCA2, 2VDBCA3, wirings 2VSBCA1, 2VSBCA2, wirings 2VPPA1, 2VNNA1, 2LB1, 2LC1 or the like are composed of a laminated film which is formed, for example, of aluminum, aluminum alloy including silicon and copper, copper, copper alloy or a laminated film formed by laminating a conductive film of these metals and titanium nitride or titanium film.

Figure 25:
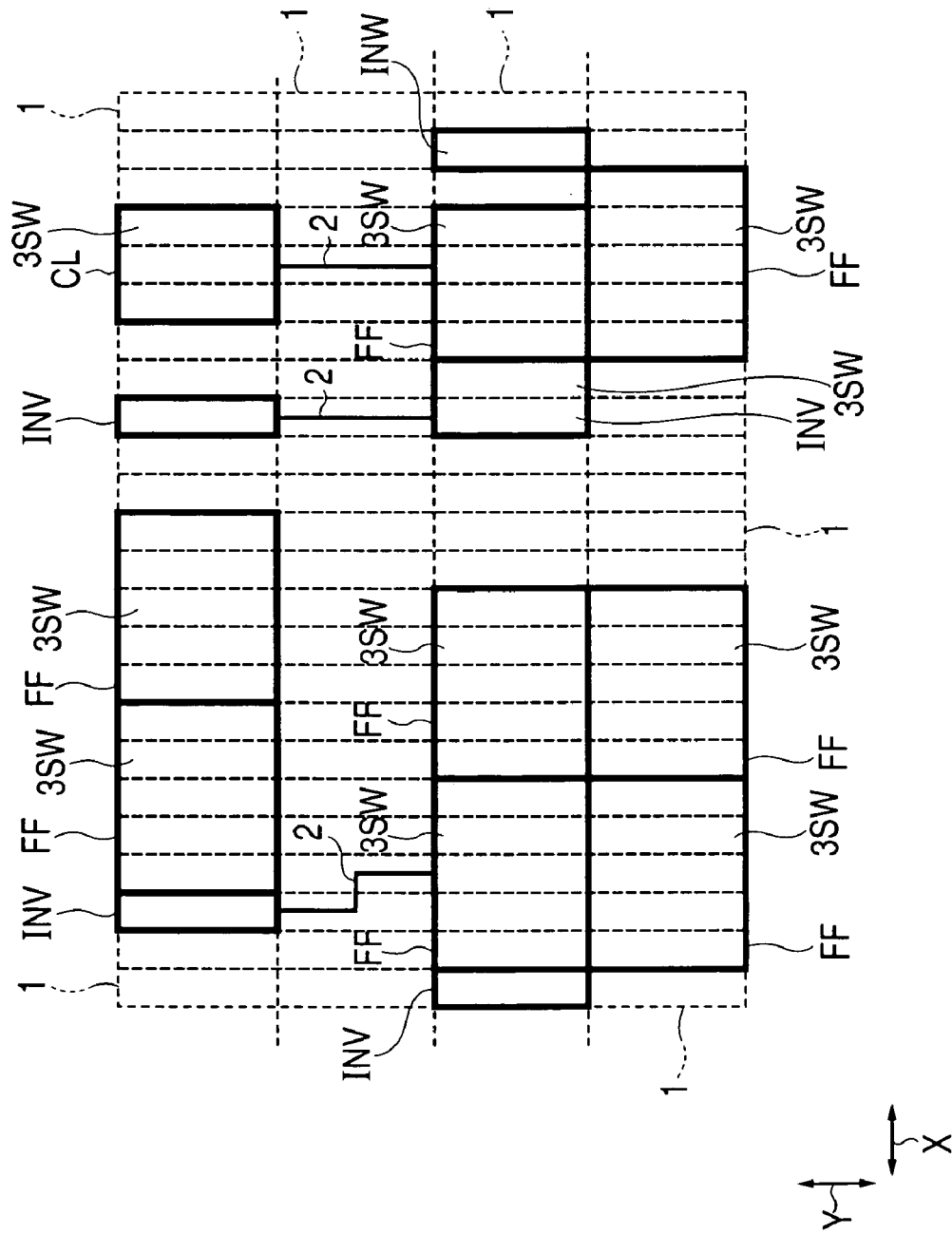
FIG. 25 is an explanatory diagram schematically illustrating logic circuits arranged on the semiconductor substrate of FIG. 6.
Figure 26:
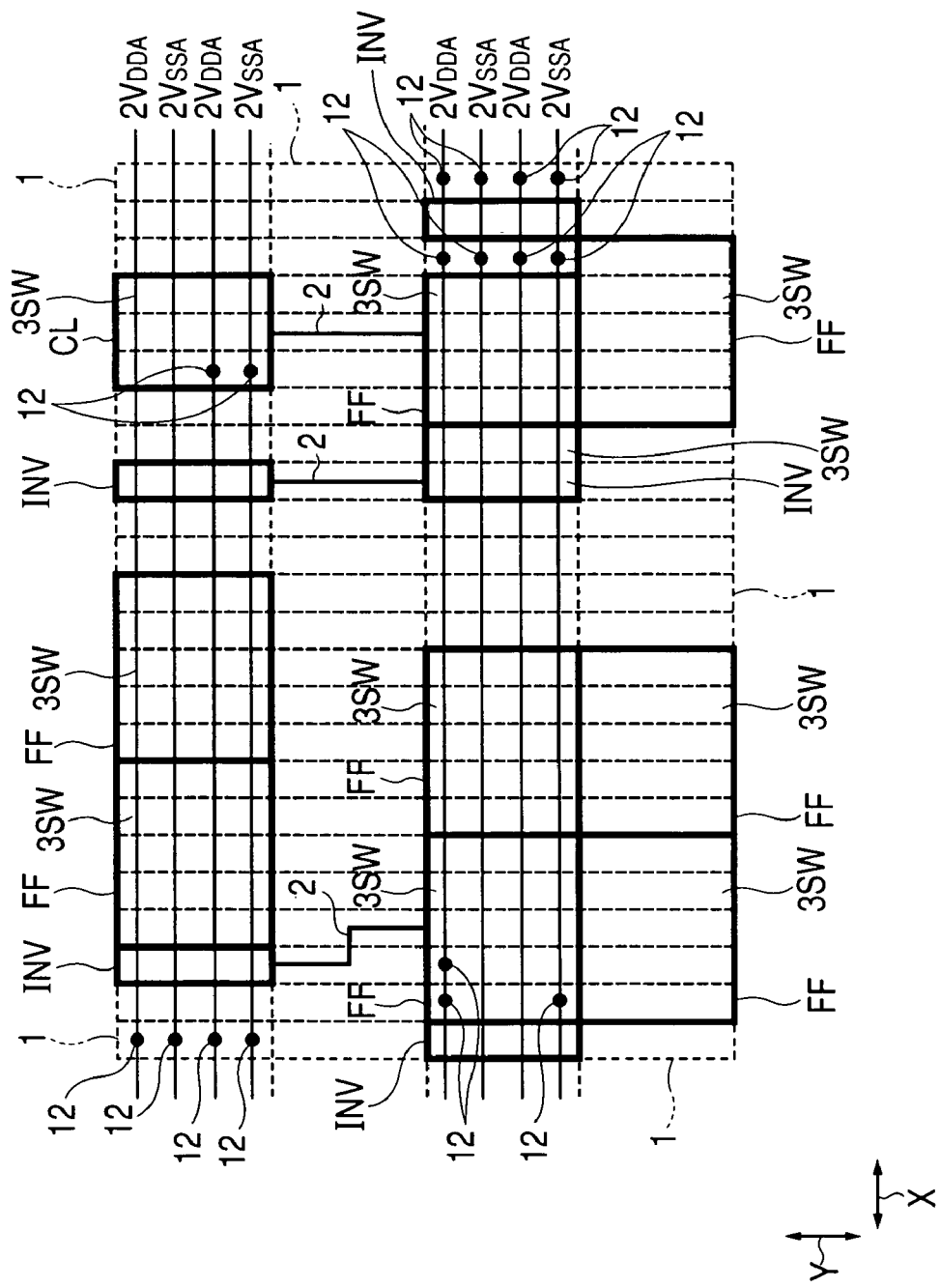
FIG. 26 is an explanatory diagram schematically illustrating the wirings on the semiconductor substrate of FIG. 25 and technical concept of the present invention.

Next, FIG. 25 illustrates an example of layout of the logic circuit formed by arrangement of the basic cell 1 as explained above. Moreover, FIG. 26 schematically illustrates a structure of stabilizing the potential of the well in the layout of FIG. 25. A broken line in FIG. 25 and FIG. 26 indicates the basic cell 1 and a thick frame indicates a logic circuit.

In FIG. 25 and FIG. 26, an inverter circuit INV is arranged as the basic logic circuit and moreover the condition is schematically illustrated in which the clock circuit CL and flip-flop circuit FF are arranged as the comparatively larger logic circuits. These logic circuits are formed of the pMISQp and nMISQn in the basic cell 1. The region other than the logic circuit region indicated with the thick frame is used as the region where the logics formed with the logic designers are arranged or as the region to arrange the wiring 2. The basic cell 1 of the region to arrange the wiring 2 is the unused basic cell.

The switch element 3SW indicates the simplified switch elements 3SW1, 3SW2. Here, the switch element 3SW is arranged in the clock circuit CL and flip-flop circuit FF. Namely, a certain logic circuit comprises a switch element 3SW, considering that a high level noise is generated momentarily and easily in the clock circuit CL and flip-flop circuit FF because operating speed is high, drive capability is also high and a plurality of elements or wirings are driven simultaneously. Namely, generation of noise can effectively be controlled by previously allocating the switch element 3SW within the logic circuit which easily generates noise. Moreover, in this case, in the designing stage, a logic circuit already comprising the switch element 3SW is prepared and it is then developed as the layout. Thereby, the designers can provide a layout of logic circuit without considering existence of the switch element 3SW itself. Moreover, the total or partial allocation of the switch element 3SW can be completed by providing the layout of the logic circuit comprising the switch element 3SW. Therefore, the switch element 3SW can be effectively and easily arranged and moreover it is possible to easily provide the total layout of the circuit.

Moreover, FIG. 26 illustrates that the contact hole 12 for stabilizing the potential of well is arranged in the semiconductor region for the source and drain of MISFET within the unused basic cell 1 or in the semiconductor region for source and drain of unused MISFET in the clock circuit CL and flip-flop circuit FF and such semiconductor region and power supply wirings 2VDDA, 2VSSA are electrically connected. Namely, the contact hole 12 for stabilizing potential of well can also be arranged in the unused MISFET within the logic circuit.

Figure 27:
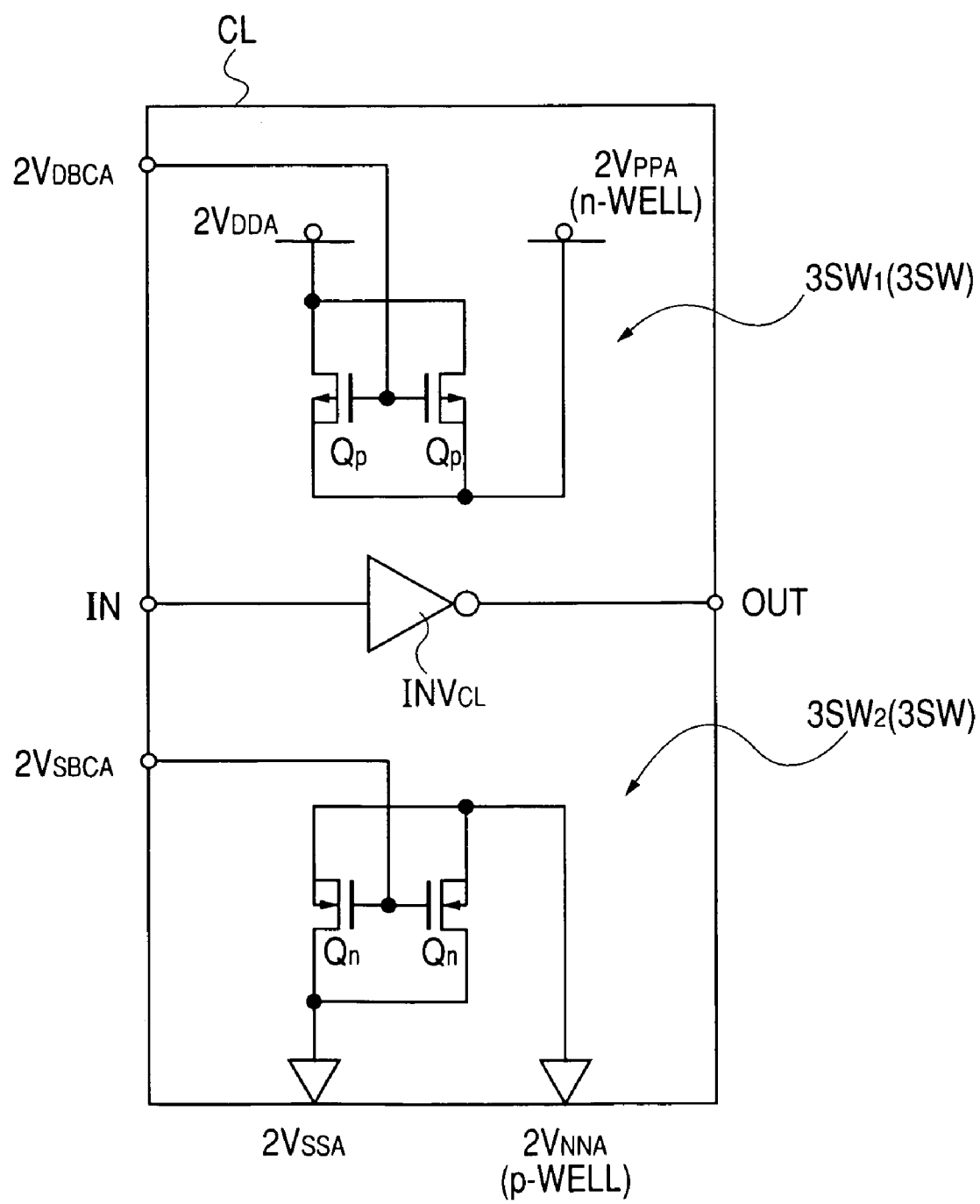
FIG. 27 is a circuit diagram of a clock circuit illustrated in FIG. 25 and FIG. 26.
Figure 28:
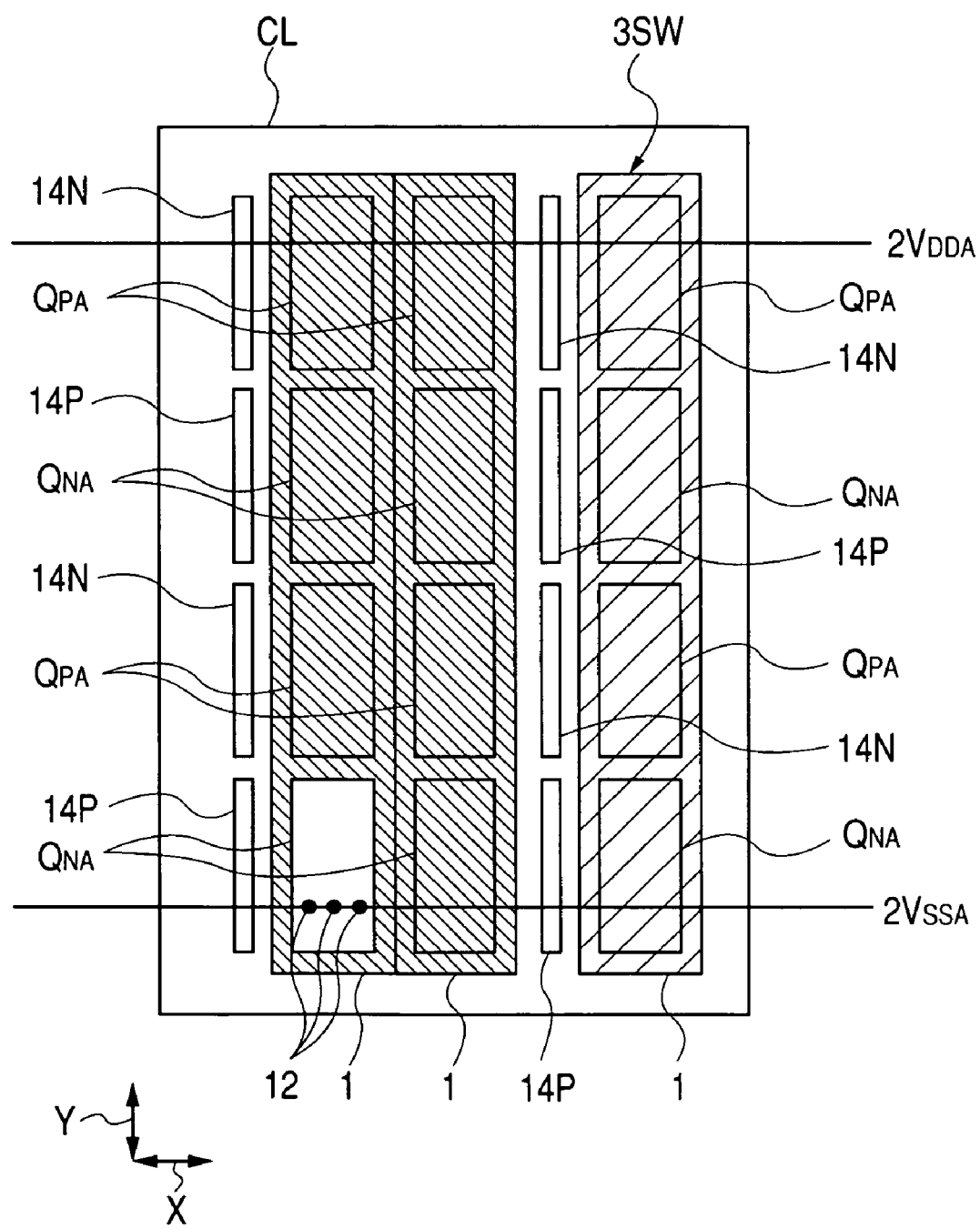
FIG. 28 is an explanatory diagram schematically illustrating an element layout of the clock circuit of FIG. 27.

FIG. 27 is a schematic diagram of the clock circuit CL. As illustrated in FIG. 27, the clock circuit CL comprises the switch elements 3SW1, 3SW2. The code INVCL designates the inverter circuit for clock. FIG. 28 schematically illustrates the layout of the clock circuit CL of FIG. 27. The hatching suggests that the circuit is used. The clock circuit CL is formed in the region hatched with the right-descending lines and the switch element 3SW is formed in the region hatched with the left-descending lines. Namely, the switch element 3SW is comprised within the clock circuit CL as explained above. Moreover, the nMIS forming region QNA in the clock circuit CL (lowest part of the basic cell 1 of FIG. 28) is unused and the semiconductor region for source and drain of such nMIS and the power supply wiring 2VSSA are electrically connected via the contact hole 12 as explained above.

Figure 29:
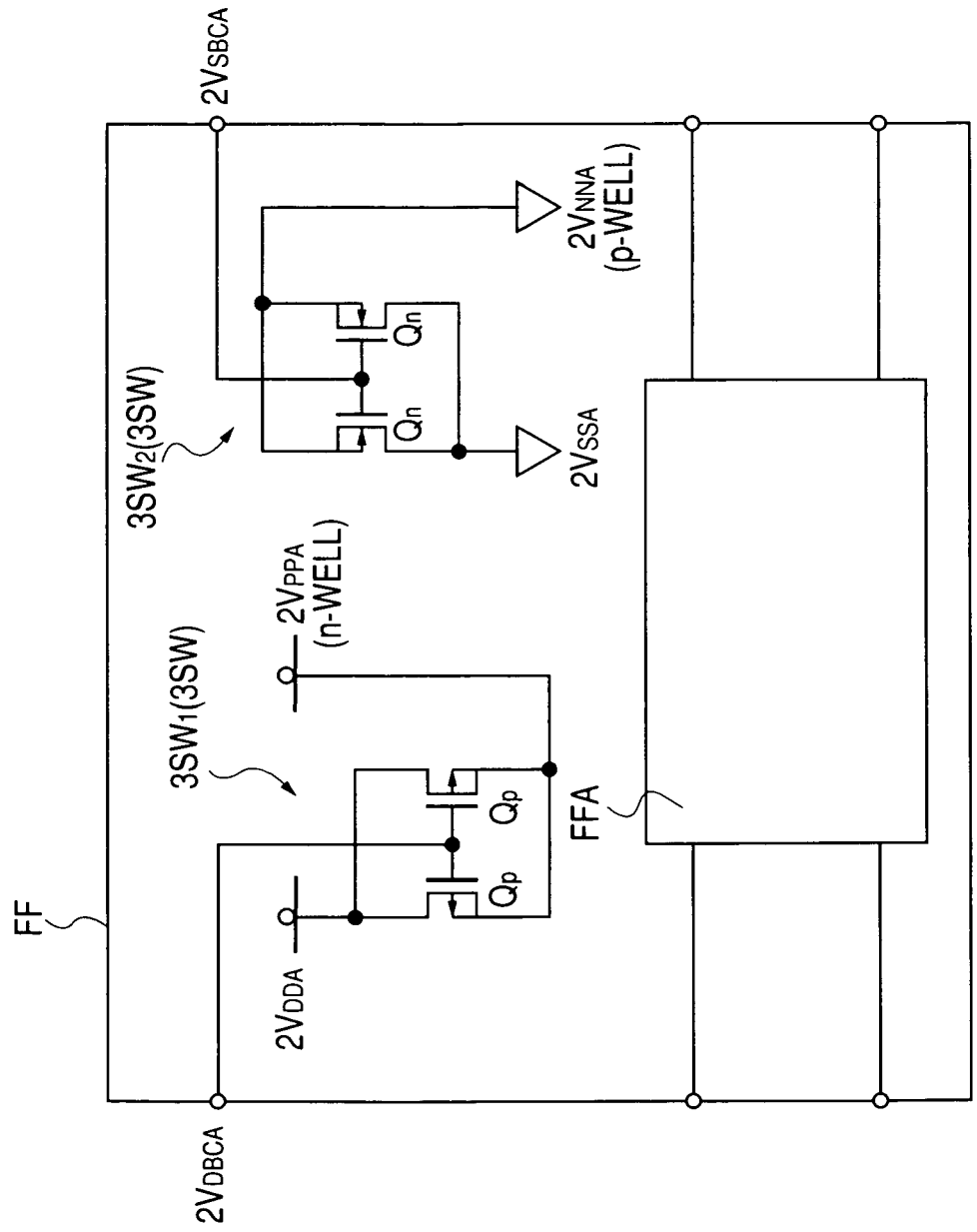
FIG. 29 is a circuit diagram of a flip-flop circuit illustrated in FIG. 25 and FIG. 26.
Figure 30:
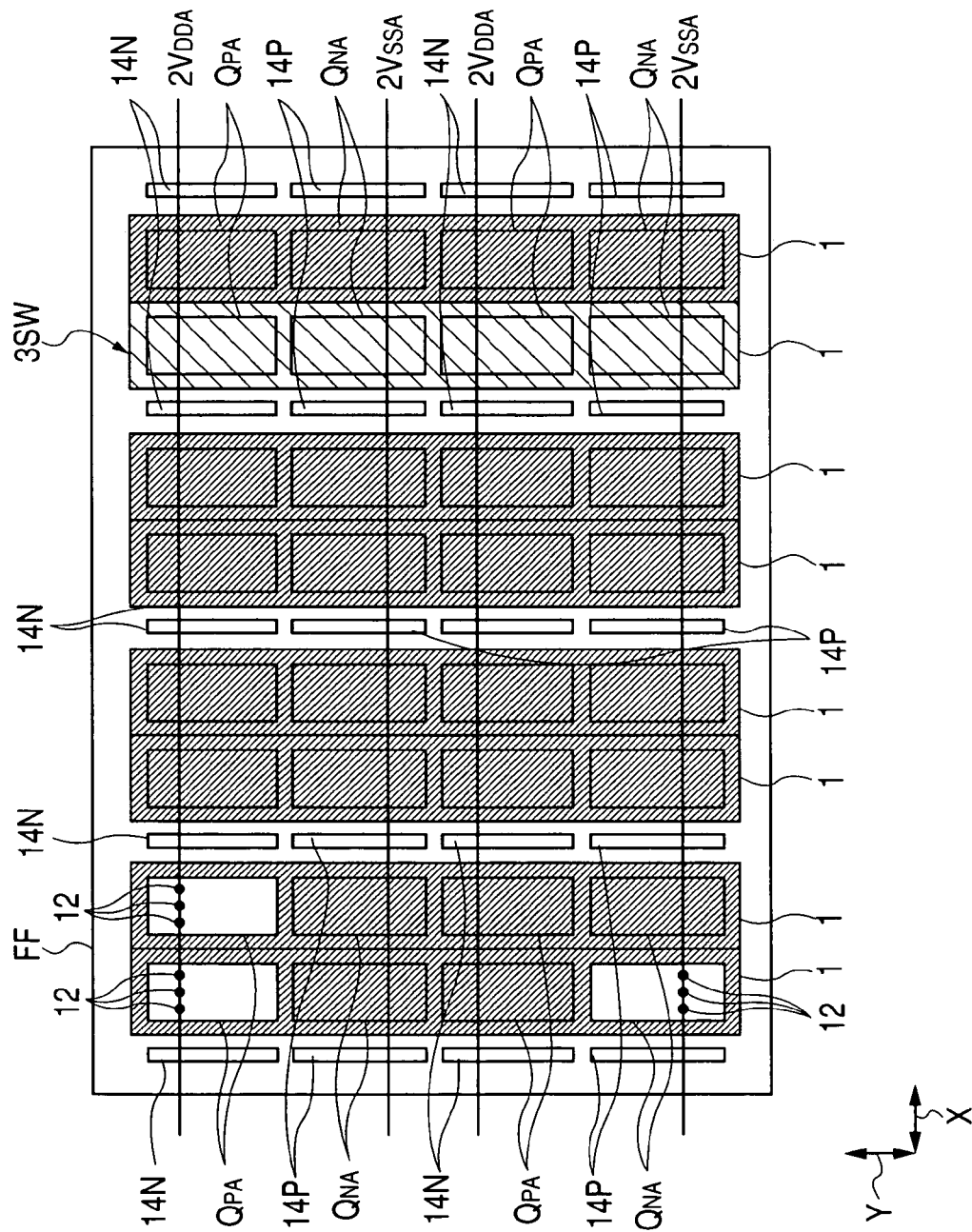
FIG. 30 is an explanatory diagram schematically illustrating an element layout of the semiconductor device of FIG. 29.

Moreover, FIG. 29 is a schematic diagram of a flip-flop circuit FF. As illustrated in FIG. 29, the switch elements 3SW1, 3SW2 are also built in the flip-flop circuit FF. The code FF designates the main portion of the flip-flop circuit. FIG. 30 schematically illustrates a layout of the flip-flop circuit FF of FIG. 29. The hatched regions are used in the same manner as FIG. 28. Namely, the flip-flop circuit is formed in the region hatched with the right-descending lines, while the switch element 3SW is formed in the region hatched with the left-descending lines. Namely, the switch element 3SW is built in the flip-flop circuit FF. Moreover, the pMIS forming region QPA in the flip-flop circuit FF (highest portion of the basic cell 1 of FIG. 30) and the nMIS forming region QNA (lowest portion of basic cell 1 of FIG. 28) are unused, the semiconductor regions for source and drain of such pMIS and the power supply wiring 2VDDA are electrically connected as explained above via the contact hole 12 and the semiconductor regions for source and drain of nMIS and the power supply wiring 2VSSA are also electrically connected as explained above via the contact hole 12.

A method of manufacturing a structure having the switch element is, for example, as follows.

Figure 38:
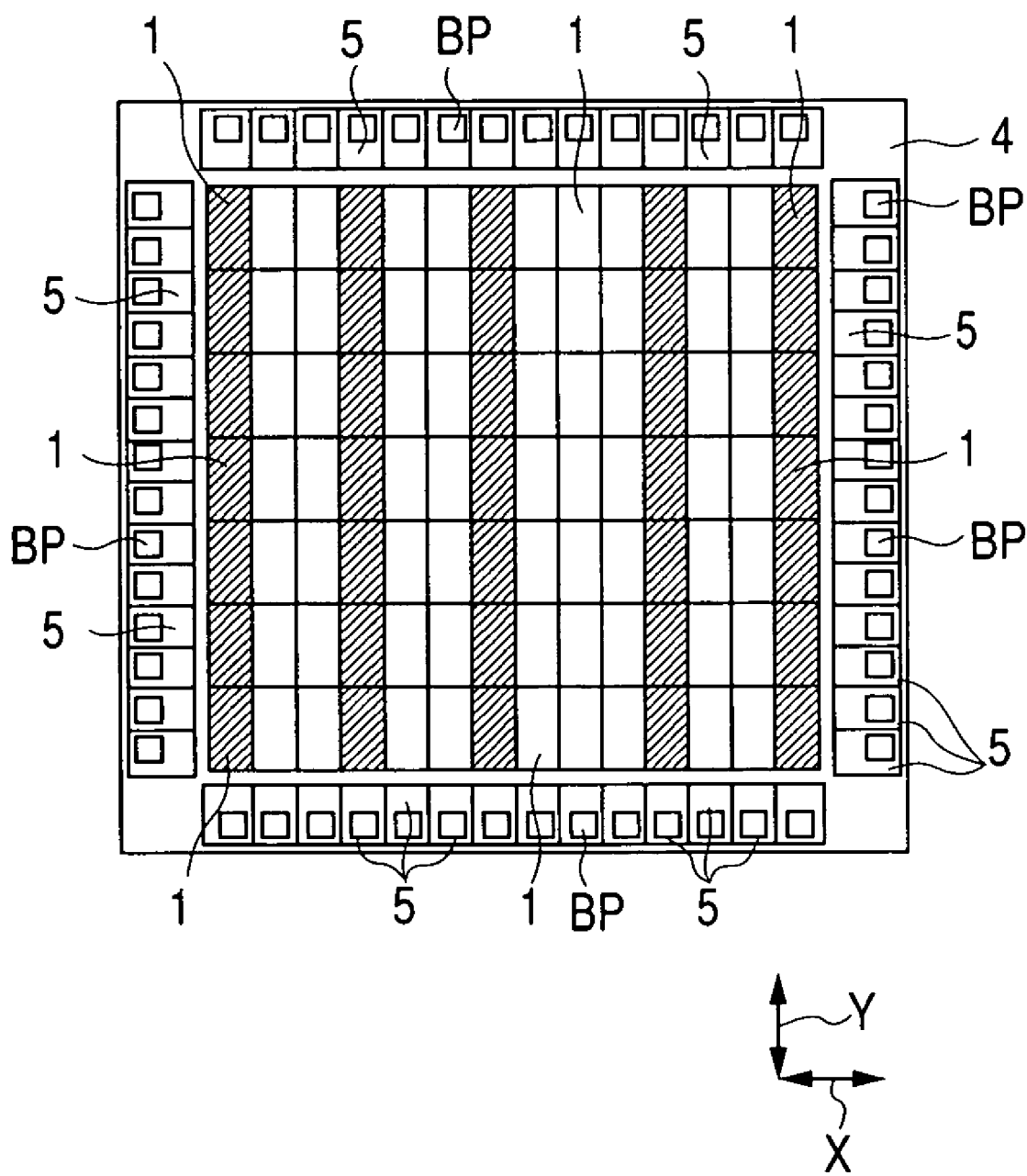
FIG. 38 is a plan view of the semiconductor device as an embodiment of the present invention.

First, a plurality of basic cells 1 are arranged to the entire part of the semiconductor substrate. Subsequently, the switch elements 3SW1, 3SW2 are arranged with MISFET in the basic cell 1 (for example, arranged as indicated with the oblique lines of FIG. 38). Thereafter, the logic circuits requested with the designer are automatically arranged and wired using a plurality of basic cells 1. Moreover, as the other method, the logic circuit comprising the switch elements 3SW1, 3SW2 (for example, clock circuit and flip-flop circuit) is automatically arranged and wired. Moreover, it is also possible to combine these methods.

Moreover, for the structure having a contact hole 12 for stabilizing potential of the well, it is enough to arrange the contact hole 12 at the crossing region of the semiconductor region for source and drain of unused MISFET and the power supply wiring after allocation of wiring of the logic circuit as explained above. In this case, allocation method of contact hole 12 and the number of such holes may be changed for the completed semiconductor device by automatically determining whether noise is generated or not in the well. Moreover, as the other method, when unused MISFET exists in the predetermined logic circuit (here, corresponding to the clock circuit and flip-flop circuit), the contact hole 12 is arranged to the semiconductor regions for source and drain of such MISFET from the beginning and the logic circuit having such contact hole 12 is arranged and wired with the ordinary automatic allocation and wiring method on the layout surface. Thereby the total logic circuit can be structured. In addition, these methods can also combined. Therefore, the contact hole 12 can be provided without lowering the degree of freedom of wiring.

Next, structure of the periphery of the semiconductor device of this embodiment will then be explained.

Figure 31:
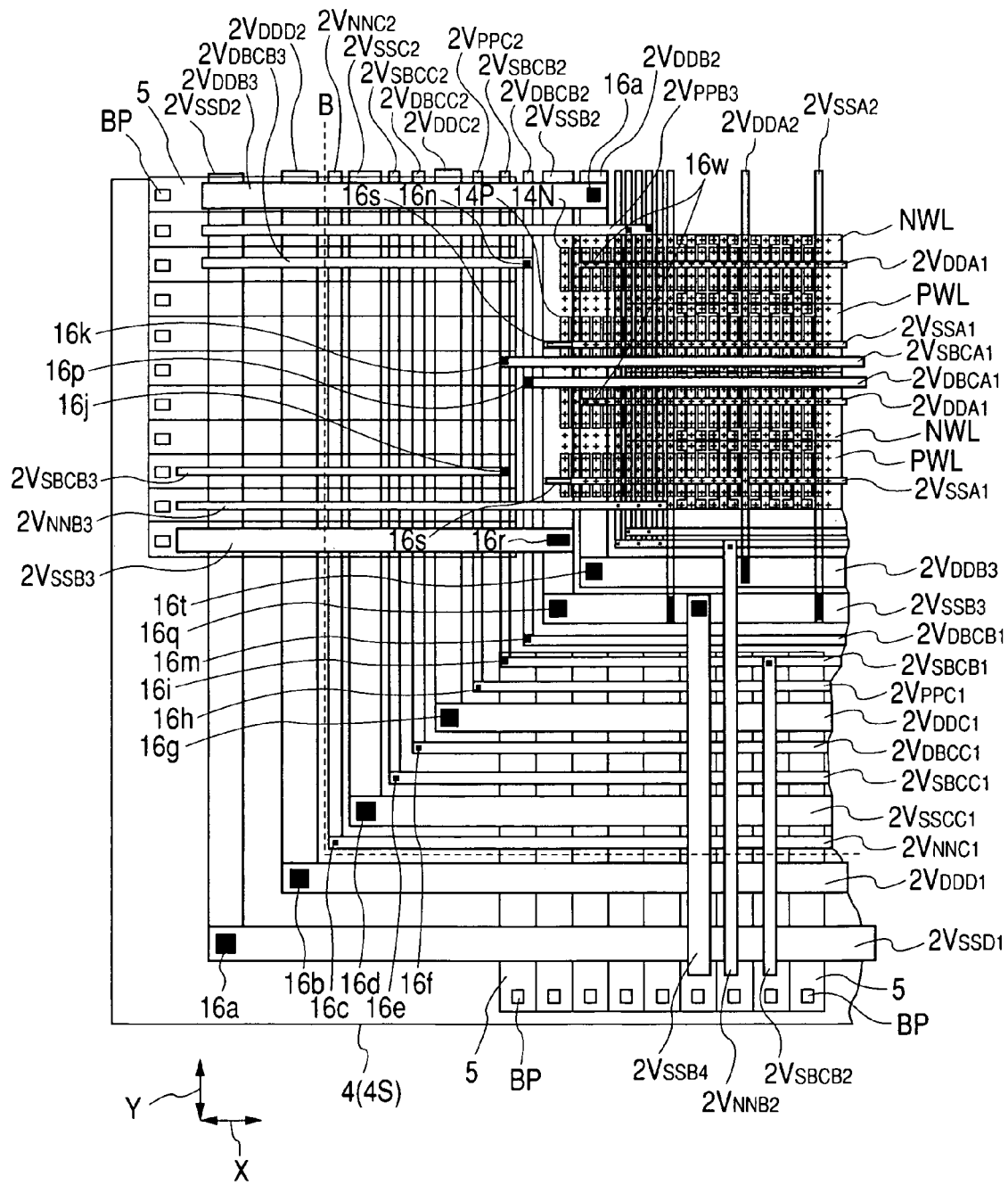
FIG. 31 is a plan view of a principal portion illustrating allocation of the wiring system and circuit system in the periphery of external circumference of the semiconductor device of FIG. 6.
Figure 32:
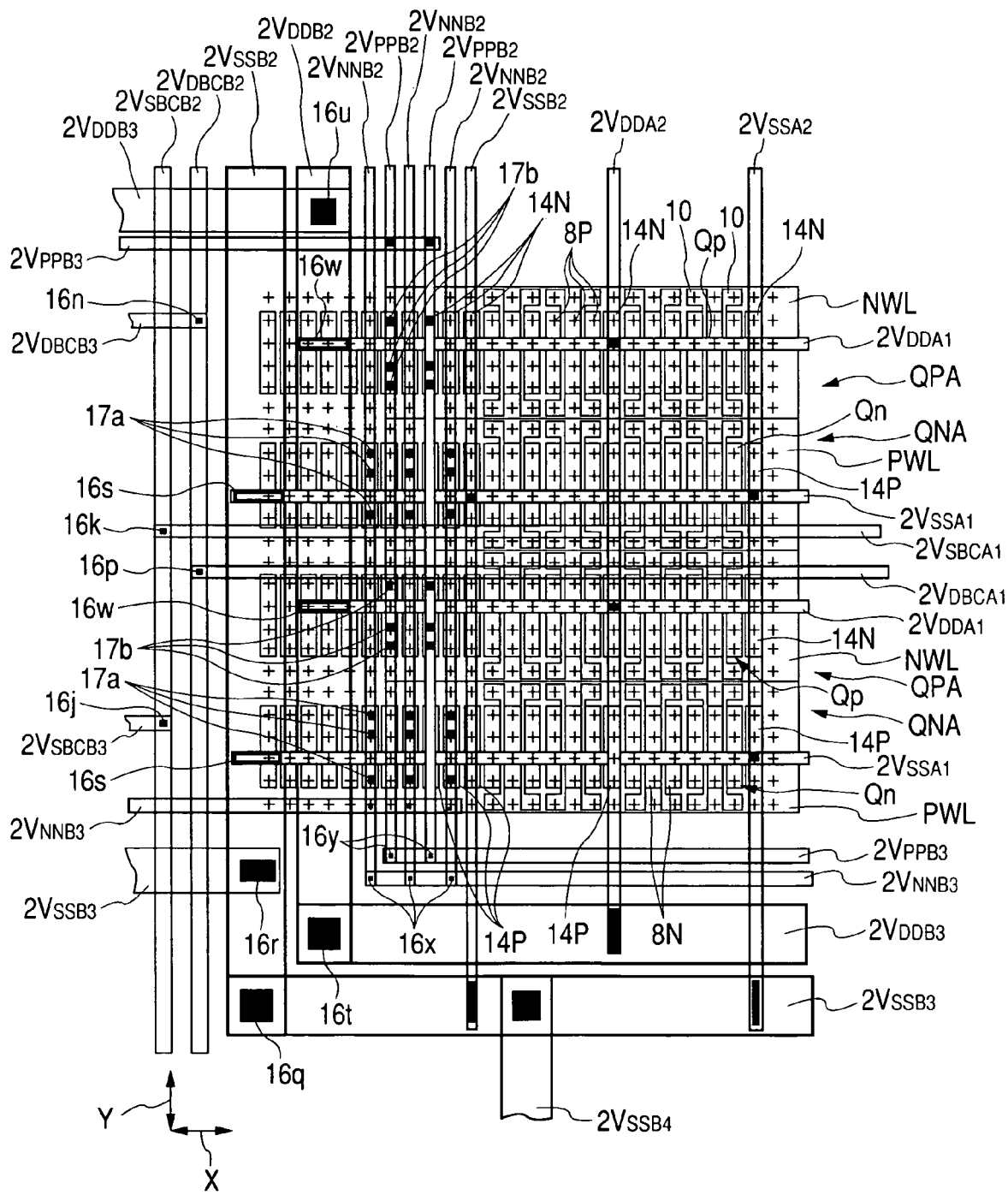
FIG. 32 is an enlarged plan view of a principal portion of FIG. 31.

FIG. 31 is a plan view of the external corner portions of semiconductor chip 1 and the peripheral portion thereof. FIG. 32 is an enlarged plan view of the essential portion of FIG. 31.

As illustrated in FIG. 31, the power supply wirings 2VSSD2, 2VSSD1 and power supply wirings 2VDDD2, 2VDDD1 are sequentially arranged along the direction toward the center from the external circumference on the external region in the I/O cell 5 at the outer most circumference of the semiconductor chip 4.

The power supply wirings of 2VSSD2, 2VSSD1 are arranged in the external region of the I/O cell 5 to supply the power supply voltage VSS to the circuit structured with MISFET having relatively large gate width. The power supply wiring 2VSSD2 is extended like a belt in the Y direction of FIG. 31 formed in the second wiring layer. Moreover, the power supply wiring 2VSSD1 is formed in the first wiring layer and is extended like a belt in the X direction of FIG. 31. These power supply wirings 2VSSD2, 2VSSD1 are electrically connected via the contact hole 16a arranged at the crossing portion thereof.

On the other hand, the power supply wirings 2VDDD2, 2VDDD1 are used to supply the power supply voltage VDD to the circuit formed of MISFET having relatively large gate width arranged in the external region of the I/O cell 5. The power supply wiring 2VDDD2 is formed in the second wiring layer to extend like a belt in the Y direction of FIG. 31, while the power supply wiring 2VDDD1 is formed in the first wiring layer to extend like a belt in the X direction of FIG. 31. These power supply wirings 2VDDD2, 2VDDD1 are electrically connected through the contact hole 16b arranged at the intersecting point thereof. As explained above, the power supply wiring to supply the power supply voltages VDD, VSS to the circuit formed of the I/O cell 5 is formed along the external circumference of the main surface of the semiconductor chip 4.

Moreover, as illustrated in FIG. 31, the wirings 2VNNC2, 2VNNC1, power supply wirings 2VSSC2, 2VSSC1, wirings, 2VSBCC2, 2VSBCC1, wirings 2VDBC2, 2VDBCC1, power supply wirings 2VDDC2, 2VDDC1 and wirings 2VPPC2, 2VPPC1 are sequentially arranged along the direction toward the center from the external circumference of the semiconductor chip 4 on the internal region in the I/O cell 5 at the internal side than the power supply wirings 2VDDD2, 2VDDD1.

The wirings 2VNNC2, 2VNNC are provided to supply the voltage VNN to the well (p-well) in the internal region of the I/O cell 5 during the inspection period or waiting period and correspond to the wiring 2VNNC of FIG. 7. The wiring 2VNNC2 formed in the second wiring layer is electrically connected to the wiring 2VNNC1 formed in the first wiring layer via the contact hole 16c.

The power supply wirings 2VSSC2, 2VSSC1 are provided to supply the power supply voltage VSS to the circuit formed in the internal region of I/O cell 5 and correspond to the power supply wiring 2VSSC of FIG. 7. The wiring 2VSSC2 formed in the second wiring layer is electrically connected to the wiring 2VSSC1 formed in the first wiring layer via the contact hole 16d.

The wirings 2VSBCC2, 2VSBCC1 is provided to supply the voltage VSBC to the gate electrode of the nMISQnA (refer to FIG. 7) forming the switch element formed in the internal region of the I/O cell 5 and correspond to the wiring 2VSBCC of FIG. 7. The wiring 2VSBCC2 formed in the second wiring layer is electrically connected to the wiring 2VSBCC1 formed in the first wiring layer via the contact hole 16e.

The wirings 2VDBCC2, 2VDBCC1 are provided to supply the voltage VDBC to the gate electrode of the pMISQpA (refer to FIG. 7) forming the switch element formed in the internal region of the I/O cell 5 and corresponds to the wiring 2VDBCC of FIG. 7. The wiring 2VDBBC2 formed in the second wiring layer is electrically connected to the wiring 2VDBCC1 formed in the first wiring layer via the contact hole 16f.

The wirings 2VDDC2, 2VDDC1 are provided to supply the power supply voltage VDD to the circuit formed in the internal region of the I/O cell 5 and corresponds to the power supply wiring 2VDCC of FIG. 7. The wiring 2VDDC2 formed in the second wiring layer is electrically connected to the wiring 2VDDC1 formed in the first wiring layer via the contact hole 16g.

The wirings 2VPPC2, 2VPPC1 are provided to supply the voltage VPP to the well (n-well) in the internal region of the I/O cell 5 during the testing period or waiting period and corresponds to the wiring 2VPPC of FIG. 7. The wiring 2VPPC2 formed in the second wiring layer is electrically connected to the wiring 2VPPC1 formed in the first wiring layer via the contact hole 16h.

Moreover, as illustrated in FIG. 31 and FIG. 32, the wirings 2VSBCB2, 2VSBCB1, wirings 2VDBCB2, 2VDBCB1, power supply wirings 2VSSB2, 2BSSB3 and power supply wirings 2VDDB2, 2VDDB3 are sequentially arranged along the direction toward the center from the external circumference of the semiconductor chip 4 at the internal side of the wirings 2VPPC2, 2VPPC1.

The wirings 2VSBCB2, 2VSBCB1 are provided to supply the voltage VSBC to the gate electrode of the nMISQn forming the switch element arranged in the internal circuit region and correspond to the wiring 2VSBCB of FIG. 7. The wiring 2VSBCB2 formed in the second wiring layer is electrically connected to the wiring 2VSBCB1 formed in the first wiring layer via the contact hole 16i. Moreover, the wiring 2VSBCB2 of the second wiring layer is electrically connected to the wiring 2VSBCB3 formed in the third wiring layer via the contact hole 16j and thereby is electrically connected to the bonding pad BP. In addition, the wiring 2VSBCB2 of the second wiring layer is electrically connected to the wiring 2VSBCA1 formed in the first wiring layer via the contact hole 16k and thereby electrically connected to the gate electrode of the nMISQn forming the switch element in the internal circuit region.

The wirings 2VDBCB2 is provided to supply the voltage VDBC to the gate electrode of the pMISQp forming the switch element arranged in the internal circuit region and corresponds to the wiring 2VDBCB of FIG. 7. The wiring 2VDBCC2 formed in the second wiring layer is electrically connected to the wiring 2VDBCC1 formed in the first wiring layer via the contact hole 16m. Moreover, the wiring 2VDBCB2 of the second wiring layer is electrically connected to the wiring 2VDBCB3 formed in the third wiring layer via the contact hole 16n and thereby electrically connected to the bonding pad BP. Moreover, the wiring 2VDBCB2 of the second wiring layer is electrically connected to the wiring 2VDBCA1 formed in the first wiring layer via the contact hole 16p and thereby electrically connected to the gate electrode of the pMISQp forming the switch element in the internal circuit region.

The power supply wirings 2VSSB2, 2VSSB3 are provided to supply the power supply voltage VSS to the logic circuits and switch elements formed in the internal circuit region and correspond to the power supply wiring 2VSSB of FIG. 7. The wiring 2VSSB2 formed in the second wiring layer is electrically connected to the wiring 2VSSB3 formed in the third wiring layer as the upper layer. Moreover, the wiring 2VSSB2 of the second wiring layer is electrically connected to the wiring 2VSSB3 formed in the third wiring layer via the contact hole 16r and thereby electrically connected to the bonding pad BP. In addition, the wiring 2VSSB2 of the second wiring layer is electrically connected to the wiring 2VSSA1 formed in the first wiring layer via the contact hole 16s and thereby electrically connected to the nMISQn forming the logic circuits and switch elements in the internal circuit region.

The power supply wirings 2VDDB2, 2VDDB3 are provided to supply the power supply voltage VDD to the logic circuits and switch elements formed in the internal circuit region and correspond to the wiring 2VDDB of FIG. 7. The wiring 2VDDB2 formed in the second wiring layer is electrically connected to the wiring 2VDDB3 formed in the third wiring layer as the upper layer via the contact hole 16t. Moreover, the wiring 2VDDB2 of the second wiring layer is electrically connected to the wiring 2VDDB3 formed in the third wiring layer via the contact hole 16u and thereby electrically connected to the bonding pad BP. In addition, the wiring 2VDDB2 of the second wiring layer is electrically connected to the wiring 2VDDA1 formed in the first wiring layer via the contact hole 16w and thereby electrically connected to the pMISQp forming the logic circuits and switch elements in the internal circuit region.

Moreover, in the region near the both ends of the n-well NWL and p-well PWL (illustrated only one end in FIG. 31 and FIG. 32), a plurality of $n^+$ type semiconductor regions 14N and $p^+$ type semiconductor regions 14P are respectively arranged. The wirings 2VNNB2, 2VNNB3, 2VPPB2, 2VPPB3 are arranged at the internal side of the power supply wirings 2VDDB2, 2VDDB3. The wirings 2VNNB2, 2VNNB3 are provided to supply the voltage VNN to the p-well PWL during the testing and waiting period and correspond to the wiring 2VNNB of FIG. 7. The wiring 2VNNB2 formed in the second wiring layer is electrically connected to the wiring 2VNNB3 formed in the third wiring layer via the contact hole 16x and connected to the P+ type semiconductor region 14P via the contact hole 17a and thereby electrically connected to the p-well PWL. The wirings 2VNNB2, 2VNNB3 are electrically connected to the bonding pad BP via the predetermined wiring in the third wiring layer and thereby electrically connected to the tester or the like.

The wirings 2VPPB2, 2VPPB3 are provided to supply the voltage VPP to the n-well NWL during the testing and waiting period and correspond to the wiring 2VPPB of FIG. 7. The wiring 2VPPB2 formed in the second wiring layer is electrically connected to the wiring 2VPPB3 formed in the third wiring layer via the contact hole 16y and thereby connected to the n+ type semiconductor region 14N via the contact hole 17b and also electrically connected to the n-well NWL. Here, the wirings 2VPPB2, 2VPPB3 are electrically connected to the bonding pad BP via the wiring 2VPPB3 in the third wiring layer and thereby electrically connected to the tester or the like.

The wirings at the external circumference and near these semiconductor chips 4 are formed, like the wirings in the internal circuit region, by laminating titanium nitride and titanium film, for example, on aluminum, silicon and aluminum alloy including copper, copper, copper alloy or conductive film thereof.

Figure 33:
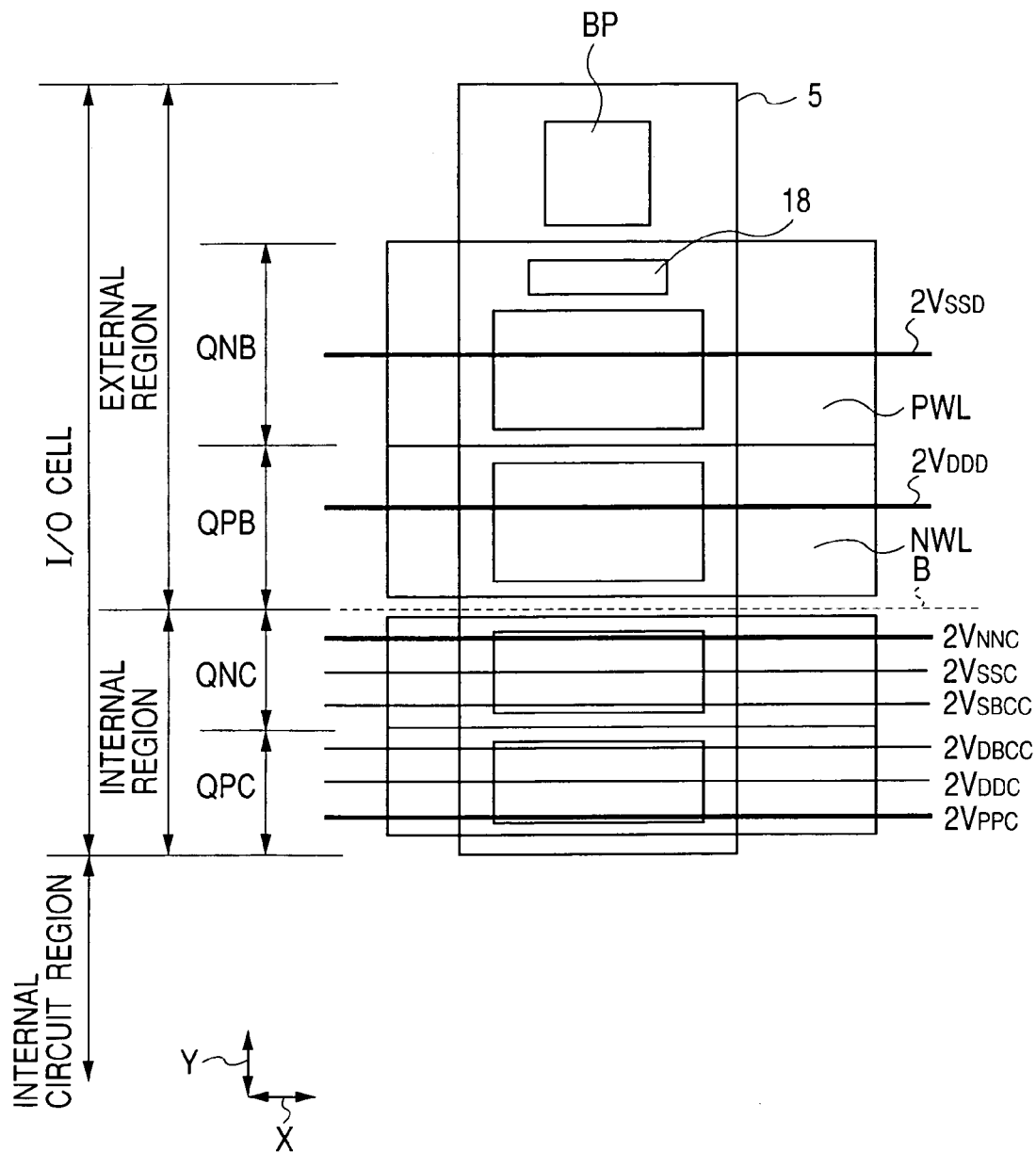
FIG. 33 is an explanatory diagram schematically illustrating input/output circuit cells of the semiconductor device of FIG. 6.
Figure 34:
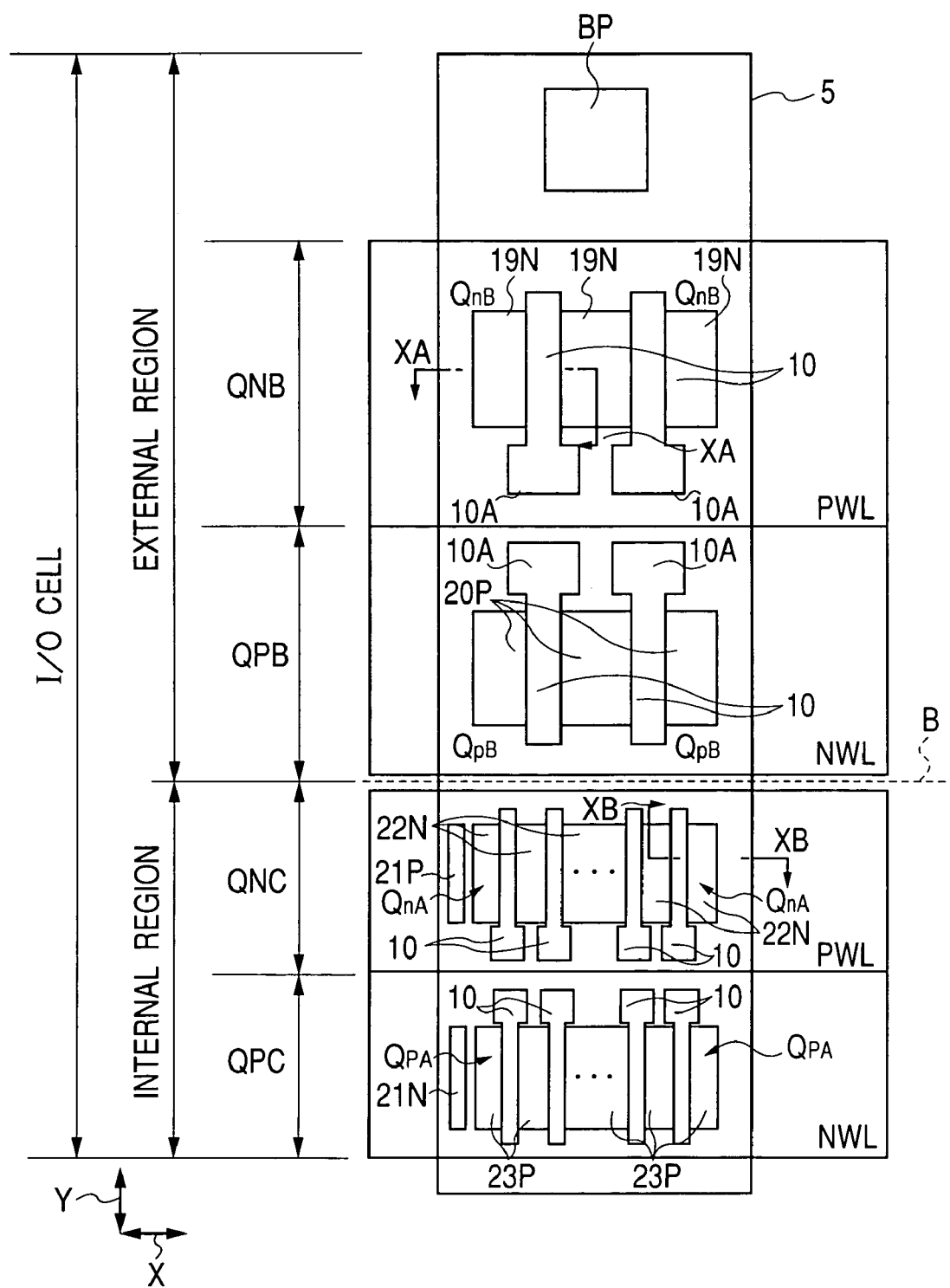
FIG. 34 is a plan view of a principal portion of the semiconductor substrate illustrating an element layout example of the input/output circuit cells of FIG. 33.

Next, an example of the structure of I/O cell 5 and the circuit using such structure will be explained. FIG. 33 schematically illustrates the I/O cell 5. Moreover, FIG. 34 schematically illustrates a practical layout of the I/O cell 5 of FIG. 33. Moreover, FIG. 35 is a cross-sectional view along the line XA—XA and the line XB—XB of FIG. 34.

As illustrated in FIG. 33 and FIG. 34, the I/O cell 5 has the external region and internal region. The external region is mainly provided to form an output circuit to arrange therein a bonding pad BP, a protection circuit region 18, an nMIS forming region QNB and a pMIS forming region QPB. The nMIS forming region QNB is arranged within the region of p-well PWL, while pMIS forming region QPB is arranged within the region of n-well NWL. These p-well PWL and n-well NWL are extending to surround the internal circuit region forming the logic circuits along the external circumference of the semiconductor chip 4. Along the p-well PWL and n-well NWL, the power supply wiring 2VSSD is arranged to pass on the nMIS forming region QNB and the power supply wiring 2VDDD is also arranged to pass on the pMIS forming region QPB.

In the protection circuit region 18, a protection element is formed to protect an element of semiconductor device, for example, a protection resistor or the like from over-voltage due to the static electricity or the like. The MISFET itself in the pMIS forming region QPB and nMIS forming region QNB in the external region also has the function as the protection circuit for the circuits in the internal region.

Figure 35:
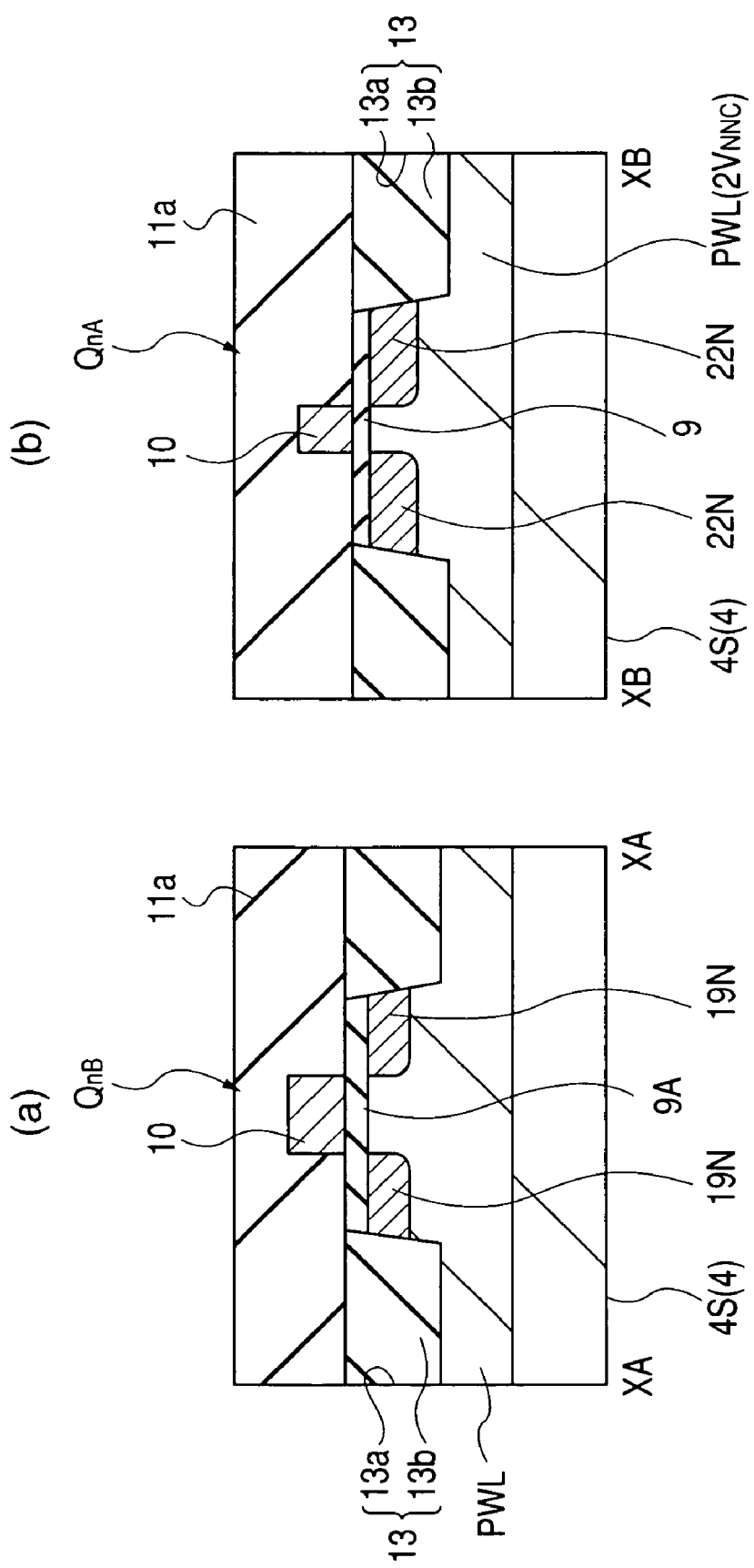
FIG. 35 is cross-sectional views along the lines XA—XB and XB—XB of FIG. 34.

In the nMIS forming region QNB, the nMISQnB is formed as illustrated in FIG. 34 and FIG. 35, while in the pMIS forming region QPB, the pMISQpB is formed. The nMISQnB has a pair of n-type semiconductor regions 19N for source and drain, a gate insulation film 9A and a gate electrode 10A. Moreover, the pMISQnB has a pair of p-type semiconductor regions 20P for source and drain, a gate insulation film and a gate electrode 10A. Structure of the cross-section of pMISQpB is identical to that of nMISQnB of FIG. 35 and therefore this structure is not illustrated. The semiconductor region 19N includes, for example, phosphorus or arsenic. Moreover, the semiconductor region 20P includes, for example, boron. In FIG. 34, the semiconductor regions 19N, 20P at the center are respectively common regions of two nMISQnBs and two pMISQpBs. A material of the gate insulation film (9A) of the nMISQnB and pMISQpB is identical to that of the gate insulation film 9 of MISFET forming the logic circuit or the like explained above. However, the gate insulation film 9A is thicker than the gate insulation film 9, because the operation voltage of MISFET in the external region side (for example, about 2.5 to 3.3V) is higher than the operation voltage of MISFET of the internal circuit region (for example, about 1.5 to 1.8V). The specification of I/O cannot be varied simply even when a voltage of the internal circuit region is lowered and it is essential to assure the operation under the higher voltage in the related art.

Moreover, material of the gate electrode 10A of the nMISQnB and pMISQpB is identical to that of the gate electrode 10 explained above. However, the width and length (channel length) of the gate electrode 10 are larger than that of the gate electrode 10. As explained above, the sizes of the gate insulation film 9A and gate electrode 10 are set relatively larger than that of MISFET for logic circuit because a larger driving capability is required to form the output circuit with the nMISQnB and pMISQpB of the external region.

Meanwhile, the internal region of I/O cell 5 mainly forms the input circuit and the nMIS forming region QNC and pMIS forming region QPC are arranged in this region. The nMIS forming region QNC is arranged within the region of p-well PWL, while the pMIS forming region QPC is arranged within the region of n-well NWL. These p-well PWL and n-well NWL are also extending along the external circumference of the semiconductor chip 4 to surround the internal circuit region. The wiring 2VNNC, power supply wiring 2VSSC and wiring 2VSBCC are arranged to pass on the nMIS forming region QNC, while the wiring 2VDBCC, power supply wiring 2VDCC and wiring 2VPPC are arranged to pass on the pMIS forming region QPB.

In the nMIS forming region QNC, the p+ type semiconductor region 21P and a plurality of nMISQnAs are formed and in the pMIS forming region QPC, the n+ type semiconductor region 21N and a plurality of pMISQpAs are formed. The p+ type semiconductor region 21P includes, for example, boron and supplies the predetermined voltage to the p-well PWL and the n+ type semiconductor region 21N includes, for example, phosphorus or arsenic and supplies the predetermined voltage to the n-well NWL.

Each nMISQnA has a pair of n-type semiconductor regions 22N for source and drain, a gate insulation film 9 and a gate electrode 10 and has almost the same structure and size as the nMISQn in the internal circuit region. Each pMISQpA has a pair of n-type semiconductor regions 23P for source and drain, a gate insulation film and a gate electrode 10 and has almost the same structure and size as the nMISQp of the internal circuit region. The structure of cross-section of the pMISQpA is same as that of the nMISQnA of FIG. 35 and it is therefore not illustrated here.

The semiconductor region 22N includes, for example, phosphorus or arsenic, while the semiconductor region 23P includes, for example, boron. Material and size of the gate insulation film (9) and gate electrode 10 of the nMISQnA and pMISQpA are identical to that of the gate insulation film 9 and gate electrode 10 of the nMISQn and pMISQp in the internal circuit region explained above. Namely, the nMISQnA and pMISQpA of the internal region of I/O cell 5 have the gate width and gate insulation film thickness smaller and thinner than that of the nMISQn and pMISQp of the external region because the MISFET of the internal region mainly structures the input circuit and therefore the threshold voltage must be relatively lowered to realize higher operation rate. Using any one of a plurality of nMISQnA and pMISQpA, the switch elements 3SW4, 3SW3 illustrated in FIG. 7 can be formed.

Figure 36:
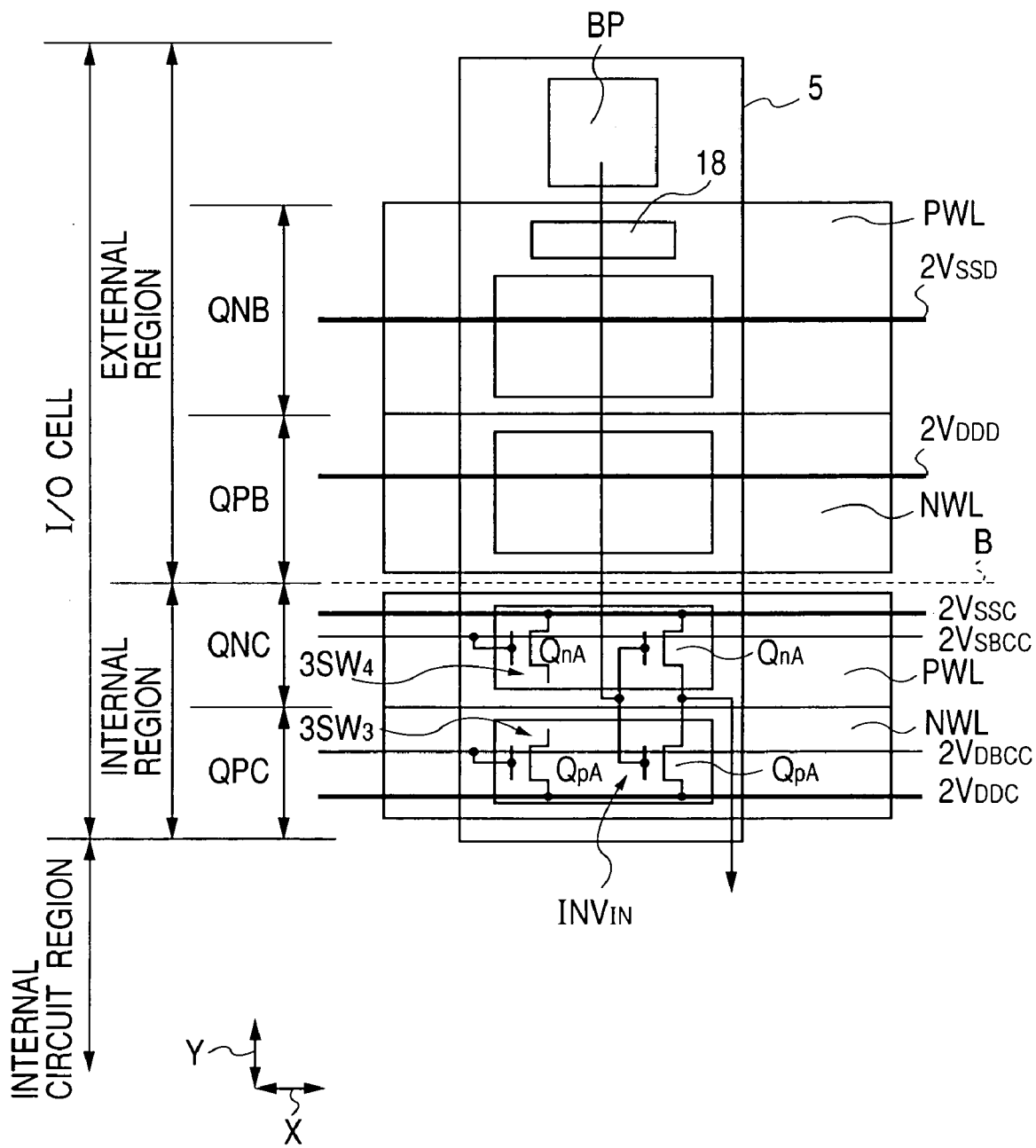
FIG. 36 is an explanatory diagram schematically illustrating the condition where the input circuit and switch elements are formed within the input/output circuit cells of FIG. 33.
Figure 37:
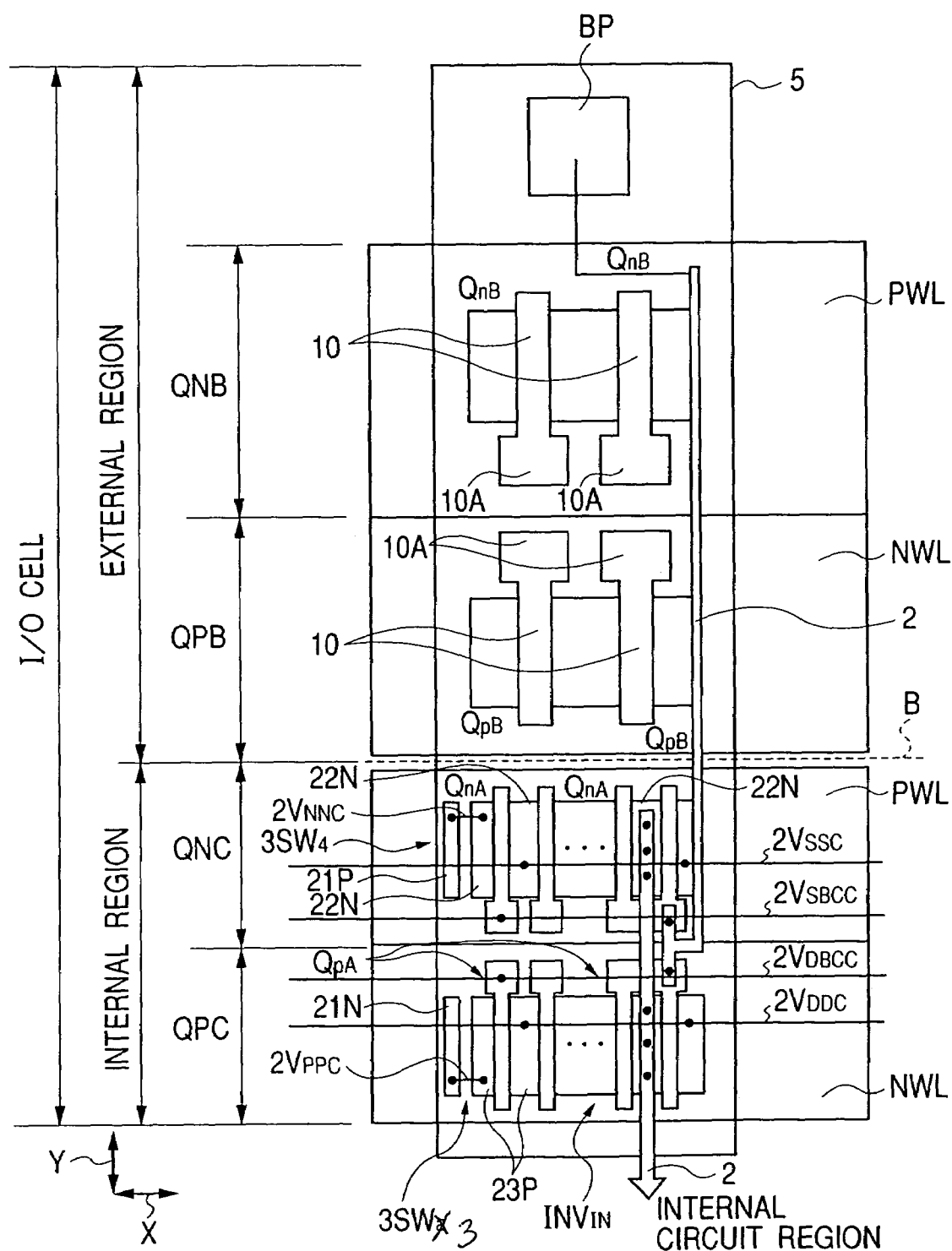
FIG. 37 is an explanatory diagram schematically illustrating a layout of the input circuit and switch elements of FIG. 36.

FIG. 36 and FIG. 37 schematically illustrate the switch elements 3SW3, 3SW4 formed in the I/O cell 5 and the input circuit.

To the gate electrode 10 of the pMISQpA forming the switch element 3SW3, the wiring 2VDBCC is electrically connected. Moreover, the power supply wiring 2VDDC is electrically connected to one semiconductor region 23P for source and drain of pMISQpA, while the wiring 2VPPC is electrically connected to the other semiconductor region 23P for source and drain. This wiring 2VPPC is electrically connected to the n+ type semiconductor region 21N in the internal region of I/O cell 5 and thereby electrically connected to the n-well NWL. With such connecting relationship, the switch element 3SW3 is provided between the power supply wiring VDDC and the n-well NWL.

Meanwhile, the wiring 2VSBCC is electrically connected to the gate electrode 10 of the nMISQnA forming the switch element 3SW4. Moreover, the power supply wiring 2VSSC is electrically connected to one semiconductor region 22N for source and drain of nMISQnA, while the wiring 2VNNC is electrically connected to the other semiconductor region 22N for source and drain. This wiring 2VNNC is electrically connected to the p$^+$ type semiconductor region 21P in the internal region of I/O cell 5 and thereby electrically connected to the p-well PWL. With such connection relationship, the switch element 3SW4 is provided between the power supply wiring VSSC and the p-well PWL.

As explained above, since the nMISQnA, pMISQpA in the internal region of I/O cell 5 mainly form the input circuit and therefore the threshold voltage must relatively be lowered in order to realize higher operation rate. Therefore, since it is difficult to determine the condition during the testing period like the MISFET formed in the internal circuit region as explained above, it is necessary to provide the switch elements 3SW3 and 3SW4 and thereby to change the threshold voltage for the normal operation period and testing period. Therefore, in this embodiment, the switch elements 3SW3, 3SW4 are also provided within the region of I/O cell 5. Thereby, it is now possible to lower the threshold voltage of the pMISQpA forming the inverter circuit INV for input circuit as is designed, during the normal operation period, by turning ON the switch element 3SW3 and then applying the power supply voltage VDD to the n-well and to raise the threshold voltage of the pMISQpA forming the inverter circuit INV for input circuit, during the testing period, by turning OFF the switch element 3SW3 and then applying the voltage VPP other than the power supply voltage VDD to the n-well NWL. In the same manner, it is also possible to lower, as designed, the threshold voltage of the nMISQnA forming the inverter circuit INV for the input circuit by turning ON the switch element 3SW4 and then applying the power supply voltage VSS to the p-well PWL and to raise the threshold voltage of the nMISQnA forming the inverter circuit INV for the input circuit, during the testing period, by turning OFF the switch element 3SW4 and then applying the voltage VNN other than the power supply voltage VSS to the p-well PWL.

However, it is not enough to simply arrange the switch elements SW3, SW4 but sufficient consideration is necessary for allocation of the input/output circuit and reduction of noise in the well. For example, since a plurality of signal terminals are driven simultaneously in some cases in the input/output circuit formed of the I/O cell 5, a momentary large noise may be generated easily in the well. This problem becomes a large problem in the semiconductor device having the CMIS circuit and providing the switch elements SW3, SW4 because it causes the latch-up. Therefore, in the present embodiment, a plurality of switch elements 3SW3, 3SW4 are discretely provided in the region of I/O cell 5 for every well. Thereby, generation of noise can be controlled and accordingly generation of latch-up can also be controlled. Moreover, for the semiconductor region of unused MISFET in the internal region of the I/O cell 5, a contact hole is arranged for stabilizing the well potential as explained above and the semiconductor region thereof is electrically connected to the power supply wiring. For example, since the process to use unused cell having executed the static electricity protection and gate process is executed although the I/O cell 5 does not particular function as I/O, it is also possible to form the contact hole for stabilizing well potential within the I/O cell 5. Thereby, generation of noise in the well can be controlled and generation of latch-up can also be controlled without increase of chip size.

Moreover, the inverter circuit INV for input circuit is a CMIS inverter circuit formed of the nMISQnA and pMISQpA in the internal region of the I/O cell 5. Namely, the gate electrodes 10 of the nMISQnA and pMISQpA are electrically connected with the wiring 2 and thereby electrically connected to the bonding pad BP. The wiring 2 in the input side is connected with the protection circuit. Moreover, the semiconductor regions 22N, 23P of the nMISQnA and pMISQpA are electrically connected with each other with the wiring 2 and thereby electrically connected to the predetermined logic circuits in the internal circuit region.

As explained above, according to the present embodiment, noise generated in the semiconductor region can be reduced in the semiconductor device having the function to control the threshold voltage of transistor by providing the switch elements between the semiconductor region where the transistors are formed and the power supply wiring and then controlling the switch elements to ON and OFF conditions.

Moreover, according to the present embodiment, noise generated in the semiconductor region can be reduced without increase in size of the semiconductor device having the function to control the threshold voltage of transistors by providing switch elements between the semiconductor region where transistors are formed and the power supply wiring and then controlling such switch elements to the ON and OFF conditions.

Moreover, noise generated in the semiconductor region can be reduced without introduction of complicated structure of the semiconductor device having the function to control the threshold voltage of transistors by providing switch elements between the semiconductor region where transistors are formed and the power supply wiring and then controlling such switch elements to the ON and OFF conditions.

Thereby, it is now possible to control variation of threshold voltage resulting from noise. In addition, it is now possible to control generation of latch-up resulting from noise. Therefore, operation reliability of the semiconductor device can be improved.

The present invention has been explained practically based on the preferred embodiment thereof but the present invention is not limited thereto and allows various changes and modifications without departure from the claims thereof.

For example, in this embodiment, a structure to electrically connect the bonding wire to the bonding pad has been explained but the present invention is not limited thereto and the present invention can also be adapted to the structure where a bump electrode (projected electrode) is connected to the bonding pad.

In above explanation, the present invention has been adapted to the CMIS gate array which is the application field of the present invention as the background thereof, but the present invention is not limited thereto and the present invention can also be adapted to the semiconductor device based on the standard cell (cell base IC) system in which the previously prepared cell library is used for design.

INDUSTRIAL APPLICABILITY

As explained above, the semiconductor device of the present invention can be effectively applied to an information processing apparatus such as a computer, a communication apparatus such as a mobile telephone set and a video processing apparatus, and particularly can be applied to a semiconductor device to form the apparatus assuring high speed operation.

What is claimed is:

1. A semiconductor device, comprising:
a semiconductor region formed in a semiconductor substrate;
basic cells regularly arranged on said semiconductor substrate;
field effect transistors arranged in each of a plurality of said basic cells and formed in said semiconductor region;
power supply wirings arranged for supplying power supply voltages to said field effect transistors; and
switch elements provided to switchably connect said semiconductor region and said power supply wirings to control voltage applied to said semiconductor region,
wherein said switch elements include a plurality of said field effect transistors which are not used in performing logic operations of a logic circuit.

2. A semiconductor device, comprising:
a semiconductor region formed in a semiconductor substrate;
basic cells regularly arranged on said semiconductor substrate;
field effect transistors arranged in each of a plurality of said basic cells and formed in said semiconductor region;
power supply wirings arranged for supplying power supply voltages to said field effect transistors; and
switch elements provided to switchably connect said semiconductor region and said power supply wirings to control voltage applied to said semiconductor region;
wherein said switch elements include a plurality of field effect transistors which are discretely arranged in said semiconductor region, and which are not used in performing logic operations of a logic circuit.

3. A semiconductor device, comprising:
a semiconductor region formed in a semiconductor substrate;
basic cells regularly arranged on said semiconductor substrate;
field effect transistors arranged in each of a plurality of said basic cells and formed in said semiconductor region;
power supply wirings arranged for supplying power supply voltages to said field effect transistors; and
switch elements provided to switchably connect said semiconductor region and said power supply wirings to control voltage applied to said semiconductor region,
wherein said switch elements include a plurality of said field effect transistors which are not used in performing logic operations of a logic circuit, and
wherein a semiconductor region, which is formed within said semiconductor region in a plurality of said basic cells and of a conductivity type opposed to that of said semiconductor region, is electrically connected to said power supply wirings.

4. A semiconductor device, comprising:
a semiconductor region formed in a semiconductor substrate;
basic cells regularly arranged on said semiconductor substrate;
field effect transistors arranged in each of a plurality of said basic cells and formed in said semiconductor region;
power supply wirings arranged for supplying power supply voltages to said field effect transistors; and
switch elements provided to switchably connect said semiconductor region and said power supply wirings to control voltage applied to said semiconductor region,
wherein said switch elements include a plurality of said field effect transistors which are not used in performing logic operations of a logic circuit, and at least one of a pair of semiconductor regions for source and drain of unused field effect transistors of said plurality of basic cells and said power supply wirings are electrically connected.

5. A semiconductor device, comprising:
a semiconductor region formed in a semiconductor substrate;
basic cells regularly arranged on said semiconductor substrate;
field effect transistors arranged in each of a plurality of said basic cells and formed in said semiconductor region;
power supply wirings arranged for supplying power supply voltages to said field effect transistors; and
switch elements provided to switchably connect said semiconductor region and said power supply wirings to control voltage applied to said semiconductor region,
wherein said switch elements include a plurality of said field effect transistors which are discretely arranged within said semiconductor region, and which are not used in performing logic operations of a logic circuit, and
wherein a semiconductor region, formed in said semiconductor region of a plurality of basic cells and of a conductivity type opposed to that of said semiconductor region, and said power supply wirings are electrically connected.

6. A semiconductor device, comprising:
a semiconductor region formed in a semiconductor substrate;
basic cells regularly arranged on said semiconductor substrate;
field effect transistors arranged in each of a plurality of said basic cells and formed in said semiconductor region;
power supply wirings arranged for supplying power supply voltages to said field effect transistors; and
switch elements provided to switchably connect said semiconductor region and said power supply wirings to control voltage applied to said semiconductor region, wherein said switch elements include a plurality of field effect transistors which are discretely arranged within said semiconductor region, and which are not used in performing logic operations of a logic circuit, and wherein at least one of a pair of semiconductor regions for source and drain of unused field effect transistors of said field effect transistors of said plurality of basic cells and said power supply wirings are electrically connected.

7. A semiconductor device, comprising:

a semiconductor region formed in a semiconductor substrate;

basic cells regularly arranged on said semiconductor substrate;

field effect transistors arranged in each of a plurality of said basic cells and formed in said semiconductor region;

power supply wirings arranged for supplying power supply voltages to said field effect transistors; and switch elements provided to switchably connect said semiconductor region and said power supply wirings to control voltage applied to said semiconductor region, wherein said switch elements include a plurality of said field effect transistors which are discretely arranged in said semiconductor region, and which are not used in performing logic operations of a logic circuit, and wherein at least one of a pair of semiconductor regions for source and drain of unused field effect transistors arranged between the switch elements and said power supply wirings are electrically connected.

8. A semiconductor device, comprising:

a semiconductor region formed in a semiconductor substrate;

basic cells regularly arranged on said semiconductor substrate;

a plurality of field effect transistors arranged in each of a plurality of said basic cells and formed in said semiconductor region;

circuits formed of a plurality of said basic cells;

power supply wirings arranged for supplying power supply voltages to said field effect transistors; and switch elements provided to switchably connect said semiconductor region and said power supply wirings to control voltage applied to said semiconductor region, wherein said switch elements are built in a predetermined circuit among said circuits, and include basic cell portions not used in performing logic operations of a logic circuit.

9. A semiconductor device, comprising:

a semiconductor region formed in a semiconductor substrate;

a plurality of basic cells regularly arranged on said semiconductor substrate;

a plurality of field effect transistors arranged in each of a plurality of said basic cells and formed in said semiconductor region;

circuits formed of a plurality of said basic cells;

power supply wirings arranged for supplying power supply voltages to said field effect transistors; and switch elements provided to switchably connect said semiconductor region and said power supply wirings to control voltage applied to said semiconductor region, and which are not used in performing logic operations of a logic circuit, wherein said circuits include a circuit in which said switch elements are built in and the circuit in which said switch elements are not built in.

10. A semiconductor device as claimed in claim 8 or 9, wherein a semiconductor region, formed in said semiconductor region of a plurality of said basic cells and of a conductivity type opposed to that of said semiconductor region, and said power supply wirings are electrically connected.

11. A semiconductor as claim in claim 8 or 9, wherein at least one of a pair of semiconductor regions for source and drain of unused field effect transistors among said field effect transistors and said power supply wirings are electrically connected.

12. A semiconductor device as claimed in claim 8 or 9, wherein said circuits are logic circuits and said switch elements are discretely arranged in said semiconductor substrate.

13. A semiconductor device as claimed in claim 11, wherein said unused field effect transistors are field effect transistors of basic cells not forming logic circuits and said unused basic cells are formed among said switch elements.

14. A semiconductor device as claimed in claim 8 or 9, wherein said circuit in which the switch elements are built in is a clock circuit or a flip-flop circuit.

15. A semiconductor device as claimed in claim 8 or 9, wherein said switch elements include field effect transistors of said basic cells.

16. A semiconductor device as claimed in any one of claims 2 to 9, wherein said basic cells include p-channel type field effect transistors and n-channel type field effect transistors.

17. A semiconductor device as claimed in any one of claims 2 to 7, further comprising:

a first wiring layer formed over said switch elements;

a second wiring layer formed over said first wiring layer and having wiring extending in a direction transverse to wiring of said first wiring layer; and a third wiring layer formed over said second wiring layer and having wiring extending in a direction transverse to wiring of said second wiring layer, wherein a wiring electrically connected to gate electrodes of said switch elements is formed of wiring of the third wiring layer and arranged in parallel to said power supply wirings.

18. A semiconductor device as claimed in any one of claims 2 to 9, wherein a semiconductor region for power feeding to supply a predetermined voltage to the semiconductor region formed in said semiconductor substrate is formed in a region between an internal circuit region where a plurality of said basic cells are arranged and a peripheral circuit region at an external side of said internal circuit region.

19. A semiconductor device as claimed in claim 18, wherein a wiring for supplying the predetermined voltage to said semiconductor region for power feeding is arranged to surround said internal circuit region.

20. A semiconductor device as claimed in claim 19, wherein the wiring for supplying the predetermined voltage to said semiconductor region for power feeding is electrically connected to a terminal for testing via an external terminal of the semiconductor device.

21. A semiconductor device as claimed in claim 19, wherein the wiring for supplying the predetermined voltage to said semiconductor region for power feeding is electrically connected to wiring for power feeding arranged like a lattice within said internal circuit region.

22. A semiconductor device as claimed in any one of claims 1 and 2 to 9, wherein said switch elements are turned ON in a normal operation period of the semiconductor device and a power supply voltage is applied from said power supply wirings to the semiconductor region formed in said semiconductor substrate and said switch elements are turned OFF in a testing or waiting period of the semiconductor device and a voltage different from said power supply voltage is applied to said semiconductor region.

23. A semiconductor device, comprising:
a first semiconductor region formed in a first part of a semiconductor substrate;
a second semiconductor region formed in a second part of said semiconductor substrate to have a conductivity type opposed to that of said first semiconductor region;
a plurality of basic cells regularly arranged on said semiconductor substrate;
first field effect transistors formed in said first semiconductor region as field effect transistors of said basic cells;
second field effect transistors formed in said second semiconductor region as field effect transistors of said basic cells and to have a conductivity type opposed to that of said first field effect transistors;
a first power supply wiring connected to said first field effect transistors;
a second power supply wiring connected to said second field effect transistors to supply a voltage which is relatively lower than a potential of said first power supply wiring;
first switch elements provided to switchably connect said first semiconductor region and said first power supply wiring to control voltage applied to said first semiconductor region; and
second switch elements provided to switchably connect said second semiconductor region and said second power supply wiring to control voltage applied to said second semiconductor region,
wherein said first switch elements are formed of a plurality of the first field effect transistors in said basic cells and discretely arranged within said first semiconductor region,
wherein said second switch elements are formed of a plurality of second field effect transistors in said basic cells and discretely arranged within said second semiconductor region, and
wherein the first and second pluralities of field effect transistors are not used in performing logic operations of a logic circuit.

24. A semiconductor device, comprising:
a first semiconductor region formed in a first part of a semiconductor substrate;
a second semiconductor region formed in a second part of said semiconductor substrate to have a conductivity type opposed to that of said first semiconductor region;
a plurality of basic cells regularly arranged on said semiconductor substrate;
first field effect transistors formed in said first semiconductor region as field effect transistors of said basic cells;
second field effect transistors formed in said second semiconductor region as field effect transistors of said basic cells and to have a conductivity type opposed to that of said first field effect transistors;
a first power supply wiring connected to said first field effect transistors;
a second power supply wiring connected to said second field effect transistors to supply a voltage which is relatively lower than that of said first power supply wiring;
first switch elements provided to switchably connect said first semiconductor region and said first power supply wiring to control voltage applied to said first semiconductor region; and
second switch elements provided to switchably connect said second semiconductor region and said second power supply wiring to control voltage suplied to said second semiconductor region,
wherein said first switch elements include the first field effect transistors in predetermined basic cells among said plurality of basic cells and which are not used in performing logic operations of a logic circuit,
wherein said second switch elements include the second field effect transistors in predetermined basic cells among said plurality of said basic cells and which are not used in performing logic operations of a logic circuit,
wherein a region formed in said first semiconductor region in a plurality of said basic cells electrically connects the semiconductor region of the conductivity type opposed to that of said first semiconductor region and said first power supply wiring, and
wherein a region formed in said second semiconductor region in a plurality of basic cells electrically connects the semiconductor region of the conductivity type opposed to that of said second semiconductor region and said second power supply wiring.

25. A semiconductor device, comprising:
a first semiconductor region formed in a first part of a semiconductor substrate;
a second semiconductor region formed in a second part of said semiconductor substrate to have a conductivity type opposed to that of said first semiconductor region;
a plurality of basic cells regularly arranged on said semiconductor substrate;
first field effect transistors formed in said first semiconductor region as field effect transistors of said basic cells;
second field effect transistors formed in said second semiconductor region as field effect transistors of said basic cells and to have a conductivity type opposed to that of said first field effect transistors;
a first power supply wiring connected to said first effect transistors;
a second power supply wiring connected to said second field effect transistors to supply a voltage relatively lower than that of said first power supply wiring;
first switch elements provided to switchably connect said first semiconductor region and said first power supply wiring to control voltage applied to said first semiconductor region; and
second switch elements provided to switchably connect said second semiconductor region and said second power supply wiring to control voltage applied to said second semiconductor region,
wherein said first switch elements include the first field effect transistors in predetermined basic cells among said plurality of basic cells and which are not used in performing logic operations of a logic circuit,
wherein said second switch elements include the second field effect transistors in predetermined basic cells among said plurality of basic cells and which are not used in performing logic operations of a logic circuit,
wherein at least one of a pair of semiconductor regions for source and drain of unused first field effect transistors among said first field effect transistors is electrically connected to said first power supply wiring, and wherein at least one of a pair of semiconductor regions for source and drain of unused second field effect transistors among said second field effect transistors is electrically connected said second power supply wiring.

26. A semiconductor device, comprising:
a first semiconductor region formed in a first part of a semiconductor substrate;
a second semiconductor region formed in a second part of said semiconductor substrate to have a conductivity type opposed to that of said first semiconductor region;
a plurality of basic cells regularly arranged on said semiconductor substrate;
first field effect transistors formed in said first semiconductor region as field effect transistors of said basic cells;
second field effect transistors formed in said second semiconductor region as field effect transistors of said basic cells and to have a conductivity type opposed to that of said first field effect transistors;
a first power supply wiring connected to said first field effect transistors;
a second power supply wiring connected to said second field effect transistors to supply a voltage relatively lower than that of said first power supply wiring;
first switch elements provided to switchably connect said first semiconductor region and said first power supply wiring to control voltage applied to said first semiconductor region; and
second switch elements provided to switchably connect said second semiconductor region and said second power supply wiring to control voltage applied to said second semiconductor region,
wherein said first switch elements include the first field effect transistors in predetermined basic cells among said plurality of basic cells and are discretely arranged in said first semiconductor region, said first field effect transistors of said first switch elements not being used in performing logic operations of a logic circuit,
wherein said second switch elements include the second field effect transistors in predetermined basic cells among said plurality of basic cells and are discretely arranged in said semiconductor region, said second field effect transistors of said second switch elements not being used in performing logic operations of a logic circuit,
wherein a region formed in said first semiconductor region in a plurality of said basic cells electrically connects the semiconductor region of the conductivity type opposed to that of said first semiconductor region and said first power supply wiring, and
wherein a region formed in said second semiconductor region in a plurality of said basic cells electrically connects the semiconductor region of the conductivity type opposed to that of said second semiconductor region and said second power supply wiring.

27. A semiconductor device, comprising:
a first semiconductor region formed in a first part of a semiconductor substrate;
a second semiconductor region formed in a second part of said semiconductor substrate to have a conductivity type opposed to that of said first semiconductor region;
a plurality of basic cells regularly arranged on said semiconductor substrate;
first field effect transistors formed in said first semiconductor region as field effect transistors of said basic cells;
second field effect transistors formed in said second semiconductor region as field effect transistors of said basic cells and to have channel conductivity type opposed to that of said first field effect transistors;
a first power supply wiring connected to said first field effect transistors;
a second power supply wiring connected to said second field effect transistors to supply a voltage relatively lower than that of said first power supply wiring;
first switch elements provided to switchably connect said first semiconductor region and said first power supply wiring to control voltage applied to said first semiconductor region; and
second switch elements provided to switchably connect said second semiconductor region and said second power supply wiring to control voltage applied to said second semiconductor region,
wherein said first switch elements include the first field effect transistors in predetermined basic cells among said plurality of basic cells and are discretely arranged in said first semiconductor region, said first field effect transistors of said first switch elements not being used in performing logic operations of a logic circuit,
wherein said second switch elements include the second field effect transistors in predetermined basic cells among said plurality of basic cells and are discretely arranged in said second semiconductor region, said second field effect transistors of said second switch elements not being used in performing logic operations of a logic circuit,
wherein at least one of a pair of semiconductor regions for source and drain of unused first field effect transistors among said first field effect transistors is electrically connected to said first power supply wiring, and
wherein at least one of a pair of semiconductor regions for source and drain of unused second field effect transistors among said second field effect transistors is electrically connected to said second power supply wiring.

28. A semiconductor device, comprising:
first and second semiconductor regions formed in a peripheral circuit region of a semiconductor substrate;
a plurality of cells for input/output circuits regularly arranged in the peripheral circuit region of said semiconductor substrate;
a plurality of field effect transistors for input/output circuits arranged in each of a plurality of cells for input/output circuits and formed in said first and second semiconductor regions;
power supply wiring arranged for supplying a power supply voltage to a plurality of said field effect transistors for input/output circuits; and
switch elements provided to switchably connect the second semiconductor region in said peripheral circuit region and said power supply wiring,
wherein an output circuit electrically connected to an external terminal includes field effect transistors for input/output circuits in said first semiconductor region and an input circuit electrically connected to an external terminal includes field effect transistors for input/output circuits in said second semiconductor region, and
wherein said switch elements include field effect transistors not used for the input circuit among the field effect transistors for input/output circuits in said second semiconductor region.

29. A semiconductor device, comprising:
a semiconductor region formed in a peripheral circuit region of a semiconductor substrate;
a plurality of cells for input/output circuits regularly arranged in the peripheral circuit region of said semiconductor substrate;
a plurality of field effect transistors for input/output circuits arranged in each of a plurality of cells for input/output circuits and formed in said semiconductor region;
power supply wiring arranged for supplying a power supply voltage to a plurality of said field effect transistors for input/output circuits; and
switch elements provided to switchably connect the semiconductor region in the peripheral circuit region and said power supply wiring,
wherein said peripheral circuit region includes an external region to arrange field effect transistors for input/output circuits of relatively higher threshold voltage and an internal region to arrange field effect transistors for input/output circuits of relatively lower threshold voltage, and
wherein said switch elements include field effect transistors not used for input circuit among the field effect transistors for input/output circuits in said internal region.

30. A semiconductor device as claimed in claim 29, wherein an output circuit includes a field effect transistor for input/output circuit in said external region and an input circuit includes a field effect transistor for input/output circuit in said internal region.

31. A semiconductor device as claimed in claim 28, 29 or 30, wherein a gate insulation film of the field effect transistor of said output circuit is thicker than a gate insulation film of the field effect transistor of said input circuit.

32. A semiconductor device as claimed in claim 28, 29, or 30, wherein wiring connected to the gate electrodes of the field effect transistors of said switch elements is arranged to surround said internal region.

33. A semiconductor device as claimed in any one of claims 28 to 30, wherein at least one of a pair of semiconductor regions for source and drain of the field effect transistors unused for said input/output circuits is electrically connected to said power supply wiring to form a capacitance element.

34. A method of manufacturing a semiconductor device, comprising:
(a) regularly allocating a plurality of basic cells on a semiconductor substrate;
(b) forming switch elements arranged for electrically connecting and disconnecting a semiconductor region formed on said semiconductor substrate to and from a power supply wiring of the semiconductor device with field effect transistors of predetermined basic cells among said plurality of basic cells, which field effect transistors are not used in performing logic operations of a logic circuit; and
(c) forming a plurality of circuits with predetermined basic cells among said plurality of basic cells.

35. A method of manufacturing a semiconductor device, comprising:
(a) regularly allocating a plurality of basic cells on a semiconductor substrate;
(b) forming switch elements arranged for electrically connecting and disconnecting a semiconductor region formed on said semiconductor substrate to and from a power supply wiring of the semiconductor device with field effect transistors of predetermined basic cells among said plurality of basic cells, said field effect transistors not being used in performing logic operations of a logic circuit;
(c) forming a plurality of circuits with predetermined basic cells among said plurality of said basic cells; and
(d) allocating a contact hole arranged for electrically connecting at least one of a pair of semiconductor regions for source and drain of unused field effect transistors among field effect transistors of said basic cells and said power supply wiring.

36. A method of manufacturing a semiconductor device, comprising:
(a) regularly allocating a plurality basic cells on a semiconductor substrate;
(b) forming a switch element arranged for electrically connecting and disconnecting a semiconductor region formed on said semiconductor substrate to and from a power supply wiring of the semiconductor device with a field effect transistor of a predetermined basic cell among said plurality of said basic cells, said field effect transistor not being used in performing logic operations of a logic circuit; and
(c) forming a plurality of circuits with predetermined basic cells among said plurality of basic cells,
wherein said switch element is built in predetermined circuit among said plurality of said circuits in step (c).

37. A method of manufacturing a semiconductor device, comprising:
(a) regularly allocating a plurality of basic cells on a semiconductor substrate; and
(b) forming a plurality of circuits with predetermined basic cells among said plurality of basic cells,
wherein a switch element is built in a predetermined circuit among a plurality of said circuits,
said switch element including a field effect transistor of a basic cell of said predetermined circuit, said field effect transistor not being used in performing logic operations of a logic circuit and being provided between a power supply wiring and a semiconductor region, in which field effect transistors of other basic cells of said predetermined circuit are formed, to control voltage applied to said semiconductor region.

38. A semiconductor device as claimed in claim 3, wherein a capacitance element is formed of said semiconductor region and a semiconductor region of a conductivity type opposed to that of said semiconductor region.

39. A semiconductor device as claimed in claim 4, 6 or 7, wherein a capacitance element is formed of said semiconductor region and at least one of a pair of semiconductor regions for source and drain of said unused field effect transistors.

40. A semiconductor device as claimed in any one of claims 2 to 7, wherein a logic circuit is formed using said basic cells and said logic circuit is formed among the basic cells including said switch elements.

41. A semiconductor device claimed in claim 4, 6, or 7, wherein a logic circuit is formed using said basic cells, a field effect transistor having said one pair of semiconductor regions is a field effect transistor of an unused basic cell not forming a logic circuit, and said logic circuit and unused basic cell are formed among the basic cells including said switch elements.

* * * * *